(12) United States Patent
Varman et al.

(10) Patent No.: US 8,917,817 B1
(45) Date of Patent: *Dec. 23, 2014

(54) METHOD AND APPARATUS FOR VOICE RECOGNITION UNIT SIMULATION

(75) Inventors: Mahendra Varman, Omaha, NE (US); Mahmood S. Akhwand, Omaha, NE (US)

(73) Assignee: West Corporation, Omaha, NE (US)

( * ) Notice: Subject to any disclaimer, the term of this patent is extended or adjusted under 35 U.S.C. 154(b) by 484 days.

This patent is subject to a terminal disclaimer.

(21) Appl. No.: 13/220,092

(22) Filed: Aug. 29, 2011

Related U.S. Application Data

(63) Continuation of application No. 11/759,659, filed on Jun. 7, 2007.

(51) Int. Cl.
  *H04M 1/24* (2006.01)
(52) U.S. Cl.
  USPC .................................... 379/1.02; 379/10.02
(58) Field of Classification Search
  CPC .......... H04M 3/22; H04M 3/323; H04M 3/24
  USPC .................... 379/1.02, 1.01, 10.02
  See application file for complete search history.

(56) References Cited

U.S. PATENT DOCUMENTS

| | | | |
|---|---|---|---|
| 5,524,139 A | 6/1996 | Jones | |
| 5,572,570 A | 11/1996 | Kuenzig | |
| 5,937,040 A | 8/1999 | Wrede et al. | |
| 6,088,437 A | 7/2000 | Amick | |
| 6,091,801 A | 7/2000 | Gulik | |
| 6,189,031 B1 | 2/2001 | Badger et al. | |
| 6,205,412 B1 | 3/2001 | Barskiy et al. | |
| 6,405,149 B1 | 6/2002 | Tsai et al. | |
| 6,516,051 B2 | 2/2003 | Sanders | |
| 6,587,543 B1 | 7/2003 | Howard et al. | |
| 6,678,354 B1 | 1/2004 | Blue | |
| 6,810,111 B1 | 10/2004 | Hunter et al. | |
| 6,914,962 B2 | 7/2005 | Neary | |
| 6,937,705 B1 | 8/2005 | Godfrey et al. | |
| 7,239,629 B1 | 7/2007 | Olshansky et al. | |
| 2002/0006186 A1 | 1/2002 | Sanders | |
| 2003/0156706 A1 | 8/2003 | Koehler et al. | |
| 2003/0187639 A1 | 10/2003 | Mills | |
| 2005/0060224 A1 | 3/2005 | Ricketts | |
| 2005/0074113 A1 | 4/2005 | Mathew et al. | |
| 2005/0129184 A1 | 6/2005 | Creamer et al. | |
| 2005/0129194 A1 | 6/2005 | Creamer et al. | |
| 2005/0286707 A1 | 12/2005 | Erhart | |
| 2006/0106613 A1 | 5/2006 | Mills | |

*Primary Examiner* — Sonia Gay

(57) ABSTRACT

A call calculator and method thereof used to automate testing of a voice self service platform. The call calculator may have functional logic to calculate an estimated call load. The type of load may be least one of cyclic, peak, burst, choppy, and sustained. The call calculator may use a set of input parameters of an algorithm to calculate the estimated call load, wherein the algorithm may be based on an integral calculus model.

20 Claims, 101 Drawing Sheets

| CgvmCalls | |
|---|---|
| PK | UTSID |
| | AppName<br>InputSet<br>CallTime<br>CallCount |

FIG. 68A

| BrowserCalls | |
|---|---|
| PK | UTSID |
| | UPCID<br>BrowserHangup<br>Duration |

FIG. 68B

| EosEvent | |
|---|---|
| PK | UTSID |
| | EventTime<br>UPCID<br>ServiceName<br>MsgID<br>MsgReceived<br>WhatMsg<br>MsgDetails |

FIG. 68C

| | CallStatistics |
|---|---|
| PK | UTSID |
| | UnitID
SubUnitID
ReportingTime
CallCount
MtlRecvCount
MtlSentCount |

FIG. 68D

| | Incidents |
|---|---|
| PK | UTSID |
| | UnitID<br>SubUnitID<br>ReportingTime |

METHOD AND APPARATUS FOR VOICE RECOGNITION UNIT SIMULATION

CROSS-REFERENCE TO RELATED APPLICATIONS

This application is a continuation of U.S. patent application Ser. No. 11/759,659, filed on Jun. 7, 2007, entitled METHOD AND APPARATUS FOR VOICE RECOGNITION UNIT SIMULATION, the entirety of which is incorporated herein by this reference in its entirety.

BACKGROUND OF INVENTION

1. Field of Invention

This invention relates generally to testing of telecommunication systems and, more particularly, to call calculator having functional logic to calculate an estimated call load.

2. Background Art

Traditionally, telephony application development involves complicated hardware set up. This complicated hardware set up includes telephony and media gateway, and speech servers. In many test environments, the application developer needs to place a telephone call to the platform to test their application. Needless to say, the system developers are also required to do the same. This situation results in additional expense and a rigid application development environment. Additionally, there has been a need for a high capacity telephony circuit in the lab to do stress testing, and due to all of the complicated hardware set up and the need for a large amount of resources, most new application software updates in the industry make it to production without going through a full regression test suite.

The present invention is meant to alleviate these complexities and enhance the application development environment. The present invention is specifically focused on resolving the above noted problems for designing and testing Voice Recognition Units (VRUs). VRU is often referred to by other terminologies such as Interactive Voice Recognition (IVR), and the acronym EOS. The VRU consists of different components (software/daemons), which perform their respective tasks.

A better simulation methodology is needed to overcome the above noted problems.

BRIEF SUMMARY OF INVENTION

The invention may include a call calculator and method thereof used to automate testing of a voice self service platform. The call calculator may have functional logic to calculate an estimated call load. The type of load may be least one of cyclic, peak, burst, choppy, and sustained. The call calculator may use a set of input parameters of an algorithm to calculate the estimated call load, wherein the algorithm may be based on an integral calculus model.

The invention may also be embodied as an apparatus and/or computer software to automate testing of a voice self service platform. In its software embodiment, the present invention comprises software that is operable to run on a WINDOWS® platform to simulate all the components of an Interactive Voice Recognition Unit (VRU). However, the present invention can be adapted to operate on other platforms without departing from the scope of the invention. In addition, this embodiment can also be used as a helper unit to test individual components of an interactive voice recognition system (IVR).

There can be various components assembled to form the present invention, which can remedy many of the short comings and problem areas in the Interactive Voice Recognition (IVR) arena. By way of a high level overview of the present invention, on the basis of its functionalities, the various components can be categorized as follows. 1.) Simulated IVR Components; 2.) Emulated Telecom, Voice and Recognition Components; 3.) Use of external control messages rather than telecom in a telephony platform; 4.) Seamless substitution of the simulated component in place of a real unit made possible by providing the software hooks (event notification) to the appropriate part of the system; 5.) Development and Test of multiple components of the telephony platform using external means; and 6.) State machine synchronization utilized to facilitate the reproduction of real world case scenario and predictability of the outcome.

The present invention comprises a full simulator and helper VRU. The components are tightly coupled and the interaction between them is seemingly adaptive. With the help of an in build 'call calculator' the unit is able to generate and maintain a required sustained load. The simulator is also built on "integration middleware", whereby the simulator functionality is well isolated from the data integration and transport layer. Also the simulator draws a strong analogy to the existing telephony hardware grouping such as T-1s and trunk groups.

The simulator is comprised of the following six components: Dialer and Manager, Call generator and VRU monitor, Telecom IN, VOX, ASR, Telecom OUT. In addition, it has Hardware emulation for the following functionalities: Telecom switch (which generates multiple simultaneous calls with intricate details such as pull back of timeout calls, ADR functionality), Telecom bridge for the transfer functionality, voice device (interaction with the COM device, and the TTS engine), and caller interaction for the ASR functionality. In addition these emulators can emulate various system level failures.

The XML driven call engine can simulate calls with millisecond precision and hence able to replicate the call scenario to the closest approximation. Multiple components of the simulator is closely watched by a watcher application. Multiple simulators can be integrated together with the concept of 'dialer' acting as a management tool that will monitor the different units. This way it is possible to generate a large volume for the load test.

The simulator design for the present invention is very cost effective (ie., does not require any special hardware) and millions of calls can be generated for 'zero cost' paring the usage of existing desktop and intranet hardware. These and other advantageous features of the present invention will be in part apparent and in part pointed out herein below.

BRIEF DESCRIPTION OF THE DRAWINGS

For a better understanding of the present invention, reference may be made to the accompanying drawings in which:

FIG. 68A CgvmCalls DB Fields are illustrated.

FIG. 68B BrowserCalls DB Fields are illustrated.

FIG. 68C EosEvent is illustrated.

FIG. 68D CallStatistics DB Fields are illustrated.

FIG. 68E typical incidents DB Fields are illustrated.

FIG. 73 the controls specific to the call calculation are numbered.

DETAILED DESCRIPTION OF INVENTION

Figure 1:
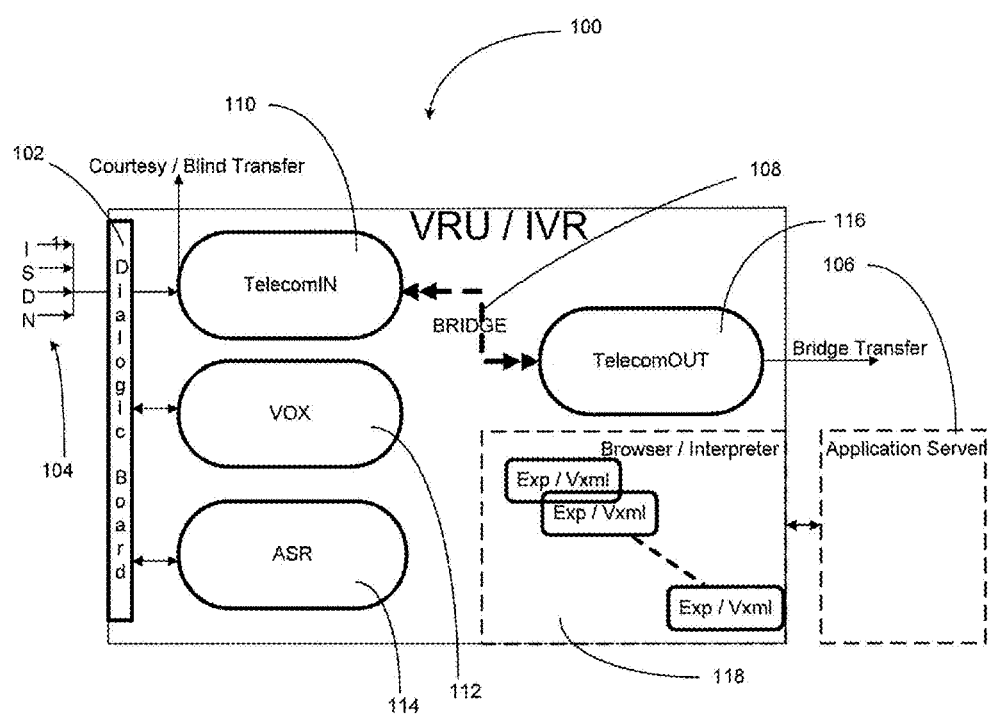
FIG. 1 is a functional diagram of the VRU components.

According to the embodiment(s) of the present invention, various views are illustrated in FIG. 1-24 and like reference numerals are being used consistently throughout to refer to like and corresponding parts of the invention for all of the various views and figures of the drawing. Also, please note that the first digit(s) of the reference number for a given item or part of the invention should correspond to the Fig. number in which the item or part is first identified.

There are various components integrated to form the proposed invention, which are designed to remedy many of the problem areas in the Interactive Voice Recognition (IVR) arena. On a high level, on the basis of its functionalities, the various components can be categorized as follows:

Simulated Components
Emulated components
Process Controller (Application Engine)
System Integrity Module
External Functionality Modules
Call Calculator The majority of the modules in the traditional IVR equipment are simulated. By integrating the simulated components, the present invention can clearly achieve a fully functional simulated VRU. Also, many of the critical component's features can be extended to emulate the real equipment. An external controller engine driven by XML based application is added to automate the operation. The controller engine can be the intrinsic component of the system. The controller design can facilitate way for many added features in the equipment. Setting the input parameters is critical when the apparatus is used to replicate various real world scenarios. Hence a call calculator can be added, which when given the model, can generate the required and appropriate input parameters. Collectively, all of the components of the present invention can be referred to as 'Comprehensive Voice Service System (CVSS)'

The following are the list of new concepts that are present in the system.

Simulating the IVR component functionality

Emulating the telecom, voice and recognition hardware circuitry and its functionality Concept of not using the telecom in a telephony platform. (use external control messages, there by eliminating the cost)

System build out with some real unit components and certain others with simulated components Seamless substitution of the simulated component in place of a real unit alleviates the pain of software coding to accommodate the variation. This is possible by providing the software hooks (event notification) to the appropriate part of the system Developing and testing multiple components of the telephony platform using external means State machine synchronization facilitate the reproduction of real world case scenario and predictability of the outcome (this predictability also increases the chances of identifying the bug in the system)

In the distributed architecture, by maintaining tightly coupled state machine, it is possible to retain the system integrity Call Calculator D-Channel real time monitoring System extendibility leading to innumerable application One embodiment of the present invention comprising VRU simulation components for a dialer, call generator, TelecomIN, Vox, ASR, and TelecommOut teaches a novel apparatus and method for simulating a VRU in a development and testing environment. The VXML browser and the application server can be the actual units. There can be the ability to use the real VOX and or ASR daemon from the VRU which will be used in the development.

Along with those simulated components, the following features and or functionalities can be added to complete the entire CVSS architecture 600. See FIG. 6.

Hardware functionality components 602

Configuration manager 604

XML driven application engine 606

Database services 608

Add on complementary services 610

Call Trace Explorer

Test Set Report Viewer

App Set Editor

External Scripts (PERL and BASH scripts)

Remote Upgrade Mechanism

Call Calculator

Hardware functionality components are mainly the emulated components that are intrinsically needed for the simulator functionality. The application engine has whole processing and interpretive software along with its XML based application specific drivers. The whole system is configured and tuned with external settings. This design makes the installation dynamic and increases its versatility for future expansion. Microsoft Access based database interface can be included to capture the run time events and statistics. Later in this document, each one of these modules will be explained in detail in their respective sections.

All the simulated components can have a graphic user interface (GUI). The GUI is designed in windows wedges from the Microsoft Foundation Component (MFC). However most of the components, except for the Dialer, can be run under invisible mode. The GUI is used mainly to change any settings and to watch or monitor the operation. Since the process controller engine has all the required input it allows certain module to run in the invisible mode.

The details of the present VRU simulation invention and various embodiments can be better understood by referring to the figures of the drawing. It should be noted that a VRU can sometimes be referred to as an Interactive Voice Recognition (IVR) system by those skilled in the art area and this terminology may be used herein. A typical VRU comprises different components (software/daemons), which perform their respective tasks. FIG. 1, shows the typical components of a VRU, which is useful in understanding what functions of the VRU are simulated in the present invention. The broken lines illustrating an application server indicates the possibility of running that respective application server either within the VRU itself or run as a separate server.

Therefore, referring to FIG. 1, a typical VRU/IVR 100 is shown comprising a Telephony Interface board 102. Depending on the hardware either 1, 2 (dual-span), or 4 (quad-span) Integrated Services Digital Network (ISDN) lines 104 can be connected. The ISDN is a typical telecommunication line that can transmit both voice and digital network services at a high speed. ISDN is a set of standard protocols for establishing and breaking circuit switched connections and advance call features useful for VRU systems. The ISDN's ability to deliver at a minimum two simultaneous connects in any combination of data, voice, video and fax over a single line which allows for multiple devices or functions to be connected to a single line. The total number of lines available can be calculated from the following formula.

$$AvailableChannels = (\#T1*24) - 1$$

When a call lands on the VRU, the TelecomIN daemon 110 can forward the call to the Exp (CLASS interpreter—Telephony language developed and maintained or VXML-Browser (VXML interpreter) 118. VXML is short for Voice Extensible Markup Language. VXML, or VoiceXML, technology allows a user to interact with a network through voice recognition technology. Instead of a traditional browser that relies on a combination of HTML (Hypertext Markup Language) and keyboard and mouse inputs, VXML relies on a voice browser and/or the telephone. Using VXML, the user interacts with voice browser by listening to audio output that is either pre-recorded or computer-synthesized and submitting audio input through the user's natural speaking voice or through an input device, such as a telephone.

The interpreter 118 can start the appropriate program based on the Dialed Number Identification Service (DNIS) in the ring message, which identifies what telephone number was dialed by the caller. DNIS is an abbreviation for dialed number identification service, a telephone service that identifies for the receiver what telephone number was dialed by the caller. A common use for this type of system phone numbers that channel multiple phone numbers into the same private branch exchange system (PBX) or private telephone network used within an enterprise. Once the call enters the PBX system, the DNIS will identify which number was dialed and record that information. This allows the VRU to categorize the type of incoming call.

If the application is VXML, then an application server 106 can be used, which generates dynamic VXML pages based on the program or business logic. The Voice Handling Software (VOX) daemon 112 can perform the task of playing the prompt, recording the utterance, DTMF playback for the A-side courtesy transfer, voice routing during bridge transfer and DTMF digit collection. Dual-tone multi-frequency (DTMF) signaling can be used for telephone signaling over the line in the voice-frequency band to the call switching center. The typical version of DTMF used for telephone tone dialing is known by the term Touch-Tone. A different version is used for signaling internal to the telephone network. DTMF is an example of a multifrequency shift keying (MFSK) system. Voice hardware devices for A-side and B-side channels can be on the dialogic board.

The Automatic Speech Recognition (ASR) daemon 114 can perform the task of voice and DTMF recognition. This daemon can act as a liaison between ASR server 114 and the interpreter 118. To perform the recognition task, this daemon can manage loading, activating, deactivating, unloading and freeing of the grammar. Once the ASR has performed the recognition task, it can provide the appropriate input representative of the recognized voice and DTMF to the Interpreter for processing. The Browser/Interpreter uses its voice browser functionality to start the appropriate program based on the DNIS and the input representative of the recognized voice and DTMF. The TelecomOUT 116 daemon can perform the task of call transfer. In this bridge transfer 108, the VRU can hold on to the call till either A or B-side hangs up.

The telephony applications for the browser/interpreter can be written in the following two interpretive languages—1. CLASS; 2. VXML (Industry standard).

EXP is a typical CLASS language Interpreter. Normally EXP(s) can be run in each VRU, with 110% of the full capacity of the channels available in the VRU. The VXML Browser (interpreter) can interpret the VXML pages. Typically VXML Browser is a server unit, which runs approximately 500 (≈20 Tls capacity) instances of the browser.

The Speech Application Language Tag (SALT) Browser (interpreter) interprets the SALT pages. SALT is a speech interface markup language. It consists of a small set of XML elements, with associated attributes and DOM object properties, events and methods, which apply a speech interface to web pages. DOM (Document Object Module) is a platform- and language-neutral interface that will allow programs and scripts to dynamically access and update the content, structure and style of documents. The document can be further processed and the results of that processing can be incorporated back into the presented page. SALT can be used with HTML, XHTML and other standards to write speech interfaces for both voice-only (e.g. telephony) and multimodal applications.

For the Application Server in the VXML side of the telephony applications, normally writing directly VXML coding (which is also referred to as static VXML pages), can be avoided. The following are the main reasons behind this:

1.) VXML is a standard, which is a moving target. Any new specification changes means directly changing the software.

2.) VXML is an interpretive language and hence dynamic generation of these pages on the fly during the run time will not affect the performance.

Figure 2:
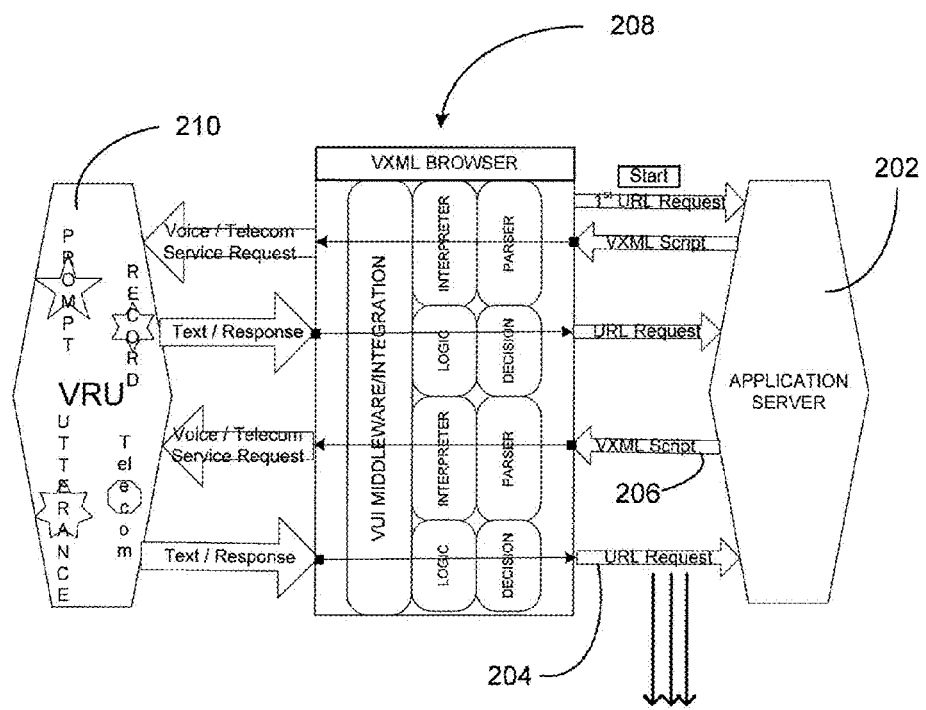
FIG. 2 is an illustration of message transport layer.

The application Server 202 closely works with the Interpreter. Refer to FIG. 2. Interpreter sends an URL (servelet, cgi-script, EJB, JSP, ASP, etc.), request 204 to the app-server. The app-server sends back a snippet 206 of the VXML code, which contains the next program/business logic. The program/business logic necessary to be responsive to the caller input is executed. The VXML 208 interprets the current code and based on the result, makes the next URL request. The process goes on like this till any one of the following scenarios occurs:

a.) caller hangs up
b.) program logic is completed
c.) caller input error
d.) system error When the call lands on the VRU 210, depending on where the interpreter software is running, the call might land on the browser server. If the application is generated dynamically, then the call chain might include an application server. At the maximum of three units might be involved in processing the call. So, any logging or tracing on a call could potentially be scattered on more than one unit.

Figure 3:
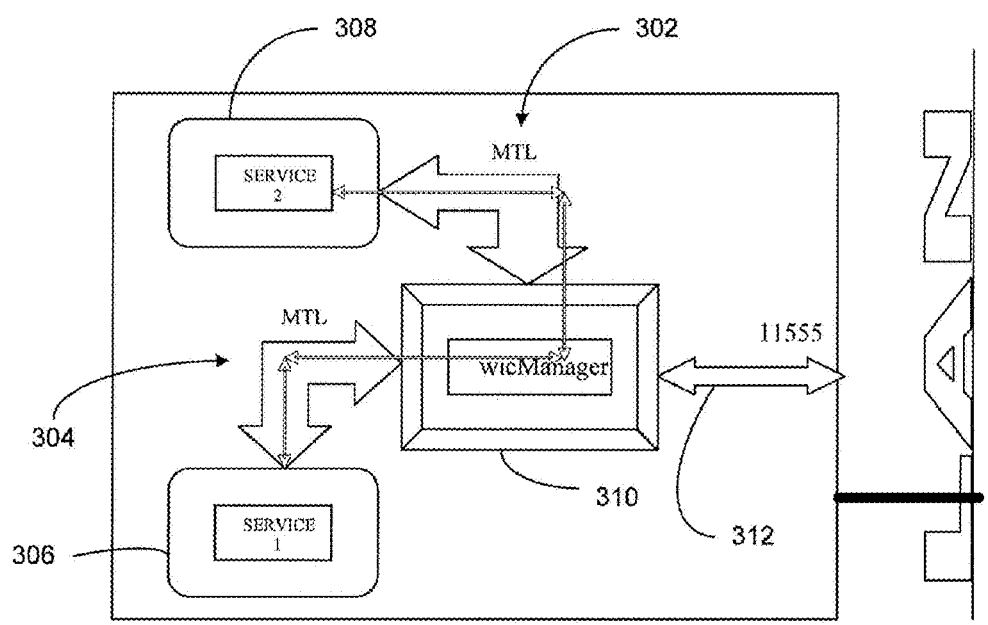
FIG. 3 is an illustration of a message transport layer.
Figure 4:
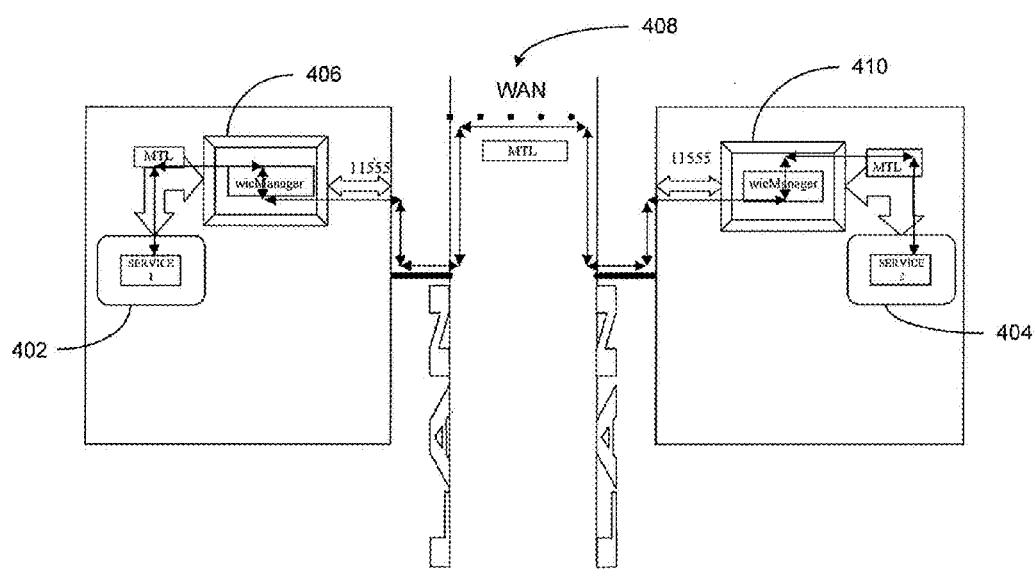
FIG. 4 is an illustration of a simulation system.

In the above mentioned call chain, there could be more than one unit/server(s) involved in processing the call. Referring to FIG. 3, a Message Transport Layers (MTL) 202 and 204 or messaging layer can be developed for inter process communication (IPC). Each one of the services 306 and 308 involved in the call processing communicates with each other through the MTL 302. The message sending service, delivers the message to the manager function 310. The manager function takes care of routing the message to the appropriate unit and the final manager function delivers the message to the appropriate destination service 212. Consider the following three scenarios for the message flow:

Simple Case as seen in FIG. 3: Both the source 306 and destination 308 services are on the same unit. The source service delivers the message to the manager, which in turn delivers the message the appropriate destination service.

Moderate Case (see FIG. 4): Source service 402 is one unit and destination service 404 is on another unit. Source service delivers the message to its manager 406, which in turn delivers it to the destination unit's manager 408. The final manager 410 delivers the message to the appropriate destination service 404.

Complex Case: This is a slight deviation to the moderate case as explained above. If all of the destination services are busy, then if that manager knows an alternate unit where additional equivalent services are available, the message is relayed to that alternate unit's manager, which delivers the message to the appropriate destination service.

Figure 5:
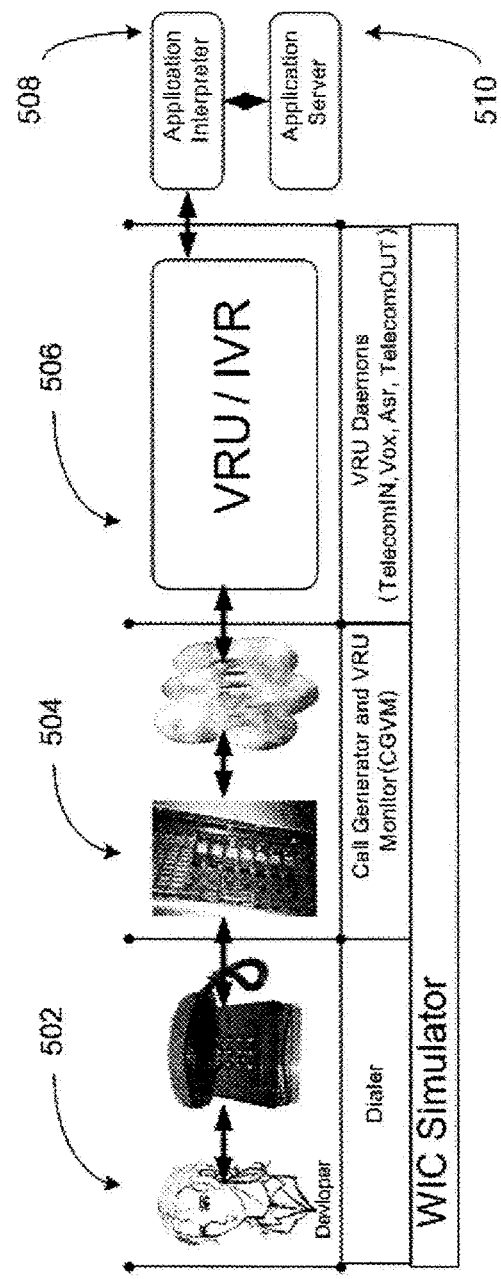
FIG. 5 is an illustration of a simulation approach.
Figure 6:
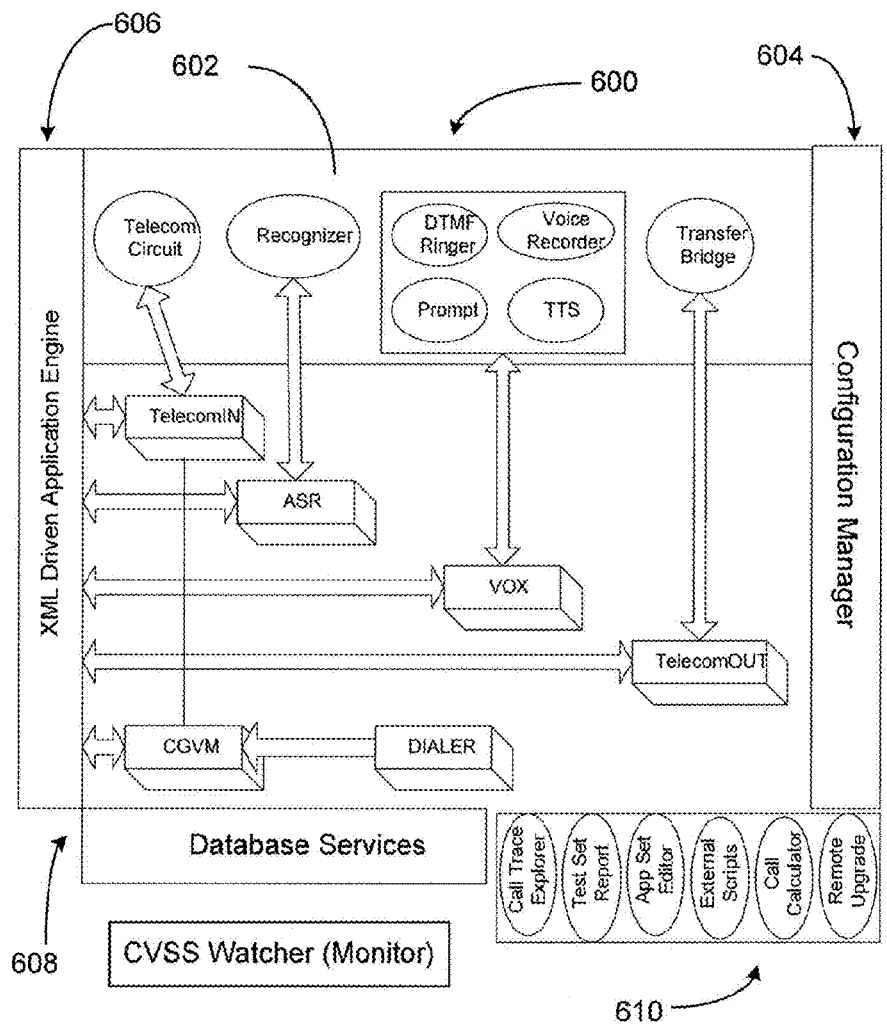
FIGS. 6 through 14 are an illustration of various user interfaces for control and monitoring.

A typical telephony application development setup for a typical VRU as described above and its corresponding simulation approach taken, is shown in the FIG. 5. The simulator program can be a WINDOWS® based program. The present invention can simulate the above described VRU Functions with the necessary monitors and controls to greatly enhance future VRU system developments for VRU systems designed to capture and respond to caller inquiries. The components that can be simulated by the present invention are:

a.) Dialer 502: Telephone equipment that the programmer/developer uses to place the call b.) Call Generator and VRU Monitor (CGVM) 504: the actual generation of the ring message and monitoring multiple VRUs performance VRU 506 Components are:
a.) TelecomIN
b.) VOX
c.) ASR
d.) TelecomOUT However, the VXML browser 508 and the application server 510 can be the actual units. Note, that there is the ability to use the real VOX daemon from the VRU which can be used in the (VRU) development.

The dialer function of the simulator requires the following four parameters to generate the load:
- Number of calls per batch
- Intercall period
- Batch period
- Previous active call handling Depending on the generated ring pattern the load can be categorized to the following types:
- Even: Evenly distributed sustained load
- Peak: Interested in generating the max peak
- Burst: dump the calls in a burst (wait long enough to complete as much calls as possible
- Choppy: dump the calls in a burst and hang-up the calls immediately The user of the simulator system can select from among the above parameters to simulate various call generation scenarios. The call calculator function of the simulator can estimate the load and stress level of during load simulation testing.

When a call is generated by the dialer portion of the simulator, it is received by the Call Generator and VRU Monitor (CGVM) functional module of the simulator. The Call Generator portion of this simulation function actually generates the ring message containing a computer generated DNIS. The VRU Monitor portion of this simulation functional portion can monitor operation parameters of the other simulated functions. The simulated ring message containing a DNIS can be transmitted to the VRU Daemons or functional simulation modules for further processing. However, one embodiment of the present simulation invention can utilize and interface with an actual Application Interpreter/VXML Browser and an actual Application Server rather than simulating these functions. However, in this simulation embodiment, the TelecomIN, VOX, ASR and TelecomOUT function can be simulated.

The simulated TelecomIN daemon function can forward the simulated call to an actual Exp (CLASS interpreter—Telephony language developed and maintained or VXML-Browser (VXML interpreter) that is being utilized in conjunction with the simulation functions. Using VXML, the simulated call interacts with voice browser by listening to audio output. The interpreter can start the appropriate program based on the simulated DNIS in the ring message. The DNIS will identify which number was dialed and record that information. If the application is VXML, then an application server can be used, which generates dynamic VXML pages based on the program or business logic.

The simulated Voice Handling Software (VOX) daemon function can perform the task of playing a prompt function under test, recording a simulated utterance from the Dialer simulated function, DTMF playback for the A-side courtesy transfer, voice routing during bridge transfer and DTMF digit collection. Dual-tone multi-frequency (DTMF) signaling can be used for telephone signaling over the line in the voice-frequency band to the call switching center. The version of DTMF used for telephone tone dialing is known by the term Touch-Tone.

The simulated Automatic Speech Recognition (ASR) daemon function can perform the task of voice and DTMF recognition. This simulated function can act as a liaison between the simulated ASR server and the actual interpreter. To perform the recognition task, this daemon can manage loading, activating, deactivating, unloading and freeing of the grammar. The simulated TelecomOUT daemon function can perform the task of call transfer. In this bridge transfer, the VRU can hold on to the call till either A or B-side hangs up.

As indicated above the actual Interpreter can be utilized to interface with the simulated VRU function such as for example an EXP is a typical CLASS language Interpreter. Normally EXP(s) can be run in each VRU, with 110% of the full capacity of the channels available in the VRU. The VXML Browser (interpreter) can interpret the VXML pages. Typically VXML Browser is a server unit, which runs approximately 500 ($\approx$20 Tls capacity) instances of the browser.

The Speech Application Language Tag (SALT) Browser (interpreter) interprets the SALT pages. SALT is a speech interface markup language. It consists of a small set of XML elements, with associated attributes and DOM object properties, events and methods, which apply a speech interface to web pages. DOM is a platform- and language-neutral interface that will allow programs and scripts to dynamically access and update the content, structure and style of documents. The document can be further processed and the results of that processing can be incorporated back into the presented page. SALT can be used with HTML, XHTML and other standards to write speech interfaces for both voice-only (e.g. telephony) and multimodal applications.

Figure 7:
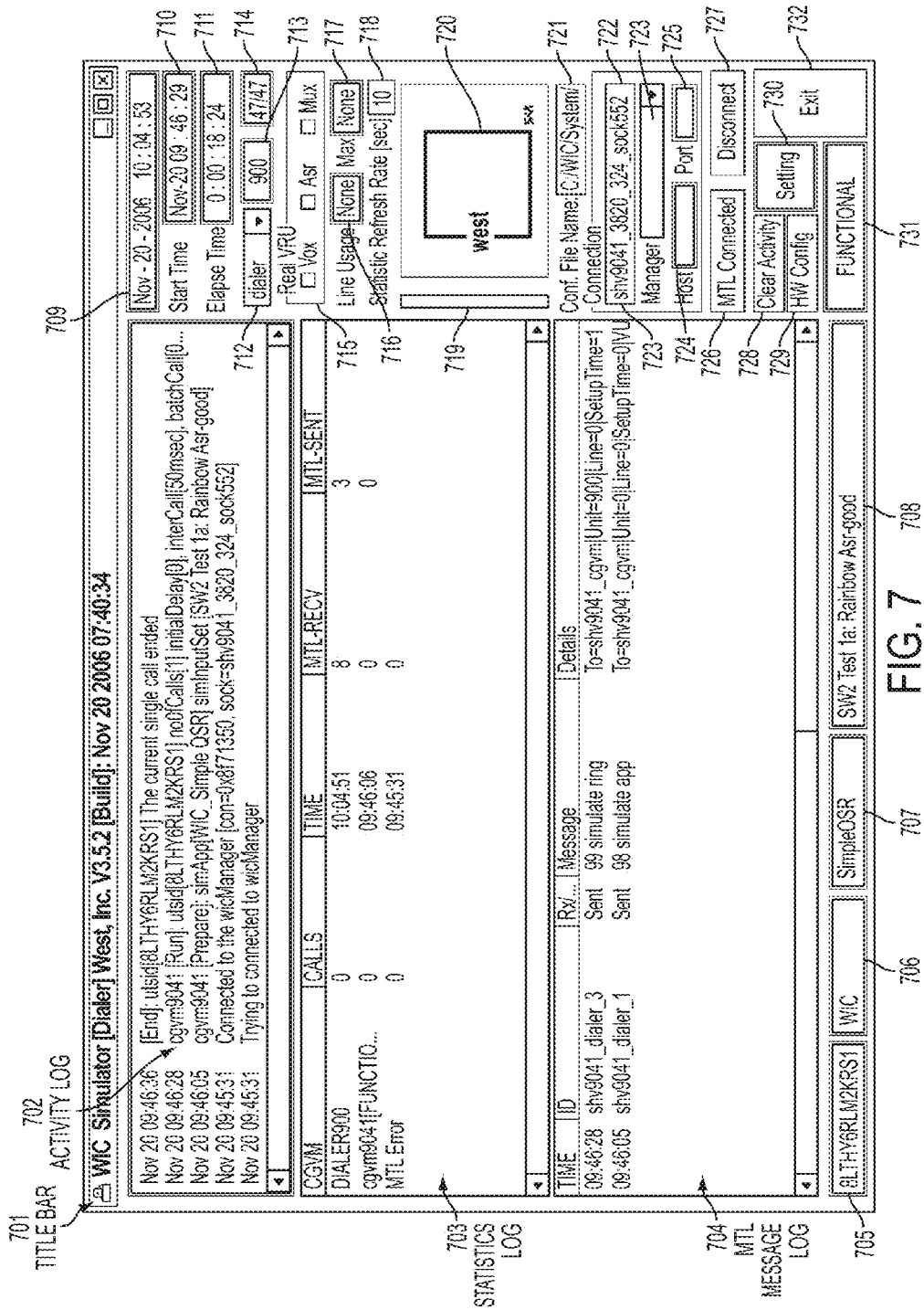

FIG. 7, is a snap shot of the main console, which are common to all daemons. The controls and monitors are numbered in the figure and the explanation for each one of the items is as follows:

1. Title Bar: Title bar showing the simulator name, process ID, and the build date.
2. Activity Log: Any significant activity pertaining to the functionality of the respective daemon is shown on this window. Each log has a time stamp. The message is a free form depending on the message content.
3. Statistics Log: Call and MTL statistics are shown in this window.
    a. Row details:
        i. Top First Row: Total statistics for the daemon
        ii. Top Second Rows: Statistics for the current test run
        iii. Middle Rows: Each daemon handles a certain set of MTL messages. We have entry for each one of those known vital messages
        iv. Bottom Rows: MTL errors
    b. Column details:
        i. Unit Name: Possible values for this column are unit name, known MTL messages.
        ii. Calls: number of unique calls as per the MTL message. Note: For some messages, this may not make sense and hence might not have a value (i.e., =0) or stat from another message. The first row contains the total number of calls processed by the daemon.
        iii. Time: The time when the statistics for that row was updated.
        iv. MTL-RECV: count for number of MTL messages received, which corresponds to that row.
        v. MTL-SENT: count for number of MTL messages sent, which corresponds to that row. This may not make sense to many MTL messages because we are watching for the statistics of how many messages received with that event.
4. MTL Message Log: All the MTL message activity, both for received and sent messages, are logged in this window. We could see the exact details of the MTL message. Note that the call tracing should be enabled to log the message details. However, any MTL error messages are logged by default.
  a. Column details:
    i. Time: The exact time as per the 'eosevent' k-v pair in the received MTL message. In the absence of this k-v pair or in case of error, or if it is a sent message, current local time is logged
    ii. ID: The MTLID k-v pair value in the sent or received MTL message.
    iii. Rcv/Sent: Indication whether the logged MTL message is a received or sent
    iv. Message: MTL Message event
    v. Details: detailed information regarding the MTL message.
5. UTSID: Current test set's unique identification
6. Client Name: Client name for which the application set belongs to
7. Test Set Group: The main group of test set
8. Test Sub Set: Subset of test within main test set
9. Main Clock: clock showing the current date and time
10. Start Time: a timer showing the when the timer was started. The timer depends on the type of the daemon
11. Elapsed Time: time elapsed for the timer mentioned in the Start Time. This again is dependent on the type of the daemon.
12. Daemon Type: a dropdown menu showing the list of all the available daemons. This window will be made disabled when the daemon is running.
13. Unit Number: Daemon unit number. This is a read-only field.
14. Channel Count: # of channels available on the unit. This is a read-only field.
15. Real/Helper VRU: Shows list of daemons that uses real VRU. In this case one or more of the simulated component act as a helper
16. Line Usage Current: The status of number of channels that are active currently (real time)
17. Line Usage Maximum: For the current test set batch the maximum number of channels that were used. This also gives the peak load number.
18. Statistics Refresh Rate: The rate at which the statistic log window data is refreshed. This is in 'seconds' unit. The default value is 10-seconds. Even though the updated statistics does not get refreshed till the next time elapse, internally the statistics is collected on the real time.
19. MTL Progress Indicator: Indicating whether the daemon is connected to the wicManager or not.
20. West Logo: Company Logo for the software trade mark
21. Configuration File Name: the configuration file that is used to start the MTL.
22. Connection Name: The MTL connection socket name
23. MTL wicmanager list: Drop down menu for the list of managers that the daemon can be connected to. This will facilitate the daemon to connect to a wicManager on another unit
24. MTL wicmanager host: Hostname of where the wicmanager to which the daemon is connected to.
25. MTL wicmanager Port: Listening Port number where the wicmanager to which the daemon is connected to
26. MTL connect: button press to connect to the wicmanager
27. MTL disconnect: button press to disconnect from the wicmanager
28. Clear Activity: clear (erase) the logged messages from the activity and the MTL message log window.
29. HW Config: button press to activate the hardware configuration window
30. Settings: button press to activate the respective daemon control window
31. Health Status: Current health status
32. Exit: exit the daemon.

Most of the controls can remain same across various daemons, however, functionally they could vary depending on the daemon it is associated with. The exact content of the monitor window, varies widely between the daemons. See examples in FIG. 11 through FIG. 12 and FIG. 19 through FIG. 23. Currently because of the GUI requirement for the daemons, the program can run in the foreground. However, they can be minimized. Maximizing can be disabled. Even though the exit ('x') at the right top corner is enabled you could exit the daemon only by pressing the exit button at the right bottom corner.

Figure 67:
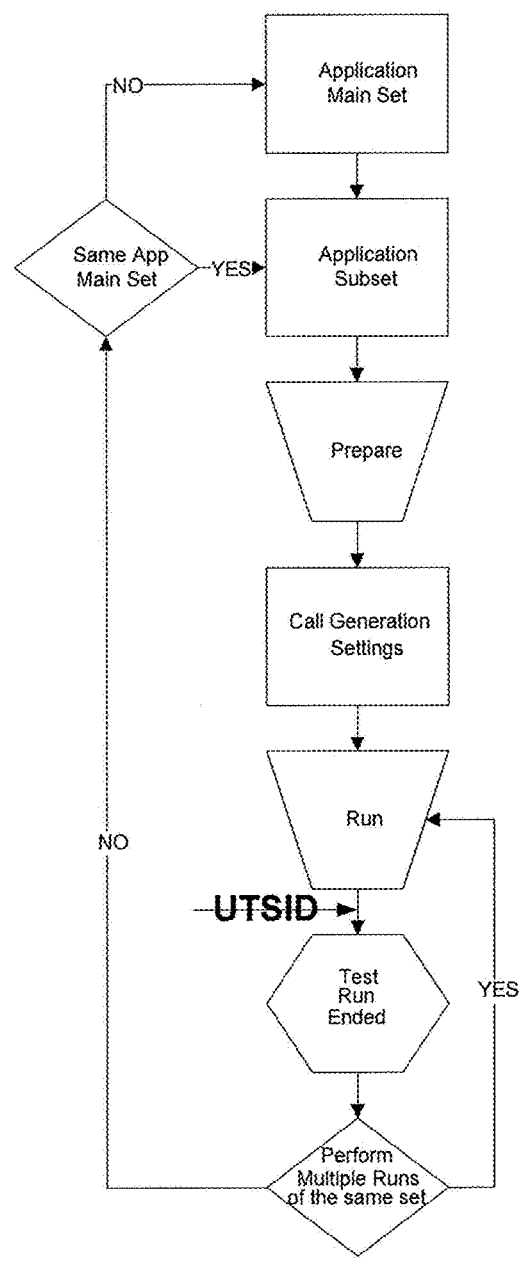
FIG. 67 is a single application set flow chart.
Figure 68:
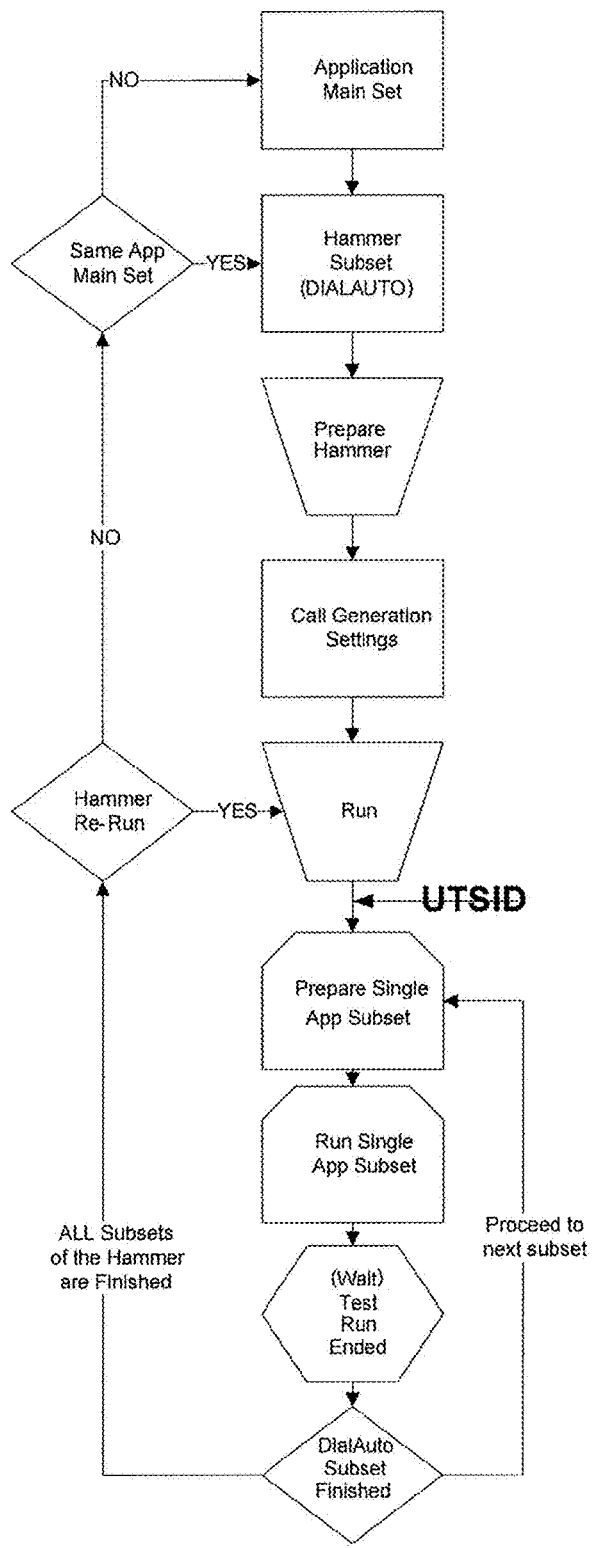
FIG. 68 is a hammer subset flow chart.

In a load stress testing, the statistic refresh rate can be set to a high value so that the program concentrates on the other important work rather than refreshing the screen too often. Typically the user could first select the appropriate application test set and subset by selecting a unique test set identification (UTSID). Then notify all the other daemons including the CGVM via the simulatorApp message to get prepared to initiate the test run. Later the user can select the appropriate call generation settings and select 'run' to start the test. The flow of this is shown in FIGS. 67 and 68.

The main purpose of the call calculator is to estimate the load and stress level during a load test. The dialer function of the simulator requires the following four parameters to generate the load:

Number of calls per batch
Intercall period
Batch period
Previous active call handling Depending on the generated ring pattern the load can be categorized to the following types:

Even: Evenly distributed sustained load
Peak: Interested in generating the max peak
Burst: dump the calls in a burst (wait long enough to complete as much calls as possible
Choppy: dump the calls in a burst and hangup the calls immediately The general main console has the required controls for setting up the configuration for the messaging manager. Through these settings, each component can be connected to a local or a remote manager. But normally, since all the components are grouped together to form the whole CVSS unit, these settings do not change from the default settings. If needed the connection to the manager can be severed manually. Also, if the manager's configuration changes, the manager will be recycled to pick up the change and the activity log will report those occurrences.

The following are the list of parameters that can be configured externally.

| FIG. 7 Ref. | Parameter | Default | Details |
|---|---|---|---|
| | version | 1.1 | Current version of the main configuration |
| 12 | simulator | cgvm | Default simulator. May be obsolete with the watcher is invoked |
| 18 | statRefreshInterval | 10 | |
| 21 | mtlConfigFileName | C:/WIC/System/MTL.cfg | |

-continued

| FIG. 7 Ref. | Parameter | Default | Details |
|---|---|---|---|
| 23 | manager2link databaseDSN | local ODBC; DSN = WicSimulator DSN | |

Figure 8:
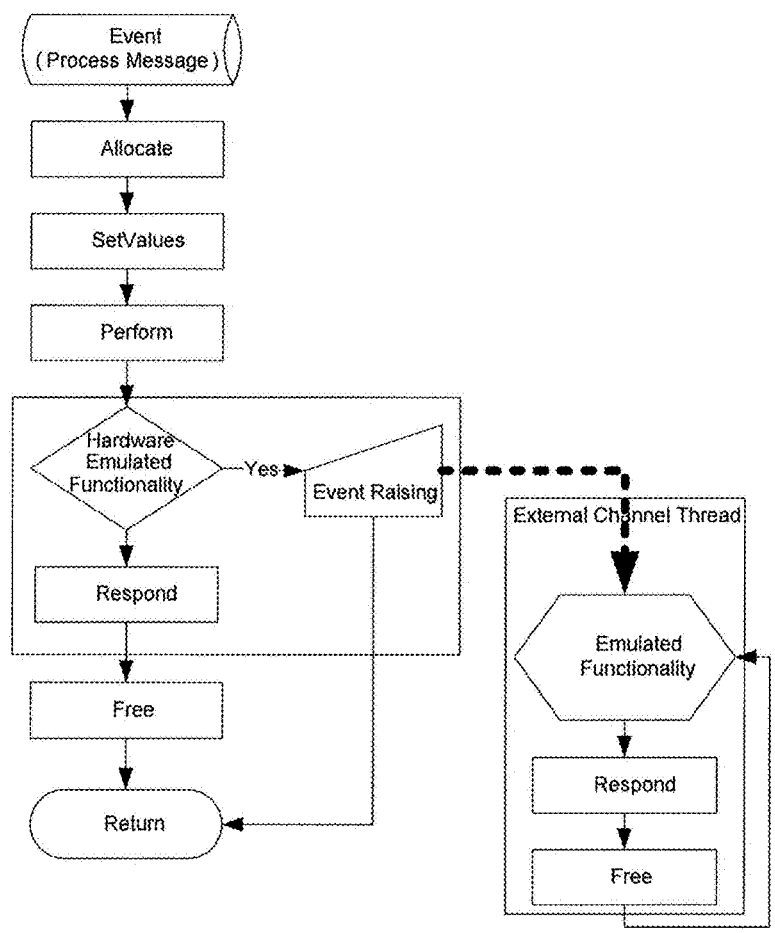

The generic procedure of how each of the daemons that will be described in the rest of this chapter, handles the incoming message is described in FIG. 8. The main process thread handles the messages too. So, it is imperative for the class to release the thread at the earliest time possible with minimal overhead. Otherwise, other channel threads will not be serviced with its new messages resulting in clogging of the entire system. Some of the messages are too generic that it will inherit the default message class and returns '800 done' on its own. The rest of the messages are handled independently depending on the functionality of the message. Generic messages such as 'simulate app' and 'ping' also are handled in the same way. Any unknown messages will be treated like a generic message and it addition notifies the error in the activity log.

When an event arrives at the daemon, based on its functionality it is inherited into a generic or specific class. Once these derived class is allocated, any external parameters that are required for the message processing, will be set froth the main module. Then the 'perform' member function will be invoked. This function performs any critical parameter evaluation from the base message and the message will be classified depending on what task will be executed. If the message requires to perform complex tasks, then an event will be raised in the corresponding channel and the main thread will be released to handle the next message.

Each channel's emulated component runs on its own thread. This way of multithreaded architecture allows us to work on multiple channel requests simultaneously. Depending on how the application set is coded, appropriate response will be sent to the caller. After completing all these tasks, the inherited class will be released and the thread gets ready to process the next message to that channel.

The multithreaded channels not only enhance working with multiple channel messages simultaneously, but also the extra time and processing performed closely approximates the real system. Further any timing related tasks for a particular channel can be performed without interfering with other channels. After elapse of certain time into the load test, because of natural lag and drag in the system, different channels will be at various stages of the call flow, which is how the real world calls progress.

Figure 9:
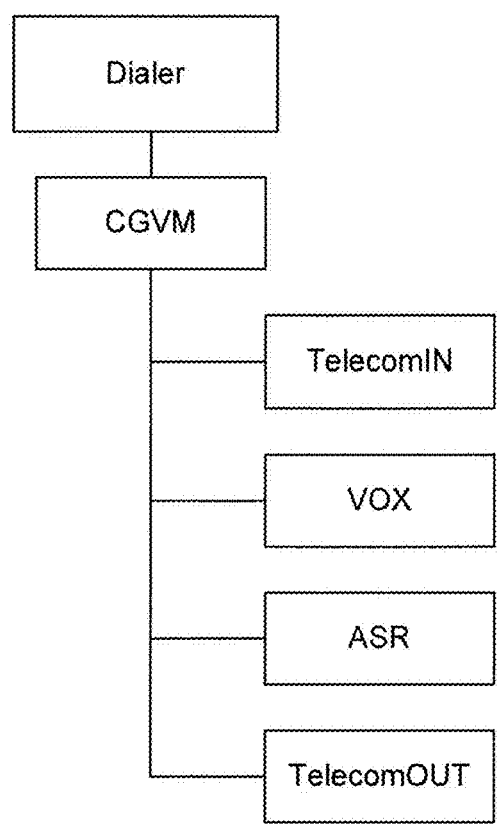

The parent-child-sibling relationship between the daemons is illustrated in the FIG. 9. Each daemon queries the health status and statistics of daemon(s) one level down in its family tree structure. If needed the siblings interacts with each other only to fulfill the required functionality.

The parent pings each one of its children for their statistics and is responsible for reporting own statistics to it's parent through 'pong' message. Every pong message is one stage lagging in informing its statistics. That is, when a daemon receives a ping message from its parent, it passes on the ping message to its children, but immediately responds with a 'pong' message to its parent with the last known statistics collected from the previous pong message from its children.

Figure 10:
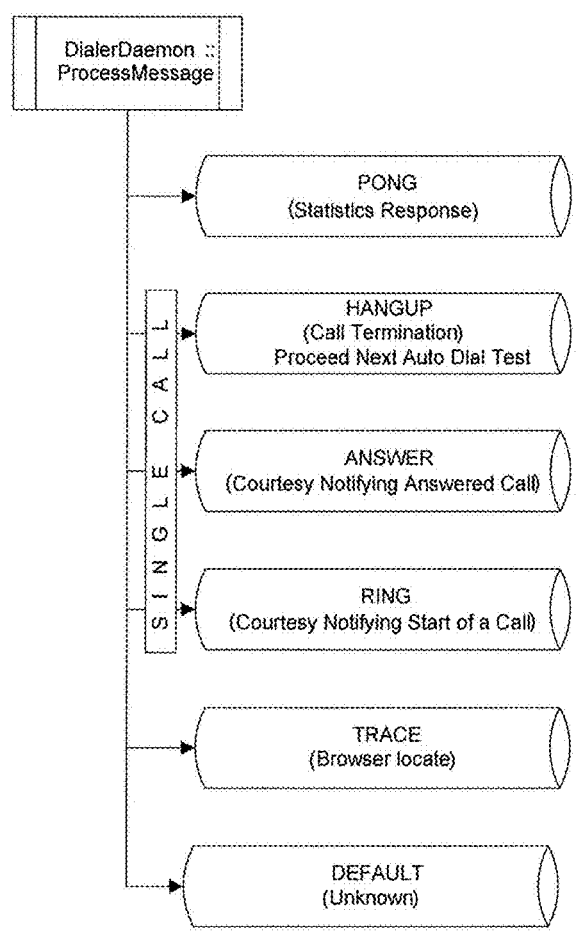

FIG. 10 lists the messages that need to be handled specific to its functionality. The rest of the messages however are handled with generic message handling mechanism as explained above.

As explained previously the dialer can invoke one of many simultaneous calls. The single call scenario is unique in nature that the dialer can be notified of the call control (telecom processing) state which can be used either as a notification or to drive the next test set. In this scenario, the TelecomIN daemon will notify the dialer when it submits a ring message to the browser. In addition it will notify when an answer is received from the browser and when the call hangup is initiated. An answer message will be used to identify the browser and its virtual channel where the call is processed which out switching to the TelecomIN daemon. Hangup message is critical for the developer so that he could invoke the next call manually, or it will be used to proceed to the next auto dial test case automatically. This feature enables the CVSS to run the entire test suite back to back automatically.

Figure 11A:
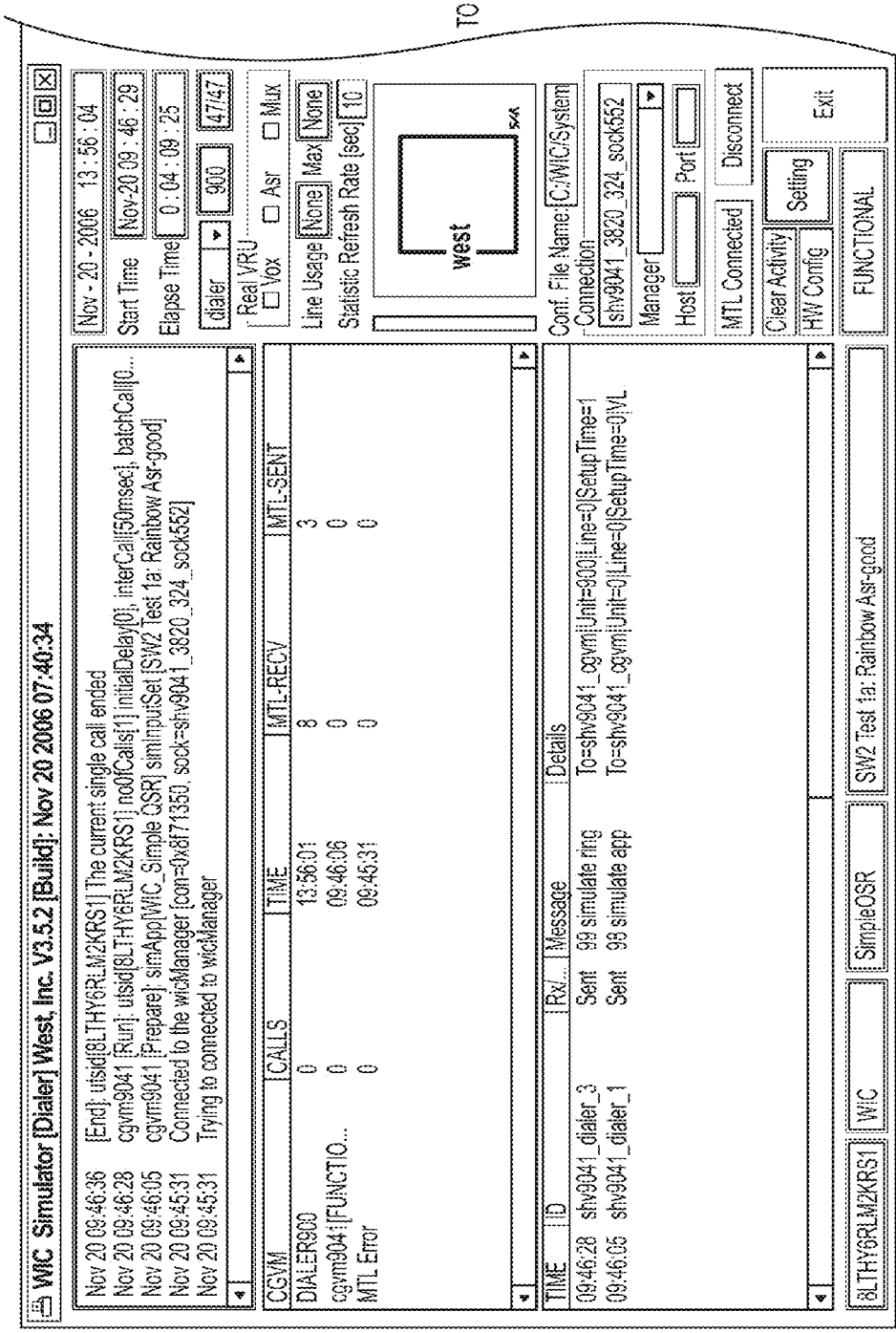
Figure 11B:
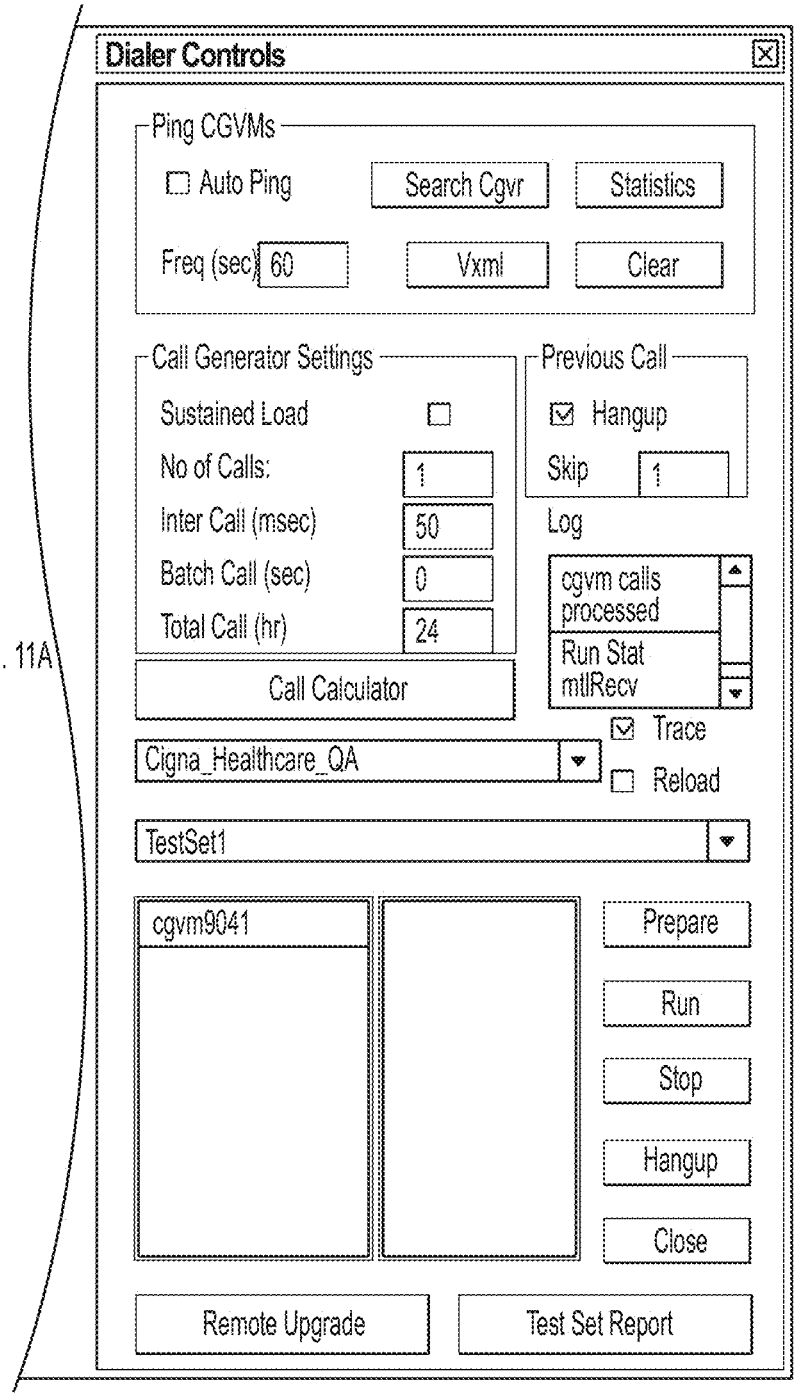

Dialer is the main dashboard used to control the entire simulator components. It has the ability to monitor multiple CGVMs. FIG. 11 is a snap shot of the dialer with its controls. The main functionalities of the dialer are:

Searching for the available CGVMs and maintaining its statistics
Ping the available browser servers
Collecting and clearing the statistics of other components, throw manual and/or auto ping feature
Preparing all the components for the next run with appropriate parameter values
Start and stop a test run
Control desk to avail external features such as call calculator, test set report viewer, etc.

The controls specific to the dialer are numbered in FIG. 12 and the explanation for each one of the items is as follows:

1.) Dialer Controls: Title bar indicating that the window is for dialer controls 701.
2.) Auto Ping: When set, dialer sends a request to get the current statistics from the CGVM(s). The frequency edit window below (5) determines the frequency of request. Please Note that the CGVM dispatches its request to the daemons for their respective statistics 702.
3.) Search CGVMs: button press to search for the availability of the CGVM(s) 703.
4.) Statistics: button press to send the request to collect the statistics from the CGVMs. This also helps each parent to know the current health of their children 704.
5.) Statistics Frequency: auto ping frequency to collect the statistics from the CGVM 705.
6.) VXML Browser Ping: button press to search for the availability of the VXML browser(s). If the roundrobin list has more than one browser, then each subsequent press will query the next browser in the list 706.
7.) Clear Statistics: Sends a request to the CGVM(s) to clear its statistics. Please Note that the CGVM dispatches its request to the daemons to clear their respective statistics 707.
8.) Call Generator Settings Group: The group of parameters for call generator 708.
9.) No. of Calls: Number of calls that will be placed in one batch 709.
10.) Inter Call Period: The time period (in milli-seconds), between the calls with in the batch 710.
11.) Batch Call Period: Duration between repeat batches. If this parameter is set to 0, then only one batch of calls are generated i.e., no repeats 711.
12.) Total Test Duration: Total testing duration in hours (Typically for load test during week end set it to 72 hours i.e., 3-days) 712.
13.) Previous Call Hangup: The decision whether to hang the previous call or not, when the previous call in that channel is still busy and the generator is ready to generate the next call in the given channel 713.

14.) Previous Call Skip: This parameter is used in conjunction with the previous call hangup (13) parameter. If this number is set to a number above '0', then even if the time is ready to generate next call, skip this many number of times before hangup. (Please note, that if the 'previous call hangup' flag is not set, then this setting is meaningless) 714.

15.) Log DB List: Select the required database entry that need to be logged (Please careful in choosing all the tables when the simulator is put to full load generation, since this might slow down the call processing!) 715.

16.) Flow Trace: Call flow trace enable flag. If this flag is turned on in conjunction with 'no. of calls (9)' is set to '1' and 'batch call duration (11)' is set to '0', then the call flow is traced. Call flow tracing includes all the MTL messages between the simulator components and messages between simulator and interpreter 716.

17.) Call Calculator: button press to open the call calculator 717.

18.) Application main set: application's main set name 718.

19.) Application Subset: subset name within the selected main application set 719.

20.) Reload: When this flag is turned on, all the daemons except dialer will reload the application set from external file. This is useful to update any application changes, without restarting the simulator components. However, for the dialer component, since the list of main application set is already loaded in the drop down menu, currently this feature has no effect (Currently, we need to disconnect the dialer and exit. Watcher will restart the dialer which will do the reload anyway, as a part of initialization) 720.

21.) CGVM Listing: The list of CGVMs that the dialer is configured for 721.

22.) CGVM Status: The current health status of the respective CGVM that is listed in the list (21) 722.

23.) Prepare: button press to send 'prepare' request to the selected set of CGVMs. 'Prepare' refers to preparing the daemons for the selected application set 723.

24.) Run: press to send 'run' request to the selected set of CGVMs, which starts the new test set 724.

25.) Stop: press to send 'stop' request to the selected set of CGVMs, which stops the current test set. If there is no current active set running, this button has no effect 725.

26.) Hangup: press to send 'hangup' request to the selected set of CGVMs, which hangs up the current active calls in the test set. Please note that if the test set is a repeat batch, the current set of active calls will be hung up, where as the new set of calls will continue 726.

27.) Close: press button to close the dialer's control 727.

28.) Remote Upgrade: button press to invoke software upgrade on a remote simulator server. Please note that the simulator watcher software should be running on the remote server to receive this request 728.

29.) Test Set Report: button press to display the report for all the test sets 729.

The following are the list of parameters that can be configured externally.

Figure 12:
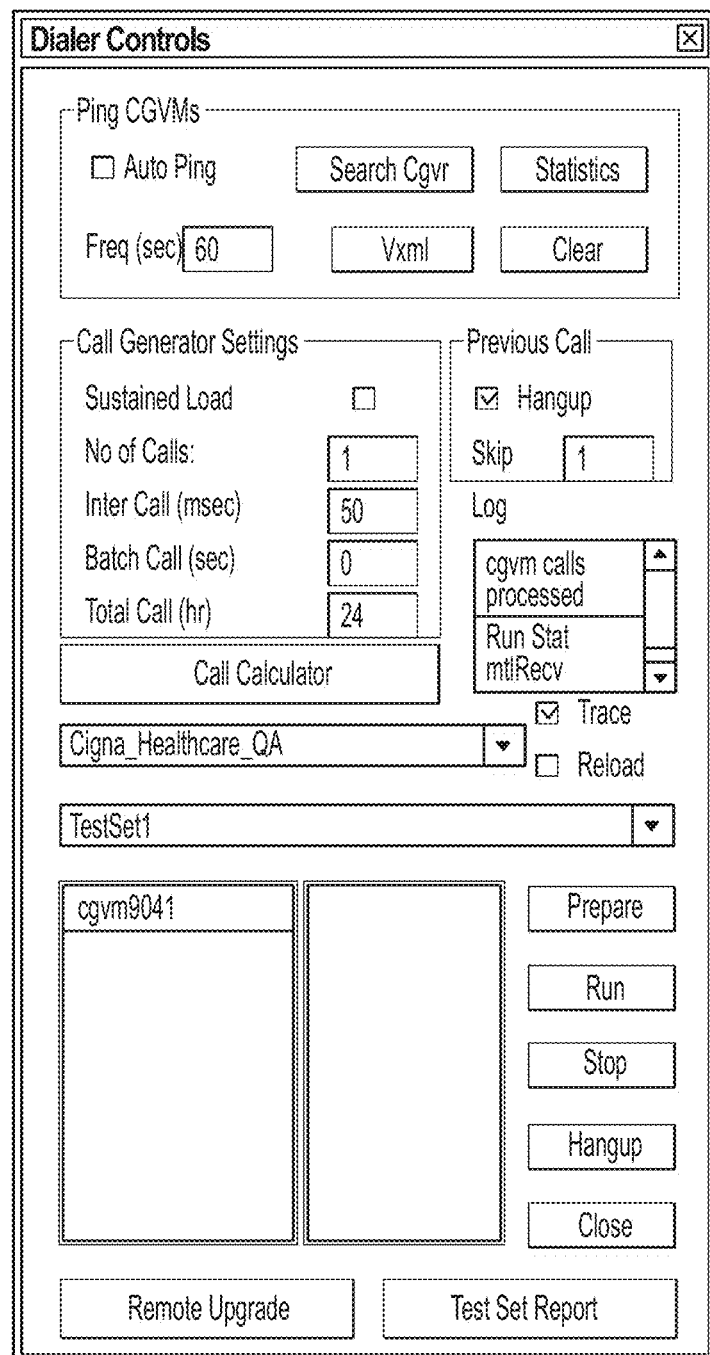

| FIG. 12 Ref. | Parameter | Default | Details |
|---|---|---|---|
| | version | 1.1 | Current version of the dialer configuration |
| | myDialer | 900 | Dialer group number. The selection of which CGVMs that this dialer can see is based on this value turn |
| 2 | autoPing | 0 | |
| 5 | pingInterval | 60 | |
| | statRefreshInterval | 10 | |
| 9 | noOfCalls | 1 | |
| 10 | interCallPeriod | 50 | |
| 11 | batchCallPeriod | 0 | |
| 12 | totalCallPeriod | 24 | |
| 8 | sustainedLoad | false | |
| 13 | hungCallHangup | true | |
| 14 | hungCallSkipCount | 1 | |
| 18 | simApp | WIC_SysDev | |
| 19 | simInputSet | Load Test: Play-None. Asr-noinput | |

Figure 13:
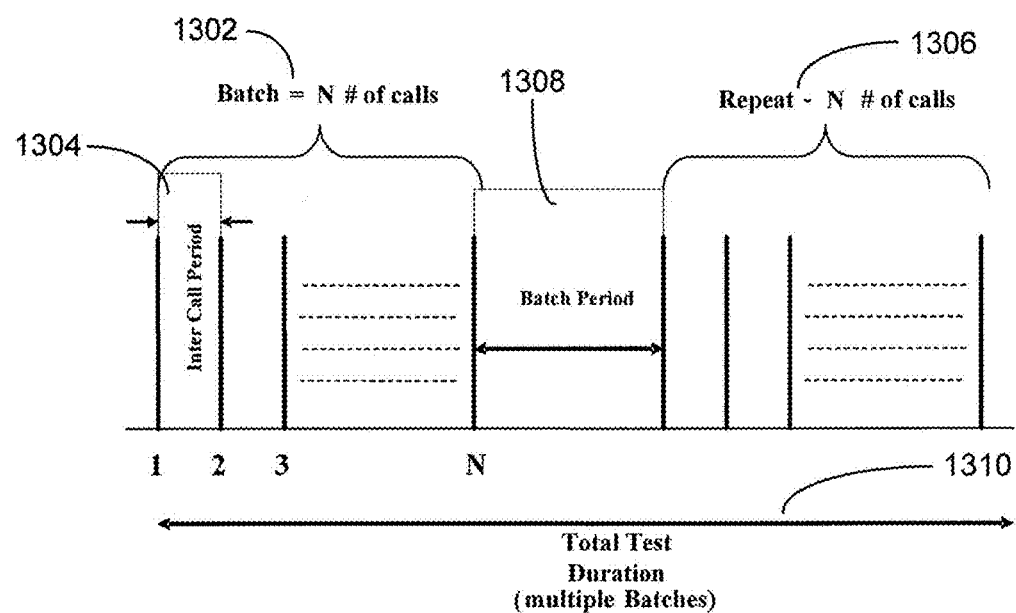

Please refer to the numbers from 708 through 712 in FIG. 12 that are related to call generation settings. There is a large permutation of possibilities for the type of load generated based on the settings of these parameters. FIG. 13 explains the relationship between these parameters. A batch of 'N' # of calls is generated 1302 at an interval of 'inter-call-period' 1304. This process is repeated after the defined batch period 1308. But, when the repetition batch follows, the # of calls generated 1306 will be subjective based on whether the previous call in the channel is completed or not. Parameters 13 and 14 in FIG. 12, determines this behavior. These parameters are inter-related with each other except for the total duration 1310. Because of this, the total calls originated and call completion rate could vary based on the setting. A poor selection of value to these parameters could end of generating a large volume of calls because early termination of the calls before it could complete the entire business logic.

Figure 14:
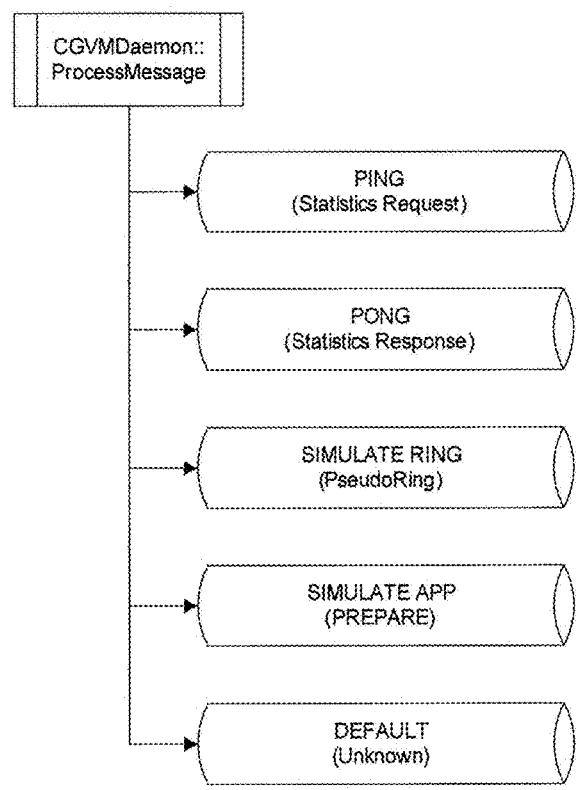

FIG. 14 lists the messages that need to be handled specific to its functionality. The rest of the messages however are handled with generic message handling mechanism as explained above.

Figure 15A:
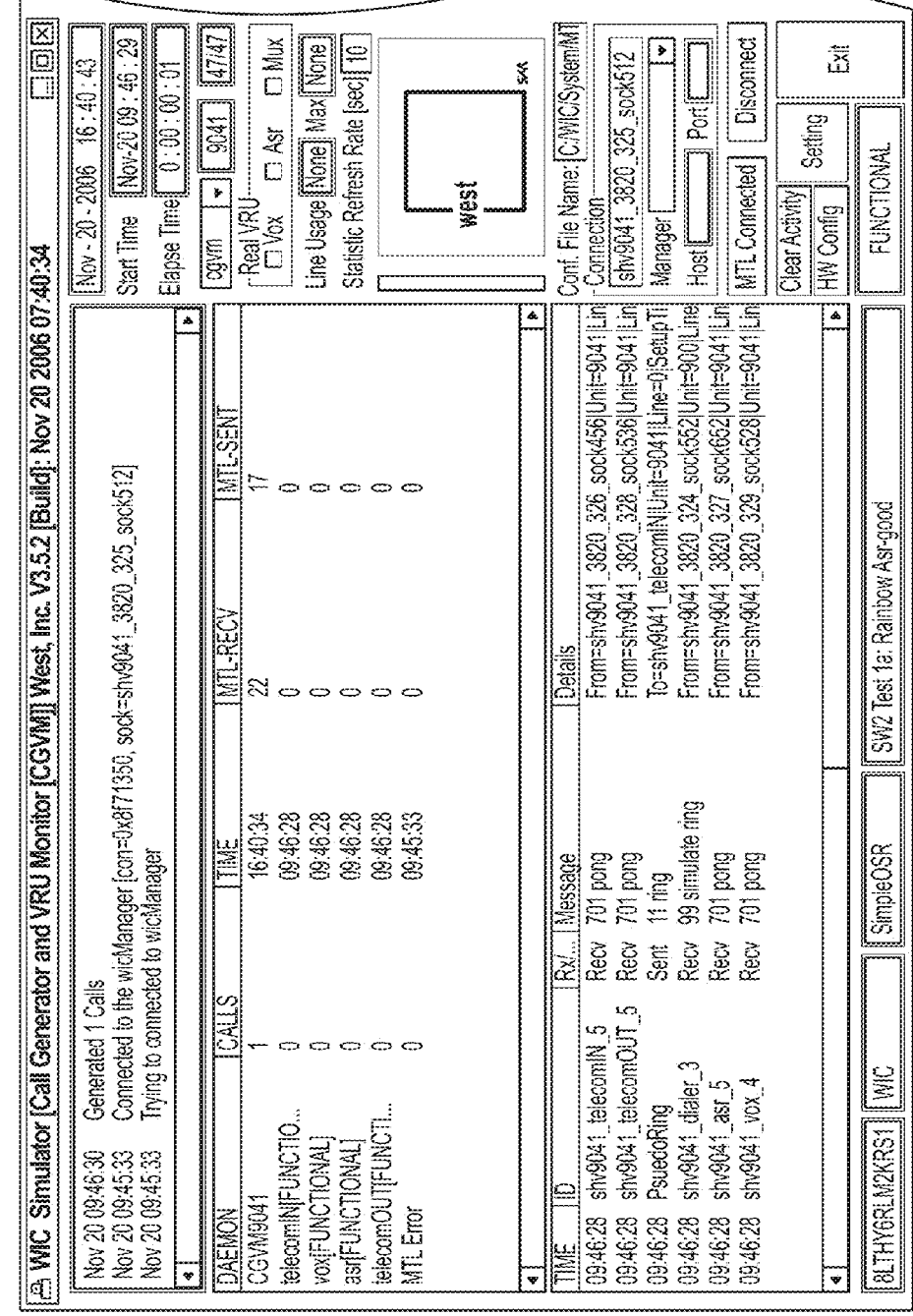
FIGS. 15A and B are a flow diagram for running a simulation test.
Figure 15B:
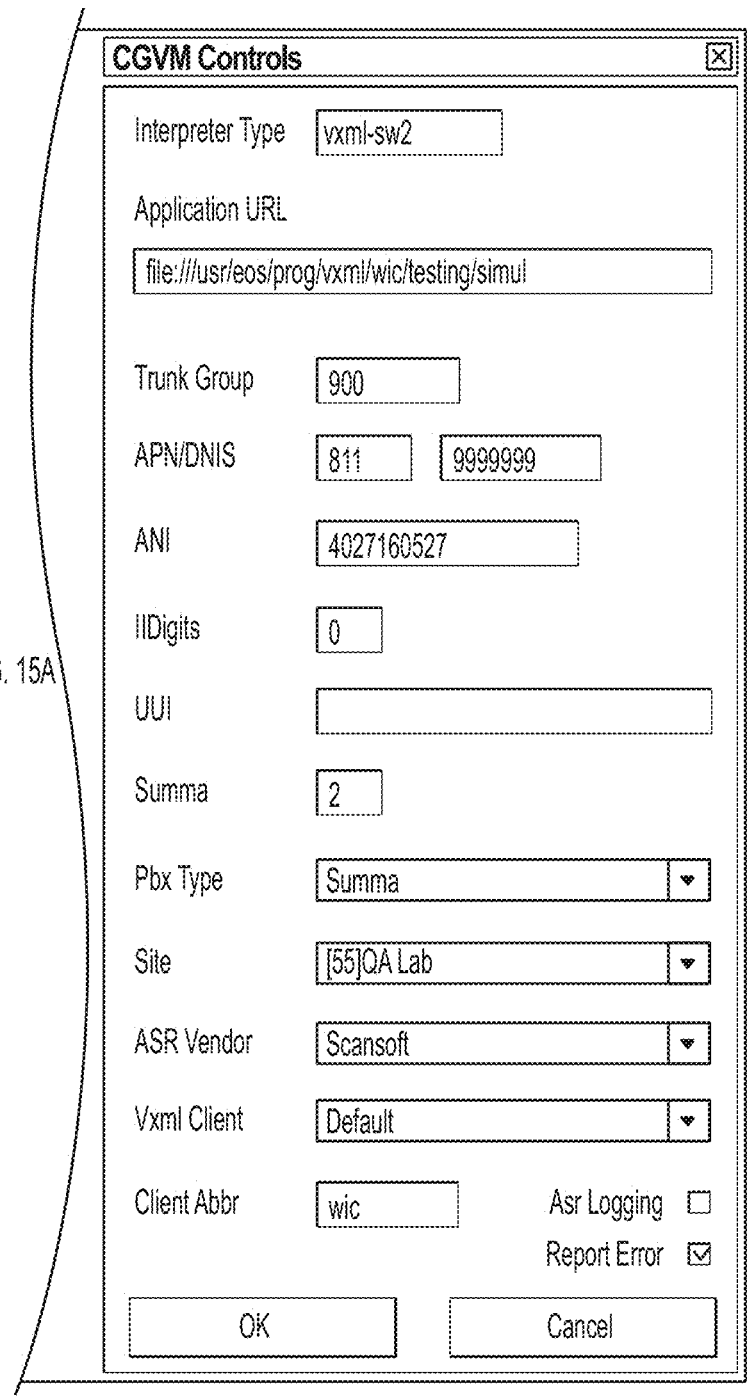
Figure 16:
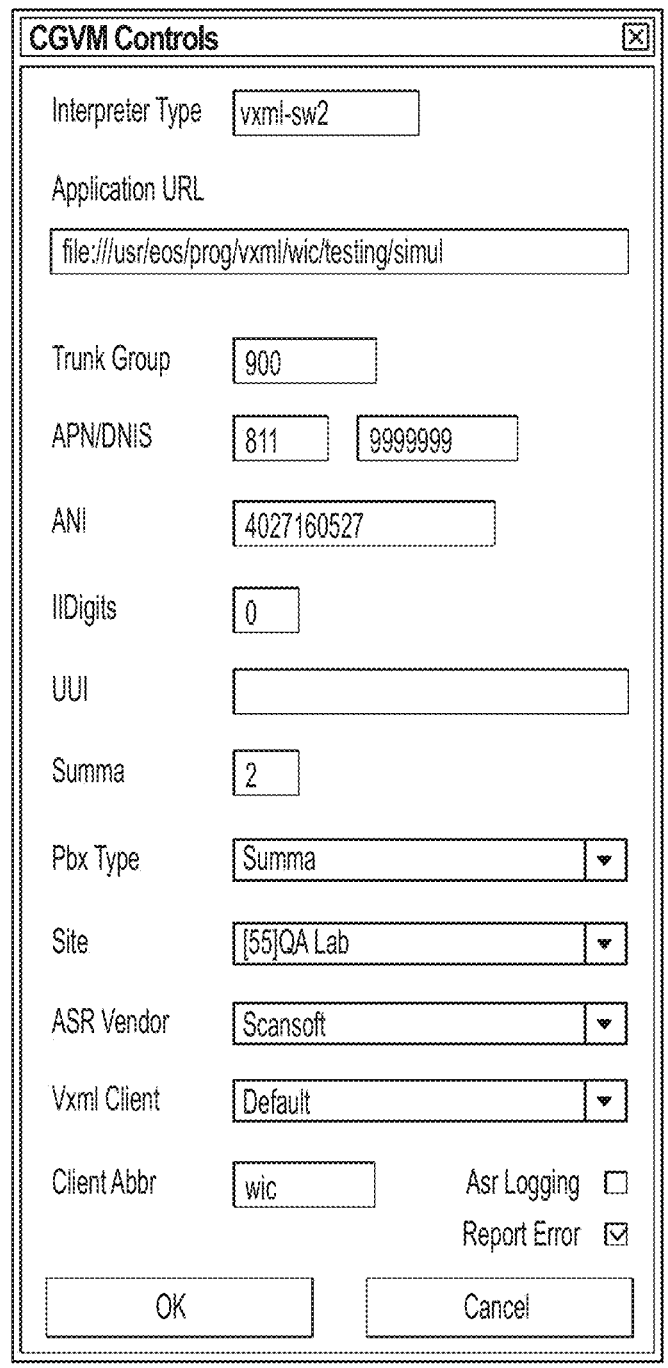
FIG. 16 is an illustration of the relational database tables.

The Call generator portion of the CGVM is responsible to set the appropriate parameter in the ring message. FIG. 15A is a snap shot of the CGVM dashboard with its controls. In the real VRU, the following are the three locations where the different k-v pairs in the ring message are set.

1. In the real ISDN line, the offered telecom ring event will have various parameters critical to the call identification.
2. TelecomIN will read additional k-v pairs from the VRU configuration files to identify the resources and available and their location.
3. Also, the redirector will fetch additional parameters from the DNISSTORE database and append it to the ring message before delivering to the browser.

In real VRU, the TelecomIN daemon and the redirector together will assemble all the k-v pairs required in the ring message before delivering the MTL message to the browser. This entire process need to be simulated accurately. Otherwise, the browser will not be able to process the call. CGVM Controls The controls specific to the CGVM are numbered in FIG. 15B and FIG. 16 (shown independently from FIGS. 15A and B), and the explanation for each of the items is as follows:

1. CGVM Controls: Title bar indicating that the window is for CGVM controls 1601.

2. Interpreter Type: Type of interpreter to send the ring message. This setting is reset by the application input set and gets changed when the dialer sends application 'prepare' message 1602.
3. Application URL: The application URL mapping for the given DNIS. In the real production platform, redirector gets this mapping from the dnisstore database 1603.
4. Trunk Group: Spoofed trunk group number. The CVSS can be used to generate load on any trunk group as long as the network firewall rules are met. This parameter will be helpful to generate load as if it is from the given VRU. The application servers are pooled based on the trunk group #. Hence this parameter setting becomes critical to redirect the call to the appropriate app server 1604.
5. APN (Prefix): Spoofed APN prefix 1605.
6. DNIS: Spoofed DNIS. This also helps to separate the real production calls from the simulated calls. Also, by spoofing the DNIS to a number which is not assigned to any client, the accounting will not be affected 1606.
7. ANI: Spoofed ANI. This can be set to any telephone number. Further this parameter can be changed per run, to separate the calls based on the ANI. Also, spoofing to an assigned pre-defined ANI, the simulated calls can be separated from the production calls 1607.
8. IIDigits: Spoofed IIDigits 1608.
9. UUI: Spoofed UUI data. This will be critical in verifying whether the browser can handle the UUI or not 1609.
10. Summa #: Summa number to use during the bridge transfer 1610.
11. Pbx Type: Pbx type for the bridge transfer 1611.
12. Site: The site number identifying the location of the trunk group that is being spoofed. This is critical since the ASR server resources are pooled together based on the site number. Generally this is tied to the trunk group number setting. However it is possible to change the site number independent of the trunk group number 1612.
13. ASR Vendor: ASR sever software vendor name. The MRCP based ASR servers are pooled, and the pool name had the vendor identifier 1613.
14. Vxml Client: Vxml client name to identify the MRCP based ASR server pool. The ASR servers are pooled based on the client's requirement 1614.
15. Client Abbreviation: Client abbreviation to add in the ring message. This field will be used by the voicelog service when it receives the ring message from the browser 1615.
16. ASR Logging: ASR logging flag to turn on the utterance capture 1616.
17. Report Error: When this flag is set, the browser will not generate error to the error log. If we are generating load on a production system, and if we knew that the system will generate error, and we do want to ignore them, then by blocking those error message going into the error log, we will be doing a favor to the Network Operation Center (NOC) 1617.
18. OK: Store the configuration settings and exit 1618.
19. Cancel: Exit without saving the changes 1619.

All the parameters set in this window will be used to modify the k-v pairs in the Ring event. Please note that some of these parameters are set using the application xml. Since 'prepare' message will be coming from Dialer before every unique test set, the changes to those variables will be lost.

The following are the list of parameters that can be configured externally.

FIG. 16

| Ref. | Parameter | Default | Details |
|---|---|---|---|
|  | version | 1.2 | Current version of the CGVM configuration |
|  | statRefreshInterval | 10 |  |
| 7 | ani | 4027160527 |  |
| 12 | site | 98 | Please refer the list of site numbers assigned by the corporate |
| 4 | trunkGroup | 900 |  |

Figure 17:
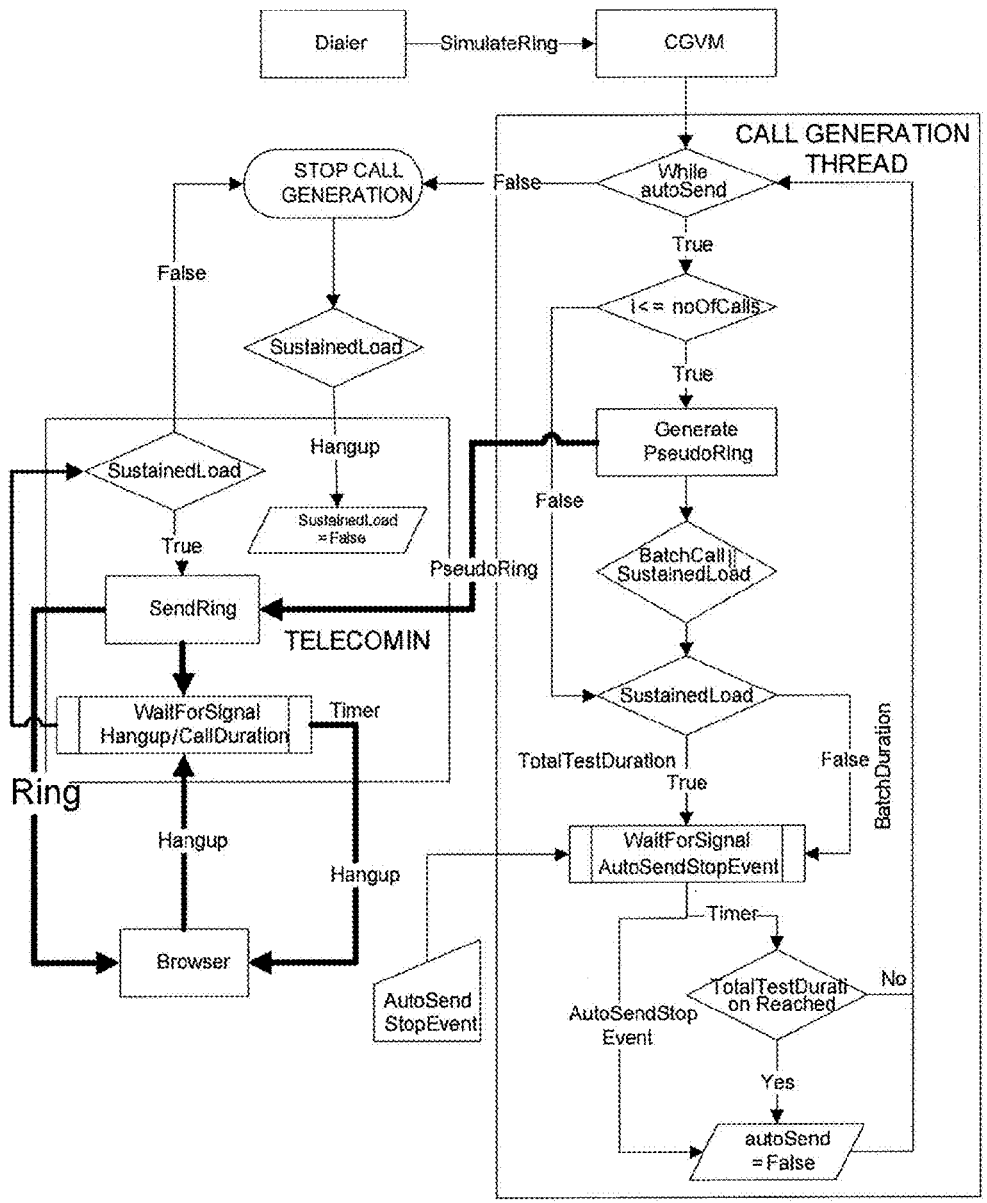
FIG. 17 is an illustration of typical Cgvm Calls DB Fields.

FIG. 17 illustrates the detailed flow chart in generating new call. Delivering the ring message to the browser marks the actual start of the call. The complexity of the ring generation comes due to the fact whether the load is sustained or driven by the CGVM. Again as mentioned in the dialer section, the call generation parameters such as number of available channels, call duration, calls per batch, inter call period, and batch repetition period are critical in generating the call volume.

This is the normal case where during each attempt to generate a ring, the pseudo ring request is generated from the CGVM and delivered to the appropriate channel in the TelecomIN. The channels in the TelecomIN are the once which has the current call status. For example, if the previous call has ended on the channel of current interest, then the send ring flag can be set which uses the telecom emulated hardware to generate the actual ring message to the browser. Subsequently when the dialer notifies the CGVM to stop the test, it can cease to send anymore ring request to TelecomIN thereby terminating the current test run.

In case of this sustained load scenario, only the first invocation starts from the CGVM to the TelecomIN. For the later ring generation the TelecomIN itself can take the control, depending on when the current call ends, and the call duration if the call takes a longer time to process. Subsequently when the dialer notifies the CGVM to stop the test, then this notification can be passed on to the TelecomIN which ceases further generation of the load from that point. This way the current test set run will terminate.

Figure 18:
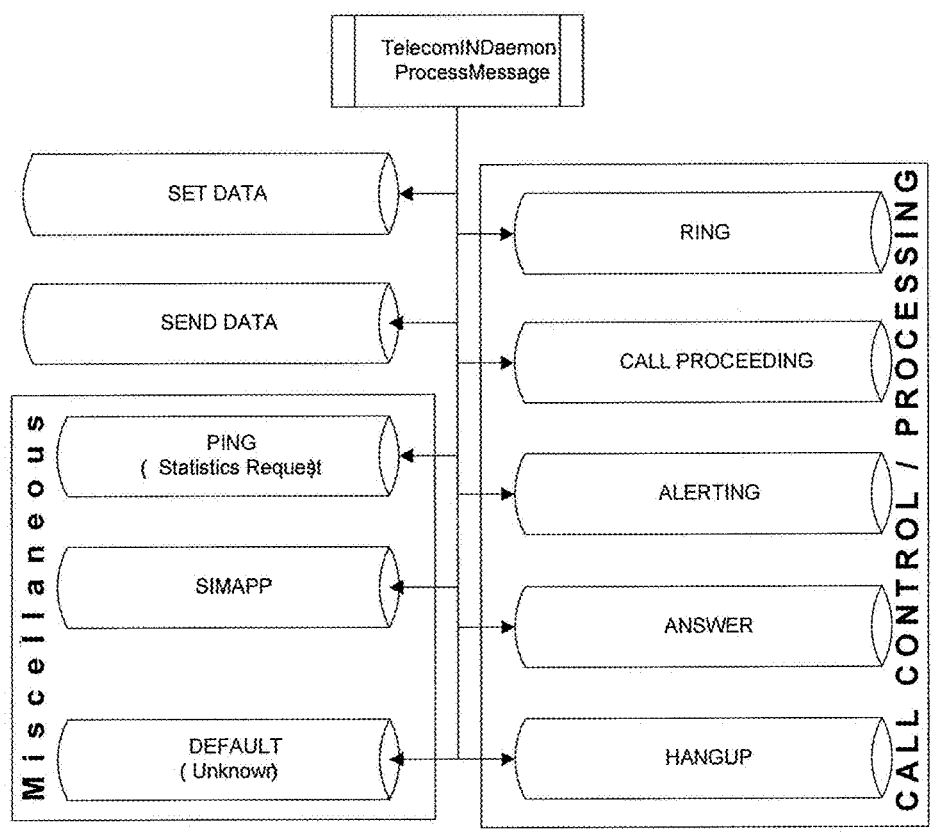
FIG. 18 is an illustration of typical Browser Call fields.

FIG. 18 lists the messages that need to be handled specific to its functionality. The rest of the messages however are handled with generic message handling mechanism as explained above.

Figure 19A:
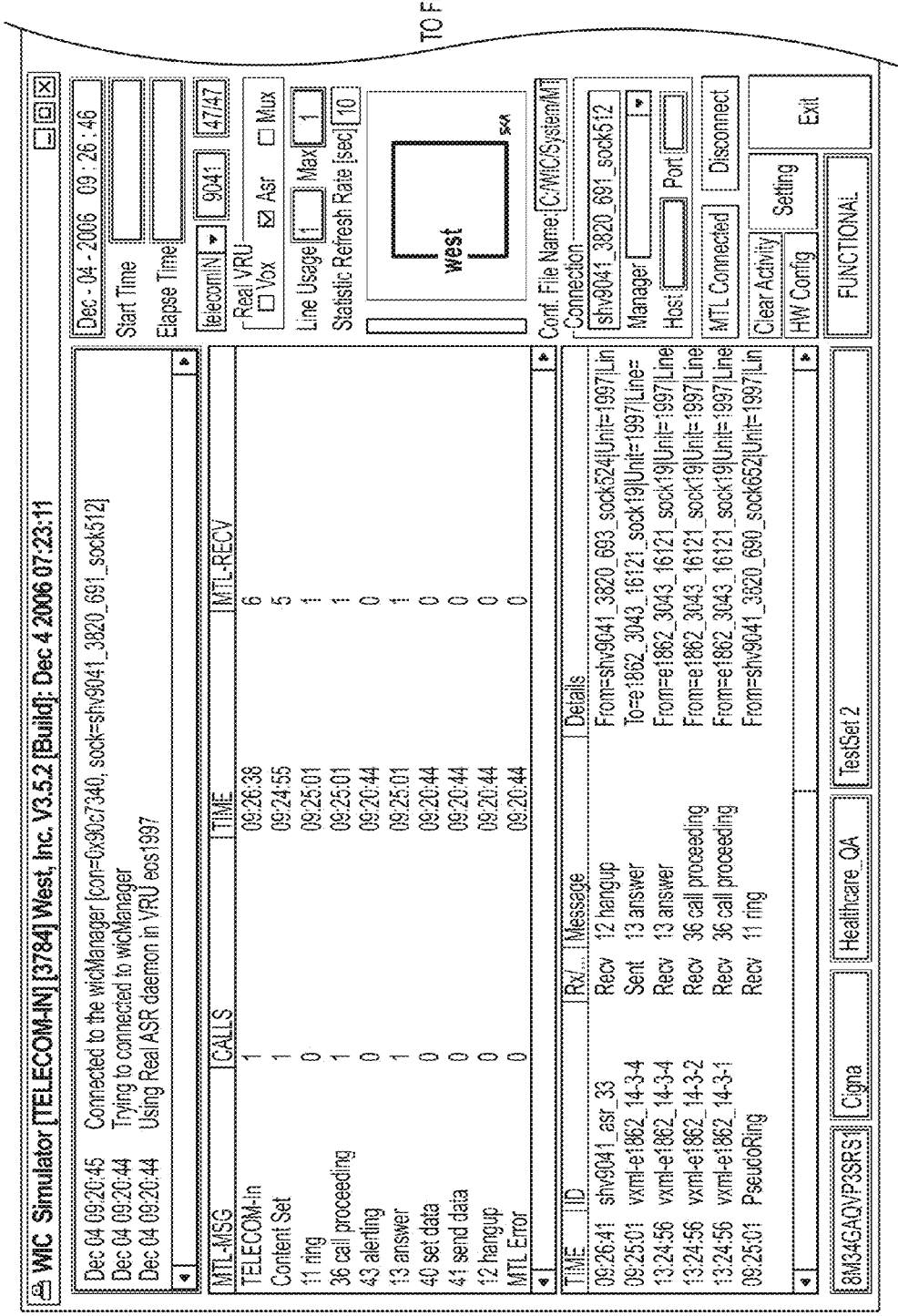
FIG. 19A is a illustration of typical EOS Event DB Fields.
Figure 19B:
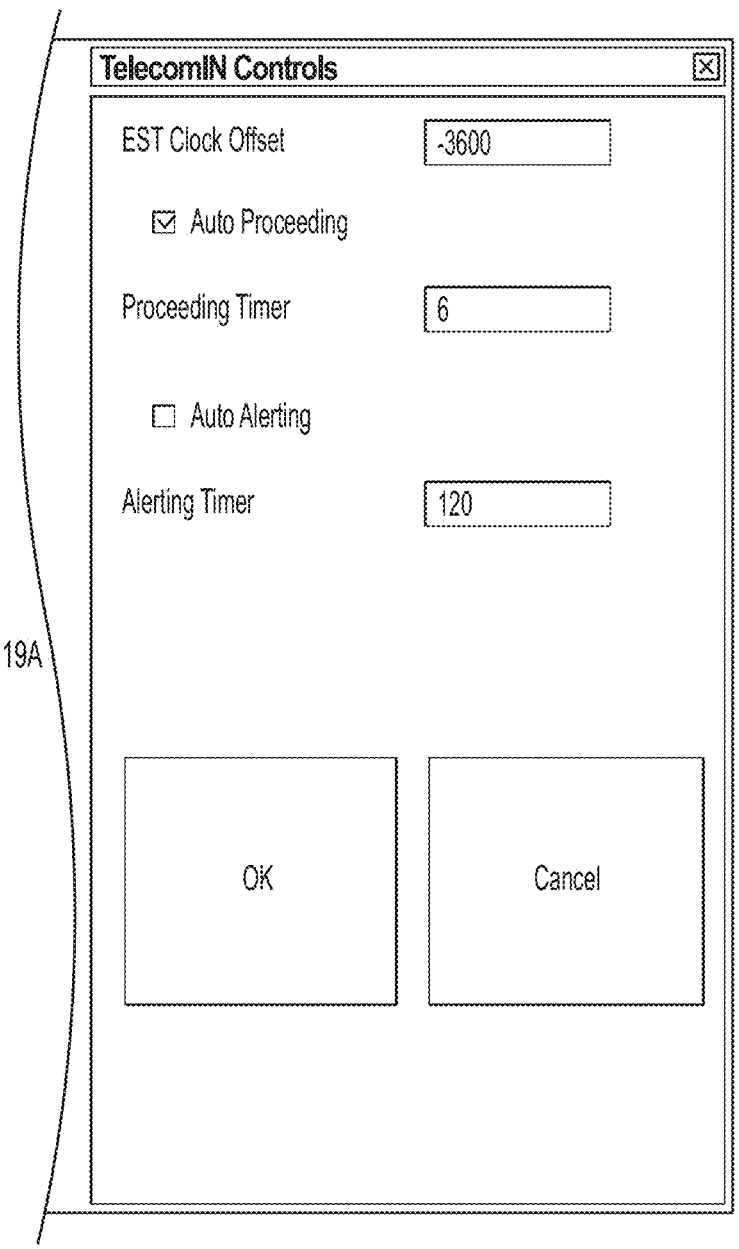
FIG. 19B is a illustration of a dashboard representing call generator and processing.

FIGS. 19A and B are a snap shot of the TelecomIN dashboard with its controls. As explained before in the CGVM and ring generation sections, TelecomIN is mainly responsible for call generation and processing. In case of sustained load, this can play the role of auto ring generator too. This does not alter the ring message's k-v pairs set by the CGVM, and instead acts as a middle agent to pass it to the browser. All the call control functionalities are implemented including the appropriate timing for the state machine.

The controls specific to the TelecomIN are numbered in FIG. 20, and the explanation for each of the items is as follows:
1. TelecomIN Controls: Title bar indicating that the window is for TelecomIN controls 2001.
2. EST Clock Offset: Time synchronization control parameter. When a real VRU is included for the testing, it is critical for the clock in the simulator unit be in sync with the real VRU clock. Since the simulator can be joined with any VRU including the one in the production system, this parameter adds flexibility 2002.
3. Auto Proceeding: When set to ON, the telecom emulated circuitry will send auto proceeding to the telecom network at the time it deliver the ring message. When turned OFF, hardware telecom will wait for the proceeding from the platform before notifying the proceeding message to the circuit (NOTE: Normally it is turned ON by default, which is the behavior of most of the platforms) 2003.

4. Proceeding Timer: The additional grace time added to the telecom line, before it expects either an answer or reject from platform. The platform will retain the ability to invoke an Alternate Destination Routing (ADR) till the end of this timer. If the platform has not answered before the end of the timer, the telecom circuit will pull back the call 2004.

5. Auto Alerting: When set to ON, the telecom emulated circuitry will send auto alerting (which overrides the auto proceeding) to the telecom network at the time it delivers the ring message. When turned OFF, hardware telecom will wait for the answer or alerting from the platform and when it receives alerting before answer it will notify the alerting message to the circuit. The critical point that has to be noted regarding alerting is that when one the circuit is notified of alerting, it looses the ability to ADR the call. Hence, the platform has only option either to answer or hangup the call. (NOTE: Normally it is turned OFF by default, which is the behavior of most of the platforms) 2005.

6. Alerting Timer: The additional grace time added to the telecom line, before it expects either an answer or reject from platform 2006.

7. OK: Store the configuration settings and exit 2007.

8. Cancel: Exit without saving the changes 2008.

The following are the list of parameters that can be configured externally.

Figure 20:
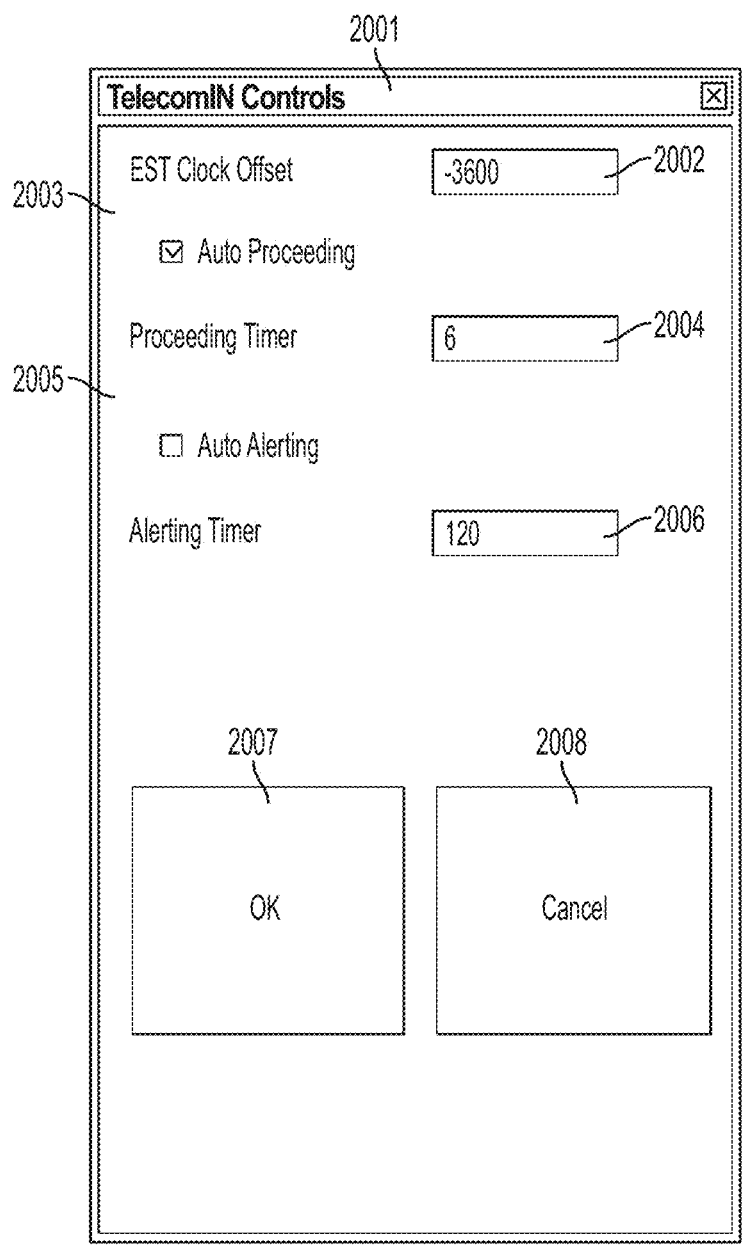
FIG. 20 is an illustration of Call Statistics DB Fields.

| FIG. 20 Ref. | Parameter | Default | Details |
|---|---|---|---|
| | version | 1.2 | Current version of the TelecomIN configuration |
| | statRefreshInterval | 10 | |
| | clockOffsetRegion | 0 | |
| | clockOffsetEST | 0 | |
| | autoProceeding | true | |
| | proceedingTimer | 10 | |
| | autoAlerting | false | |
| | alertingTimer | 120 | |
| | hangupPrevious | 1 | |
| | callTime | -1 | |

Figure 21:
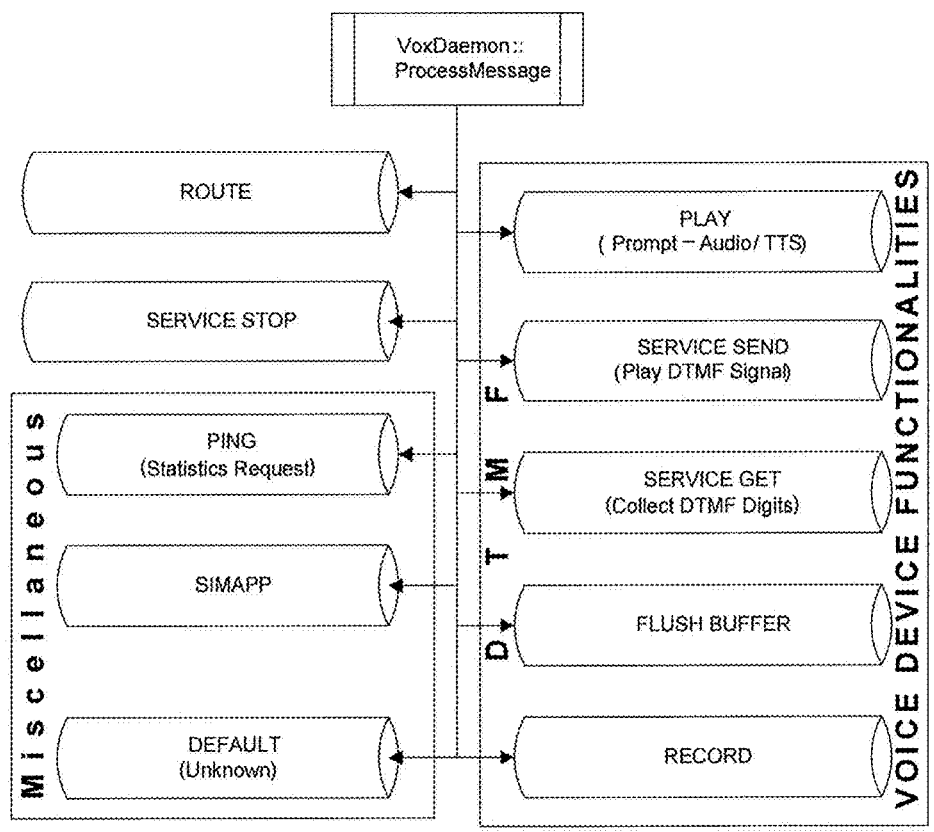
FIGS. 21-24 is an illustration of the simulated and Help View

FIG. 21 lists the messages that need to be handled specific to its functionality. The rest of the messages however are handled with generic message handling mechanism as explained above.

Figure 22A:
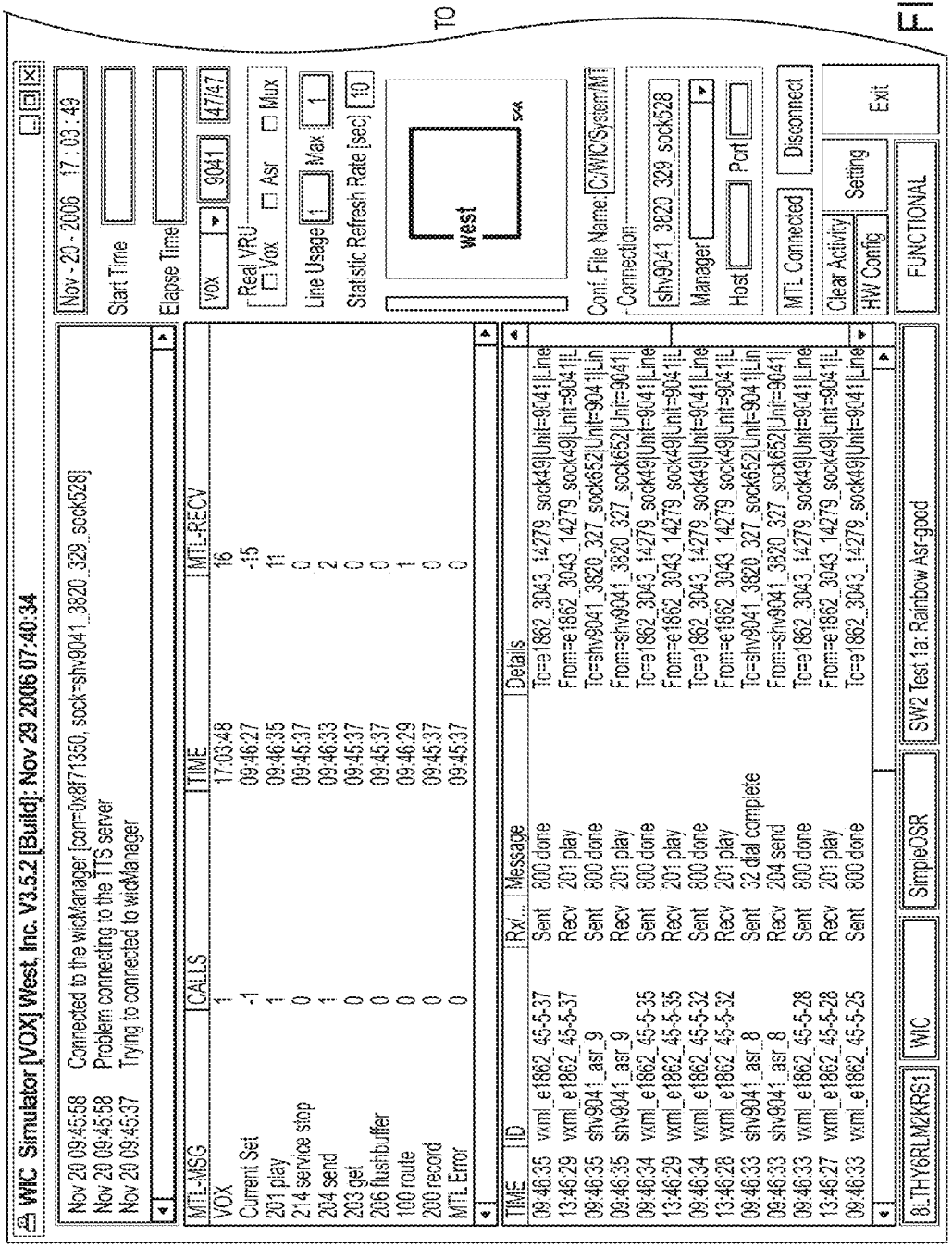

FIG. 22A is a snap shot of the VOX dashboard with its controls. There is no parameter that needs to be controlled in the prompt play within the call flow. All the variations in the value can be programmed in the app input set which drives this daemon.

Figure 22B:
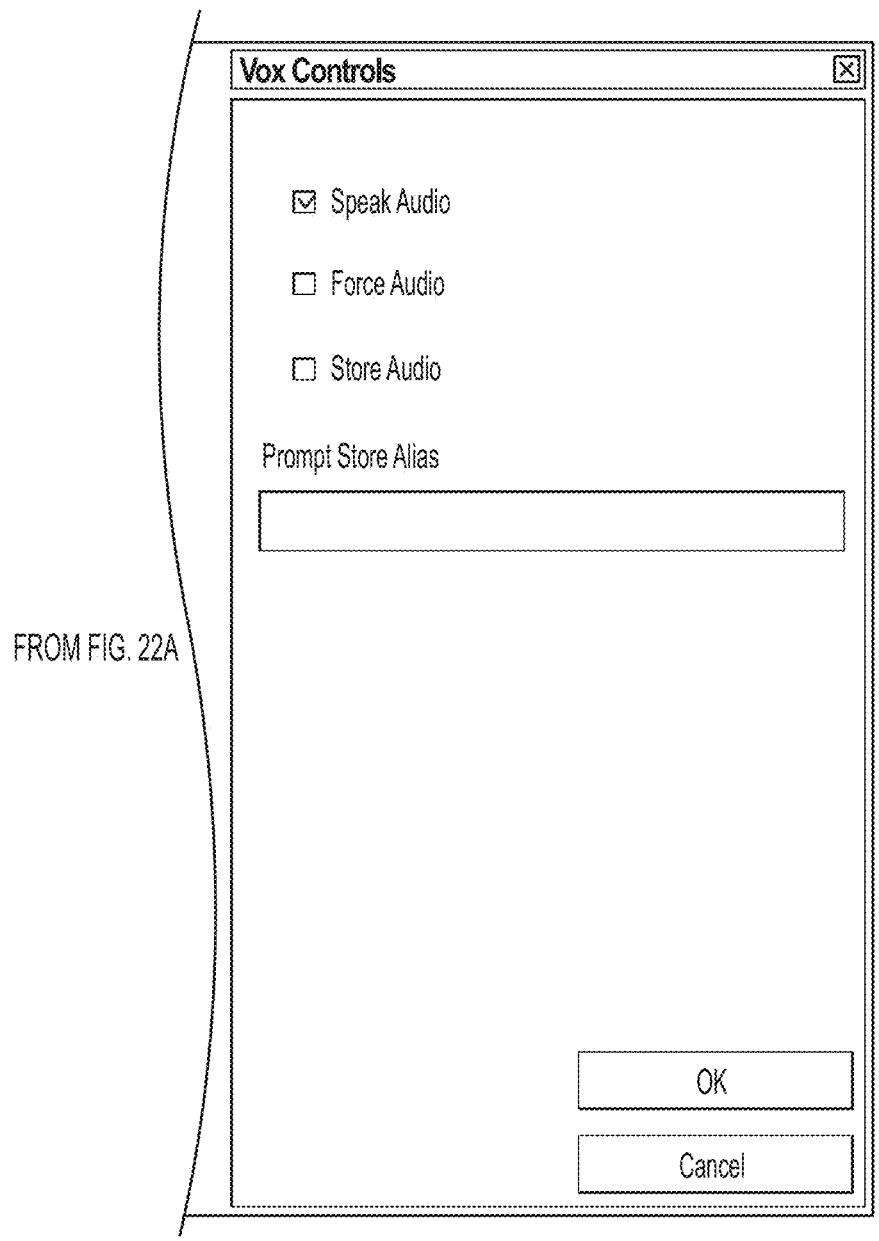

The controls specific to the VOX are numbered in the FIG. 22B and FIG. 23 (shown independently from FIGS. 22A and B), and the explanation for each of the items is as follows:

1. VOX Controls: Title bar indicating that the window is for VOX controls 2301.
2. Speak Audio: Enable the speak features of the CVSS system. NOTE: If the prompt has TTS in it, then the presence of TTS resource will determine whether the audio can be played or not 2302.
3. Force Audio: If the application input set has the realspeak flag turned OFF, and then this flag could override it. An attempt will be made to play all the possible voice slots and utterances 2303.
4. Store Audio: When an audio file is fetched, and if it is in mulaw encoded format, it will be converted to way file format. If this flag is turned on then the intermediate way file will be saved to the local cache directory (NOTE: The reason to do this is to later save it to a separate directory and replay the way file for the particular voice slot for debugging purposes) 2304.
5. Prompt Store Alias: Since the simulator can be adapted to any site (either production, or lab, etc.), use the appropriate web server to fetch the audio files 2305.
6. OK: Store the configuration settings and exit 2306.
7. Cancel: Exit without saving the changes 2307.

Please note that this VOX daemon is mainly for a single call scenario to listen to the call flow. When the load is identified as a multiple call scenario from the UTSID, then immediately the voice/speech features are turned off and the appropriate emulation for the prompt play can be executed instead, resulting in silence and the call will proceed.

The following are the list of parameters that can be configured externally.

Figure 23:
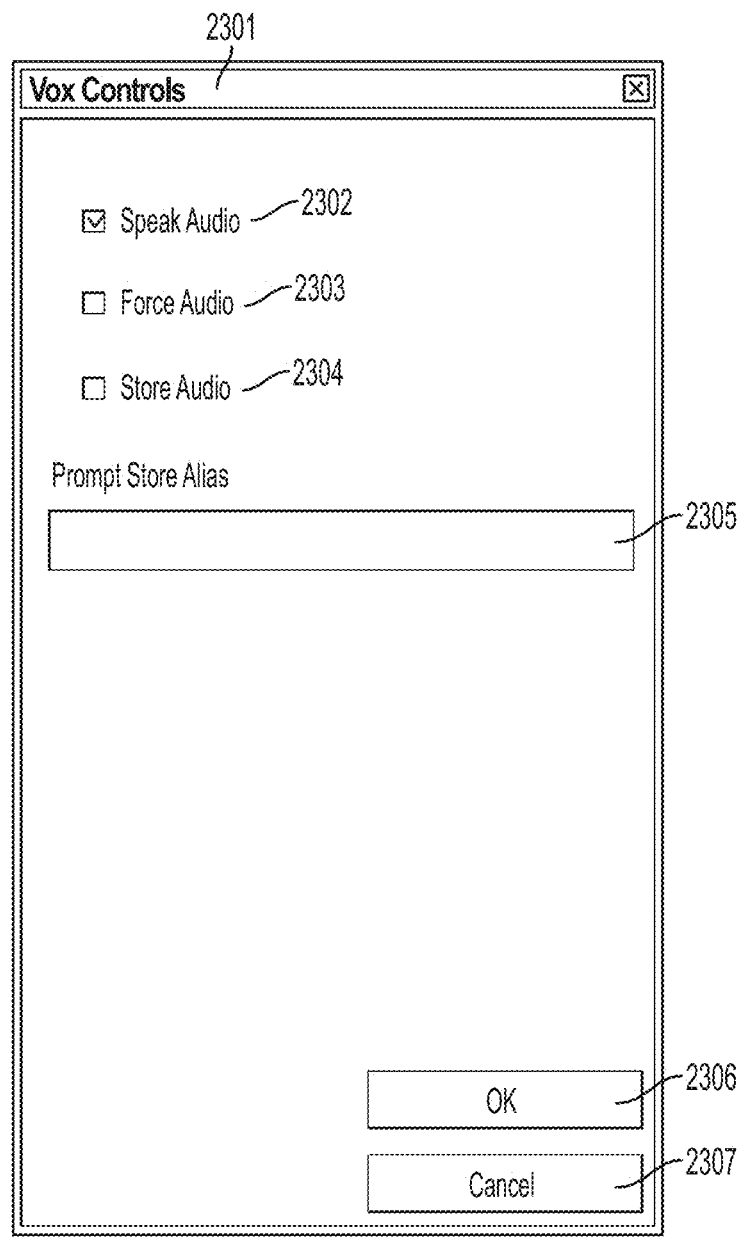

| FIG. 23 Ref. | Parameter | Default | Details |
|---|---|---|---|
| | version | 1.1 | Current version of the VOX configuration |
| | statRefreshInterval | 10 | |
| 2 | speakAudio | true | |
| 3 | forceAudio | false | |
| 4 | storeAudio | false | |

There are multi levels of controls that will determine whether a prompt is played or not.

The following are the decision factors

Whether the test set is for single or multiple calls

XML application script for the business flow

SpeakAudio configuration parameter

ForceAudio configuration parameter

Availability of the TTS engine

Figure 24:
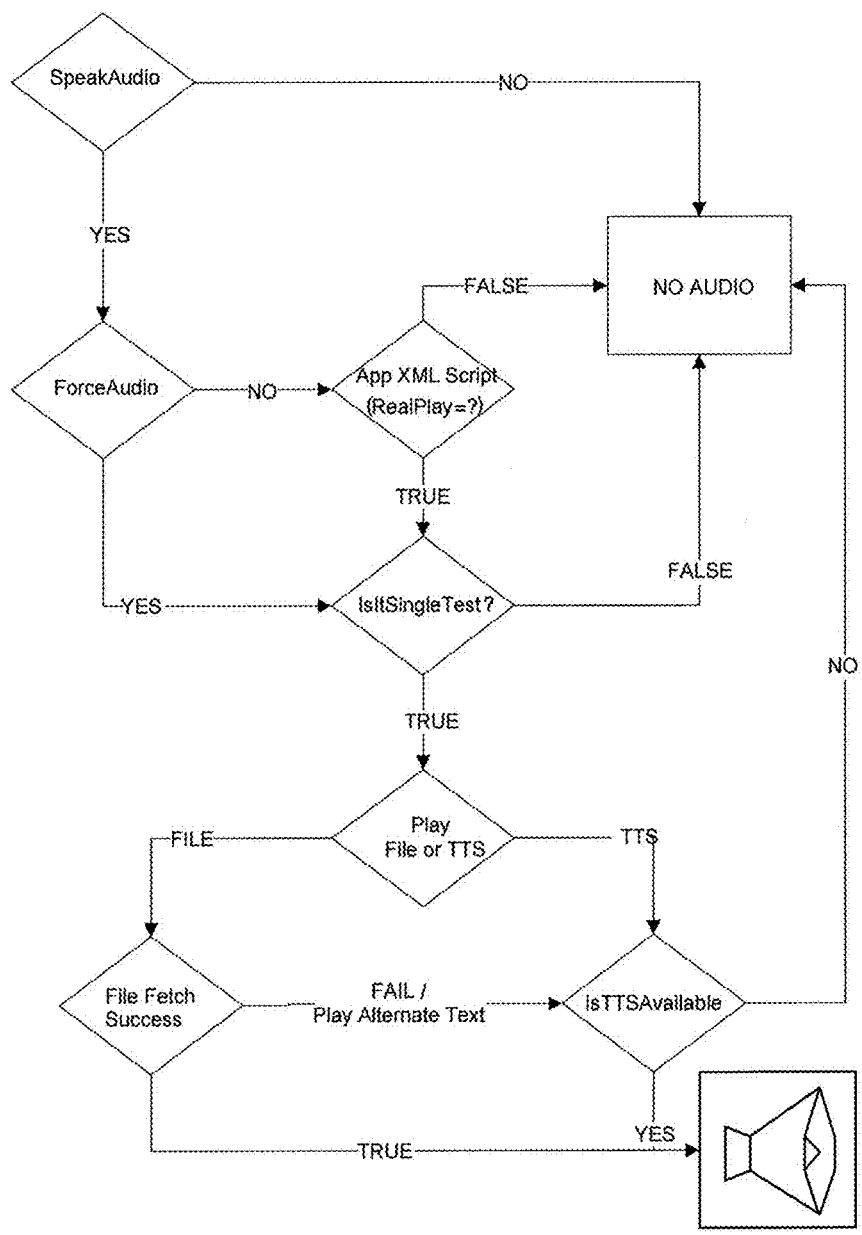

Refer to FIG. 24 for the hierarchical tree of precedence on which parameter decide real speech output. In addition to this decision tree, the following resources should be available to fulfill the prompt plays without any error.

COM device availability

TTS server resource

URL access privilege (firewall rules)

Enough space in the local cache directory for way file conversion (/wic/cache/VOX)

Figure 25:
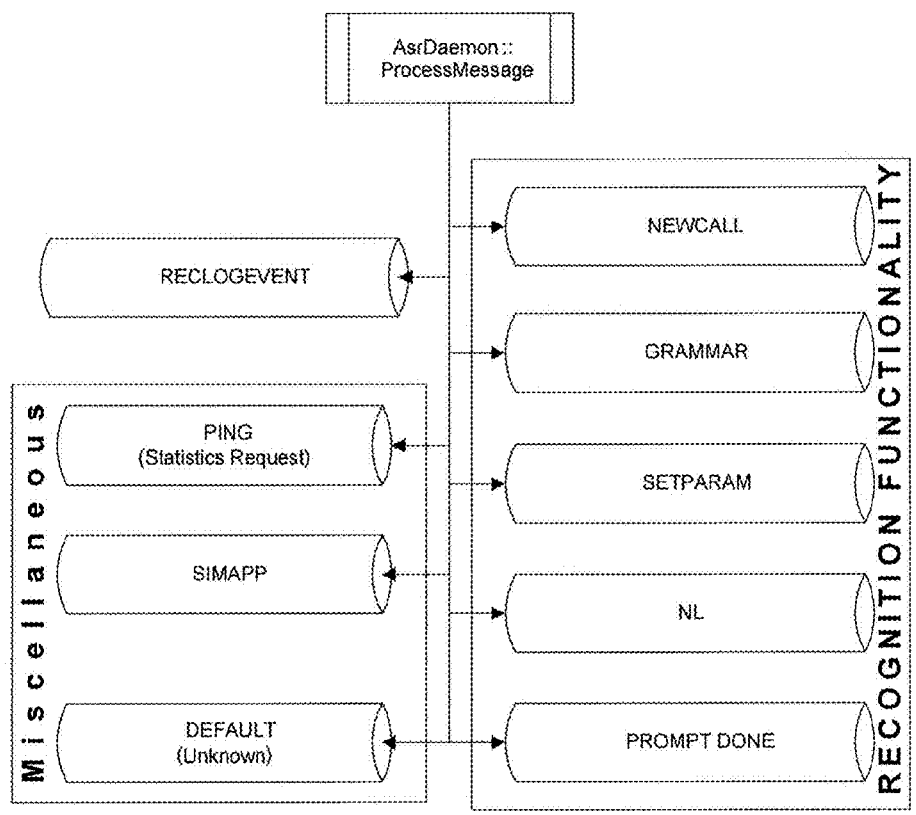
FIG. 25 lists the messages that can be handled specific to its functionality.

FIG. 25 lists the messages that can be handled specific to its functionality. The rest of the messages, however, can be handled with generic message handling mechanism as explained above.

Figure 26A:
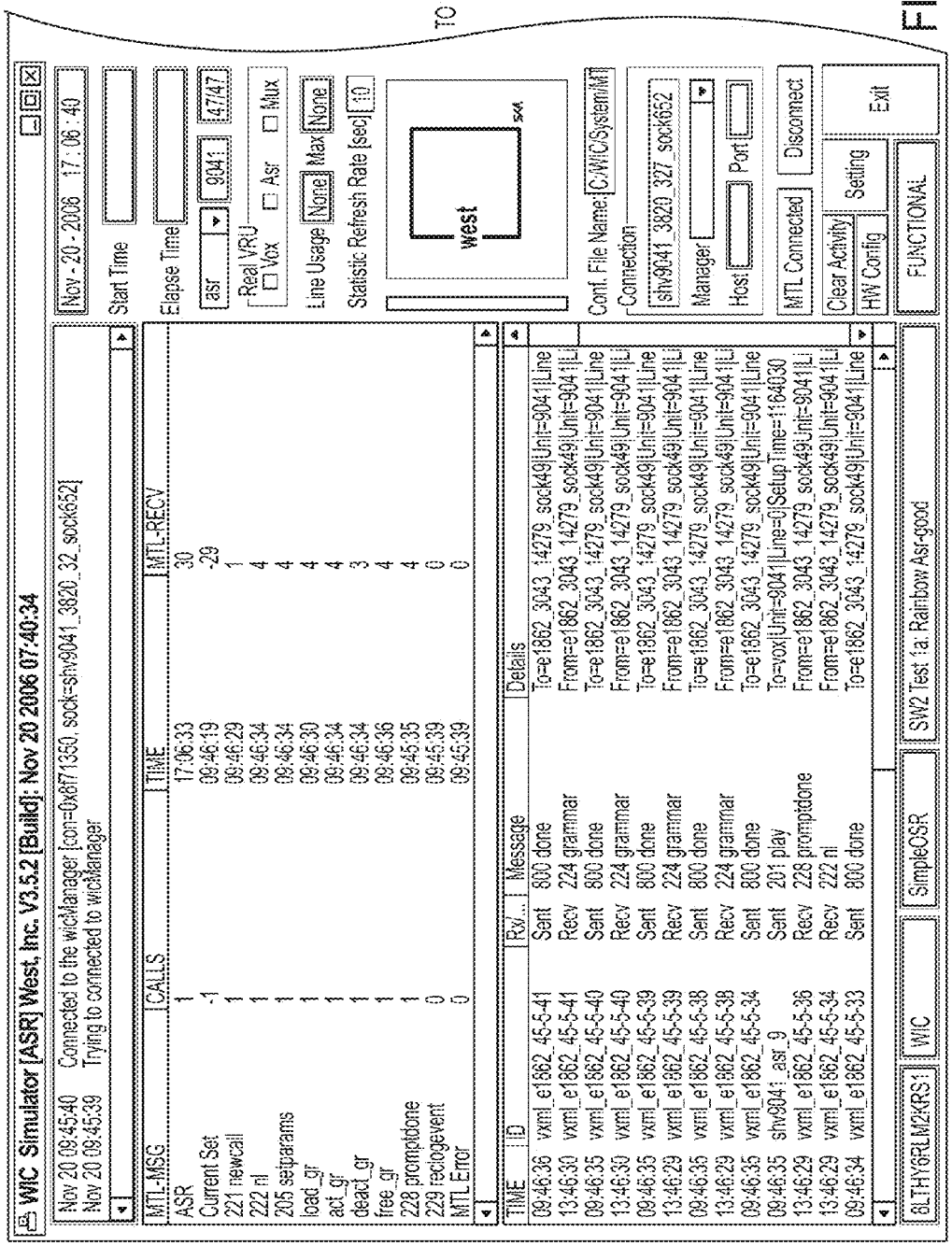
FIGS. 26A and B are a snap shot of the ASR dashboard with its controls.
Figure 26B:
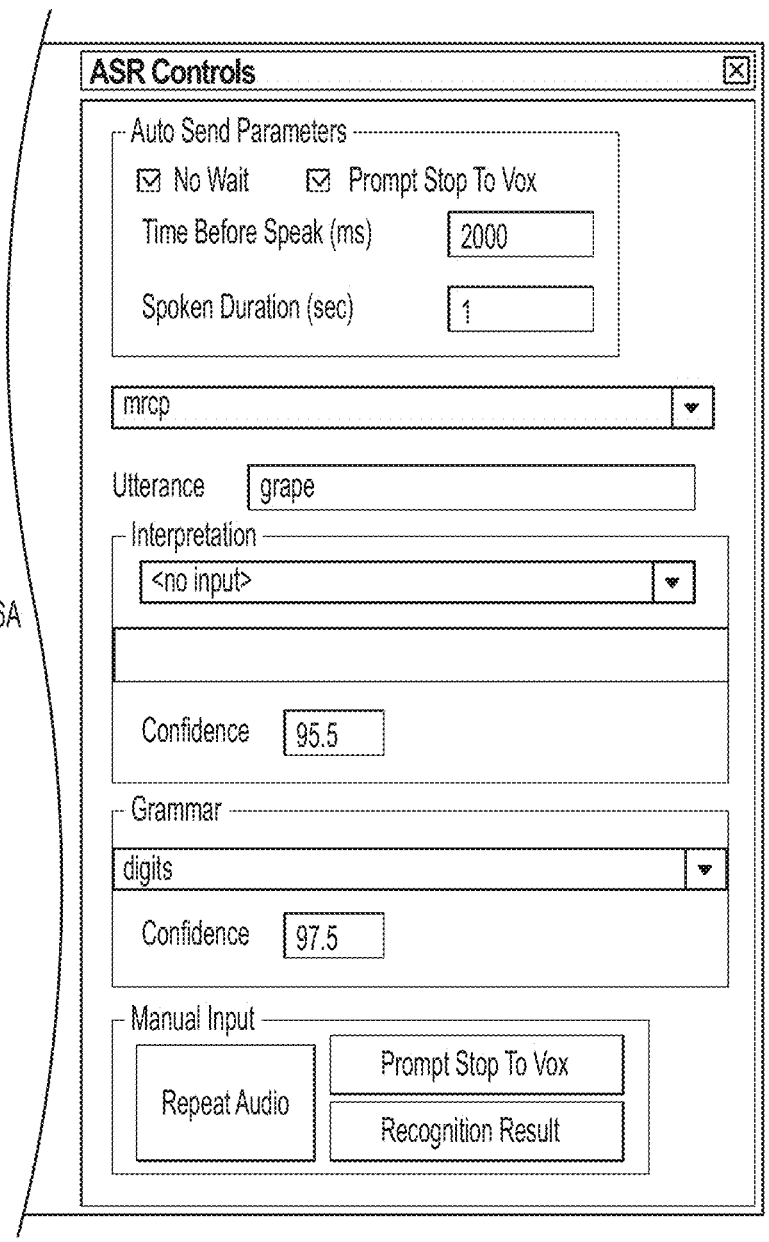

FIG. 26A is a snap shot of the ASR dashboard with its controls. The controls specific to the ASR are numbered in FIG. 26B and FIG. 27 (shown independently from FIGS. 26A and B), and the explanation for each of the items is as follows:

1. ASR Controls: Title bar indicating that the window is for ASR controls 2701.
2. No Wait: Auto send NL response. The user wait will not be invoked. If this flag is turned OFF, then each recognition response will invoke the GUI, inspire of data being one of non user wait category 2702.
3. Prompt Stop To Vox: Send service stop to VOX, which is an indication of user barge in 2703.
4. Time Before Speak: If the user will barge in with the response, how many milliseconds after the start of prompt play will the utterance start 2704.
5. Spoken Duration: how long the utterance is played. In a completely automated simulated environment, this parameter will simulate the utterance actual play time 2705.

6. ASR Server Type: The ASR server version. In a completely simulated environment the ASRRESULT1 will be converted to nlsml result based on this type. In case of ASRRESULT2, already the nlsml result is captured in the xml script. In case of ASRRESULT0, an ASR daemon in the real VRU is used 2706.
7. Utterance: Utterance string. This will be used to build the nlsml result 2707.
8. Interpretation: interpretation result type 2708.
9. Result Key-Value Pair: additional k-v pairs that will be added to the nlsml result 2709.
10. Interpretation Confidence Score: current recognition results confidence score 2710.
11. Grammar Name: The current active grammars will be listed. Choose one appropriate for the interpretation (example, when returning a DTMF result, choose the appropriate DTMF grammar instead of the speech grammar 2711.
12. Grammar Confidence Score: selected grammar's confidence score 2712.
13. Repeat Audio: button press to repeat playing the utterance 2713.
14. Prompt Stop To Vox: button press to send service stop to the VOX daemon 2714.
15. Recognition Result: Send the recognition result as fed in the current GUI 2715.

Please note that most of the controls in this window belong to manual wait recognition result. For the rest of the results, the program will follow the utterance or logic provided by the application input set. Overall usage of this GUI is complicated. Given the situation in the call flow, the user should know the internal details of what result should be the returned. Typically, an application developer is the one who would use this feature, since he or she knows the names of the grammars used and the interpretation result. It is easy to give wrong data that would result in crashing the browser. Overall the user is cautioned of the usage of this feature. Other restrictions include:

More than one N-best result is not possible

The browser waits on a timer which will be started after the end of the promptdone ASR Configuration Parameters The following are the list of parameters that can be configured externally.

Figure 27:
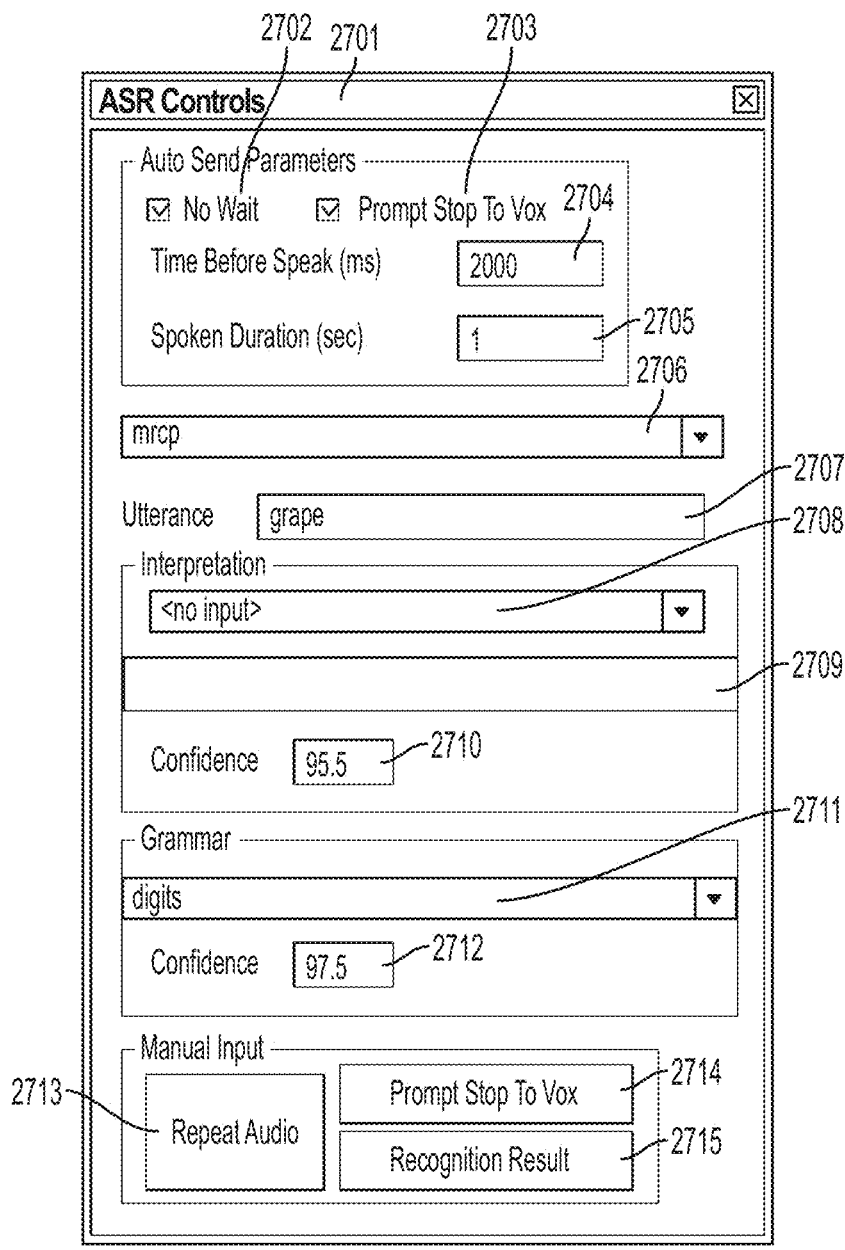
FIG. 27 the controls specific to the ASR are numbered.

| FIG. 27 Ref. | Parameter | Default | Details |
| --- | --- | --- | --- |
| | version | 1.2 | Current version of the VOX configuration |
| | statRefreshInterval | 10 | |
| | timeslotReroute | 500 | |
| 2 | autoNlSend | true | By setting this, the user dialog wait will not be invoked. Instead these default values will be automatically sent back |
| 4 | startRec | 2000 | Time before start speaking the utterance |
| 3 | bargedIn | true | The utterance was barged in during the prompt play |
| 5 | timeSpoke | 1000 | Utterance length in time |
| 7 | utterance | grape | Utterance string |
| 7 | textMode | voice | Utterance input mode text/DTMF |
| | asrNlsmlResult | 1 | Single/multiple NBest with/without slot |
| 8 | bestResult | grape | Interpretation |
| FIG. 27 Ref. | Parameter | Default | Details |
| 10 | recConfidence | 95.5 | Confidence score on the interpreted string |
| 11 | grammarName | ilg | Matched grammar |
| 12 | grammarConfidence | 97.5 | Confidence score for the matched grammar |
| 9 | slotValueConf | | Additional slot, value, confidence k-v pairs |

Figure 28:
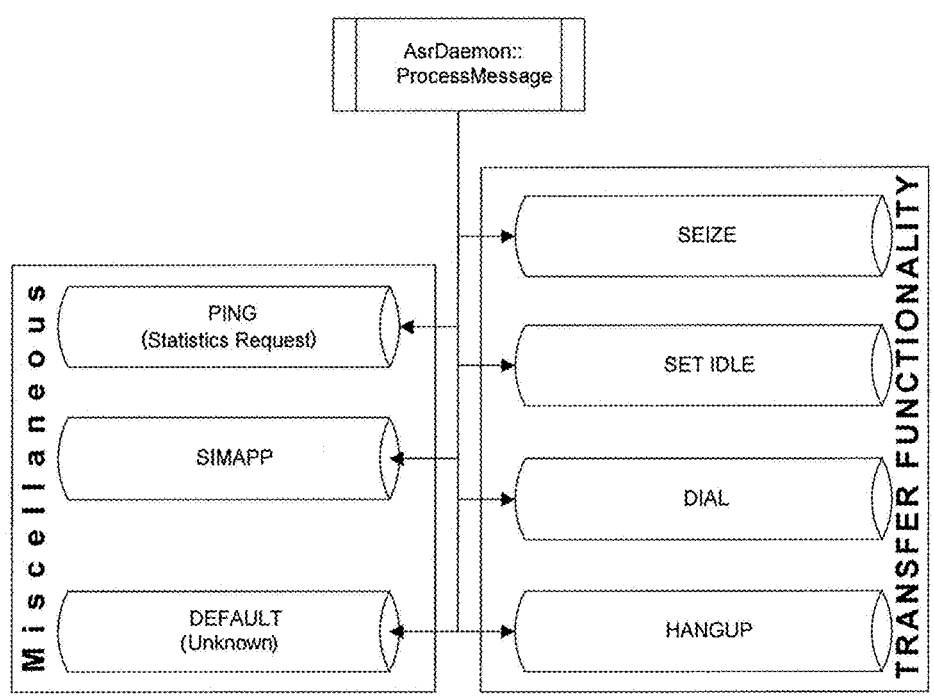
FIG. 28 lists the messages that need to be handled specific to its functionality.

B-Side Telecom (TelecomOut) TelecomOUT Messaging Design: FIG. 28 lists the messages that need to be handled specific to its functionality. The rest of the messages however are handled with generic message handling mechanism as explained above.

Figure 29A:
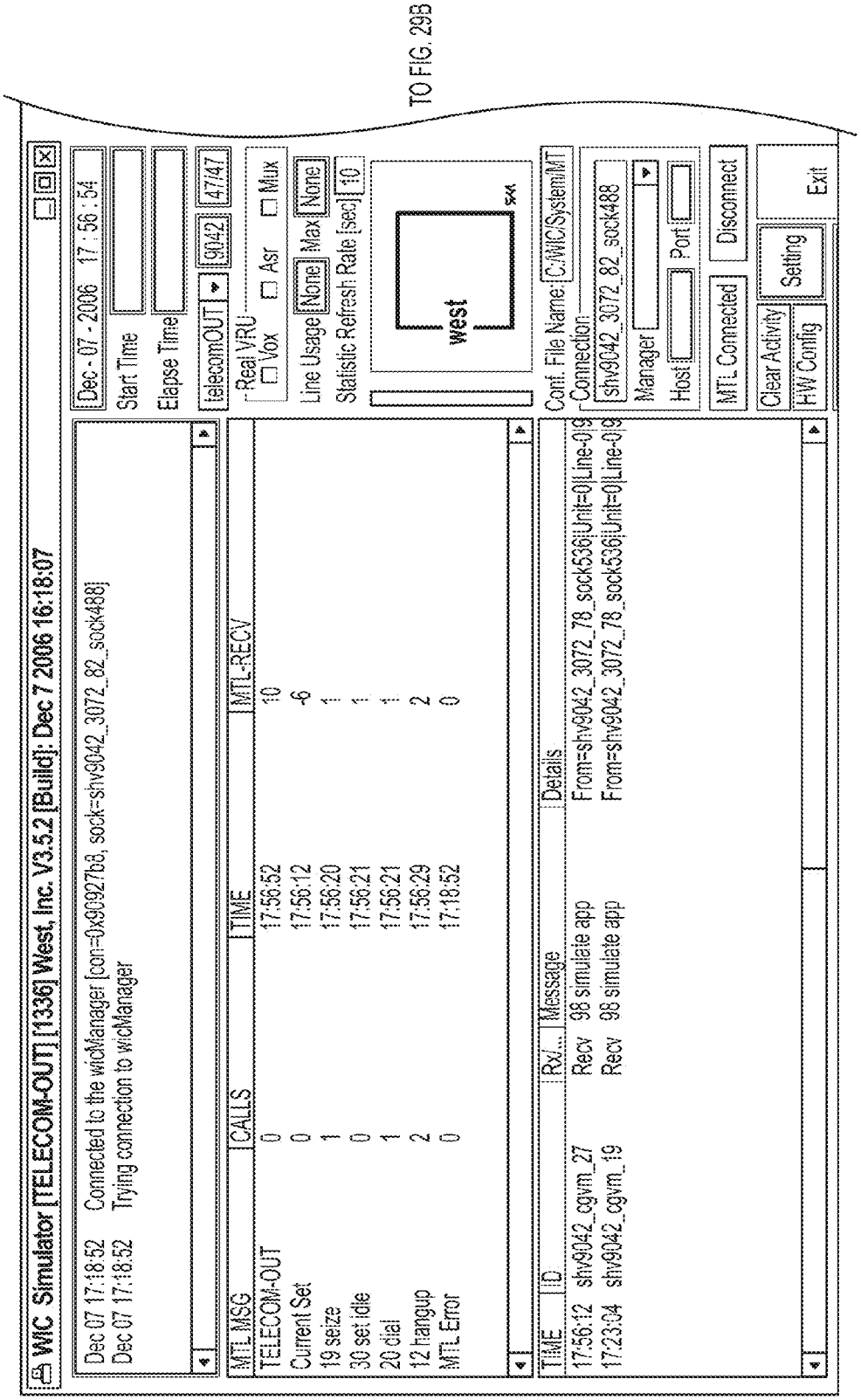
FIGS. 29A and B are a snap shot of the TelecomOUT dashboard with its controls.

TelecomOUT Dashboard: FIG. 29A is a snap shot of the TelecomOUT dashboard with its controls.

Figure 29B:
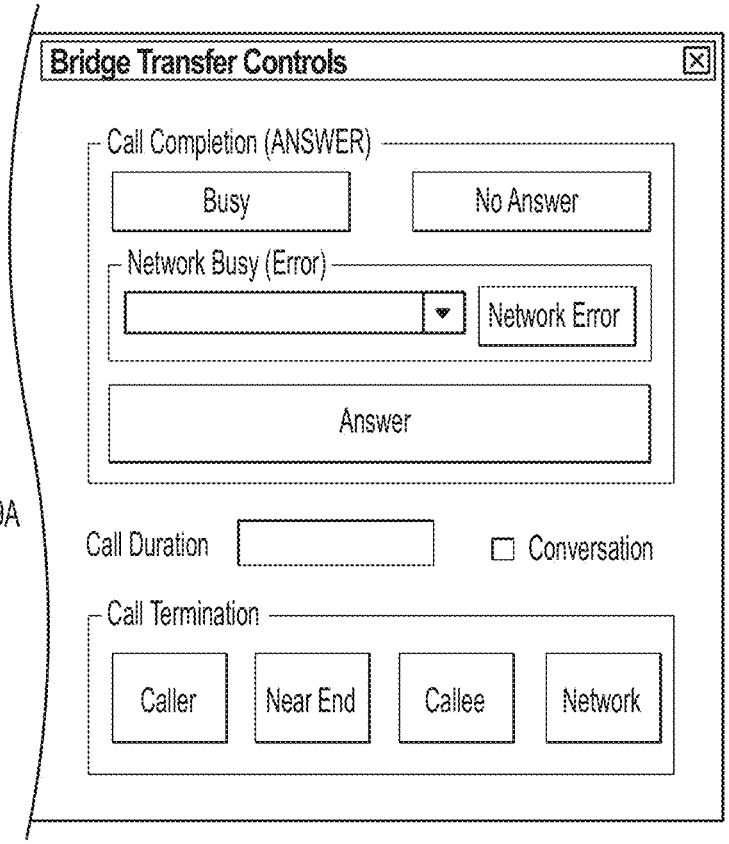

TelecomOUT Controls: The controls specific to the TelecomOUT are numbered in the FIG. 29B and FIG. 30 (shown independently from FIGS. 29A and B), and the explanation for each of the items is as follows:

1. TelecomOUT Controls: Title bar indicating that the window is for TelecomOUT controls 3001.
2. Call Completion—Busy: button press that throws a return code equivalent to the telecom busy 3002.
3. Call Completion—NoAnswer: button press that throws a return code equivalent to the telecom party not answering 3003.
4. Network Busy Error Code: network error enumeration that would accompany network error exception 3004.
5. Call Completion—Network Error: button press that throws a return code equivalent to the telecom network error 3005.
6. Call Completion—Answer: button press that throws a return code equivalent to the telecom good answered call 3006.
7. Call Duration: In a good answered call, this parameter is the spoofed equivalent to the duration of the call 3007.
8. Conversation: Enabling this flag will simulate a prerecorded conversation (just to make the bridge realistic) 3008.
9. Call Termination—Caller: button press that throws a call termination code equivalent to the caller hangup 3009.
10. Call Termination—Near end: button press that throws a call termination code equivalent to the B-side near end 3010.
11. Call Termination—Callee: button press that throws a call termination code equivalent to the called party hangup 3011.
12. Call Termination—Network: button press that throws a call termination code equivalent to the network initiated hangup 3012.

Please note that most of the controls in this window belong to manual wait on transfer functionality.

TelecomOUT Configuration Parameters: The following are the list of parameters that can be configured externally.

Figure 30:
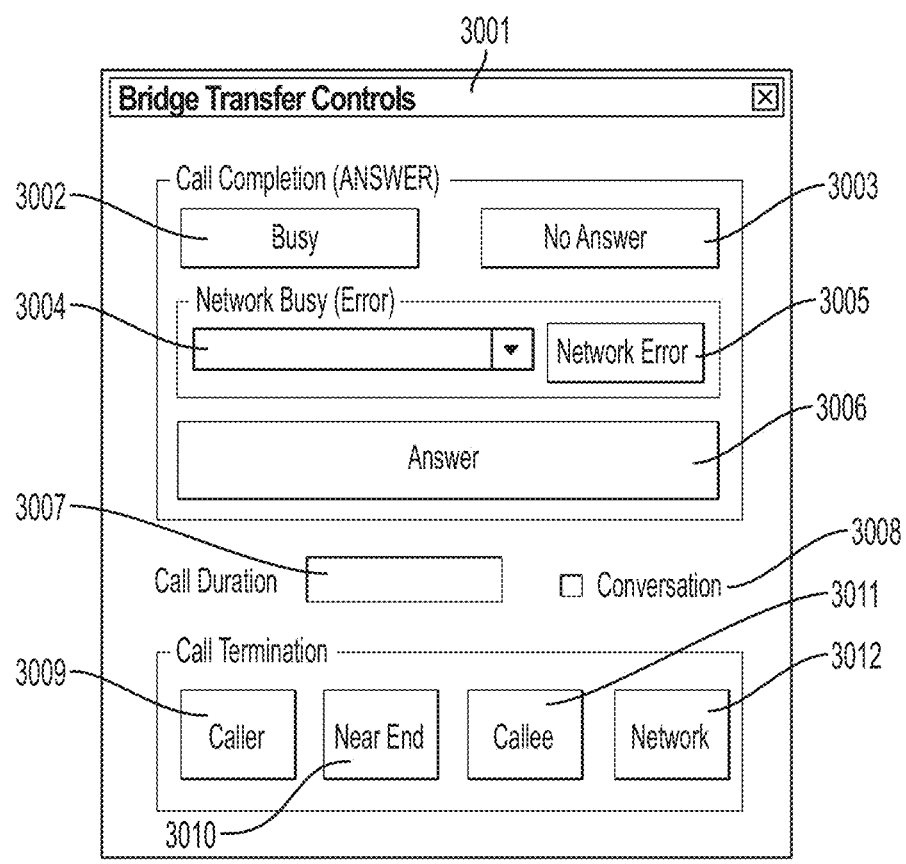
FIG. 30 the controls specific to the TelecomOUT are numbered.

| FIG. 30 Ref. | Parameter | Default | Details |
| --- | --- | --- | --- |
| | Version | 1.1 | Current version of the TelecomOUT configuration |
| | statRefreshInterval | 10 | |
| | hangup- | 1 | On the B-side, force a hangup for the |

FIG. 30

| Ref. | Parameter | Default | Details |
|------|-----------|---------|---------|
|      | Previous  |         | previous call (may be redundant, if in case the previous call ended with a B-side hangup) |

The Manager function is an important part of the whole system. Hence, it can be started before starting the simulator(s). All the components of the VRU can be started to have a complete system. The order in which each daemon is started does not matter. However, one order is as follows:
1. All of the VRU specific daemons (TelecomIN/VOX/ASR/TelecomOUT). In no any particular order.
2. CGVM
3. Dialer Each daemon can be a separate instance of the simulator program. To start the simulator, from the 'daemon list' drop down menu, choose the daemon to be initiated and press the 'MTL-Connect' button. The activity log can display the entries for connecting the manager function. In case of failure, a repeated retry message can be displayed every 1-second. If everything goes ok, you would see the "MTL progress indicator" pulsate, connect message on the activity window, and the appropriate socket name displayed.

To start another instance of the simulator, the same procedure as above can be followed. For the sake of explaining this operating instruction, assume by way of example that the dialer is running on the same PC as the CGVM and the dialer unit number is =900. Once all the daemons are started, the Dialer can be selected by the operator 'settings' such that the operator would notice the presence of your CVGM.

With regard to hardware simulation, the following hardware units are the ones that can be either simulated or the actual operation performed.
TelecomIN
  Telecom Ring
  Courtesy Transfer
VOX
  Play
ASR
  Grammar operations
  Recognition
TelecomOUT
  Bridge Transfer With regard to Telecom Ring Simulation, basically by building appropriate "11 Ring" MTL Message in CGVM and sending to TelecomIN, the simulator can effectively have simulated a telecom ring event.

With regard to VOX Play Simulation, an actual prompt can actually be generated and played or simply provide a simulation signal to prompt the simulated voice response. With regard to ASR Server Simulation, the ASR server is a key part of the recognition. Instead of sending the request to the ASR server, the present invention can simulate its functionalities in the ASR daemon itself. With regard to Grammar Simulation, the actual operation can be performed in the case of a simulated voice response. With regard to Recognition Simulation, the actual operation can also be performed.

With regard to TelecomOUT Bridge Transfer Simulation, by holding (not sending immediately) the B-side hangup, the system can essentially simulate the bridge transfer. When the operator wants to terminate the bridge, the operator can throw a A-side hangup from the dialer or B-side hangup from the popup (raised after receiving the '29 dial' MTL message) in the TelecomOUT daemon.

With regard to Application Design, as indicated above the actual application server can be utilized as an interface to the simulator. The features of the application server can vary as also indicated above.

The simulator can be used in at least the following four different areas:
1. Systems Development
2. Application Development
3. Platform Certification
4. Client Application Testing In the Systems Development areas, the following three are the major places where the simulator can be used.
1. Browser/Interpreter Development:
2. Application Server Custom Objects
3. VRU's VOX and ASR daemon.

With regard to Browser/Interpreter Development, the simulator can be utilized as a front end call load generator, which provides various voice inputs to test the various capabilities of the Interpreter. The same can apply with regard to Application Server Custom Objects Development. The Interpreter and Application development can be performed simultaneously utilizing the simulator. Also, with regard to VRU, VOX and ASR development, each of these module functions can be tested together or separately in a simulated environment.

Figure 31:
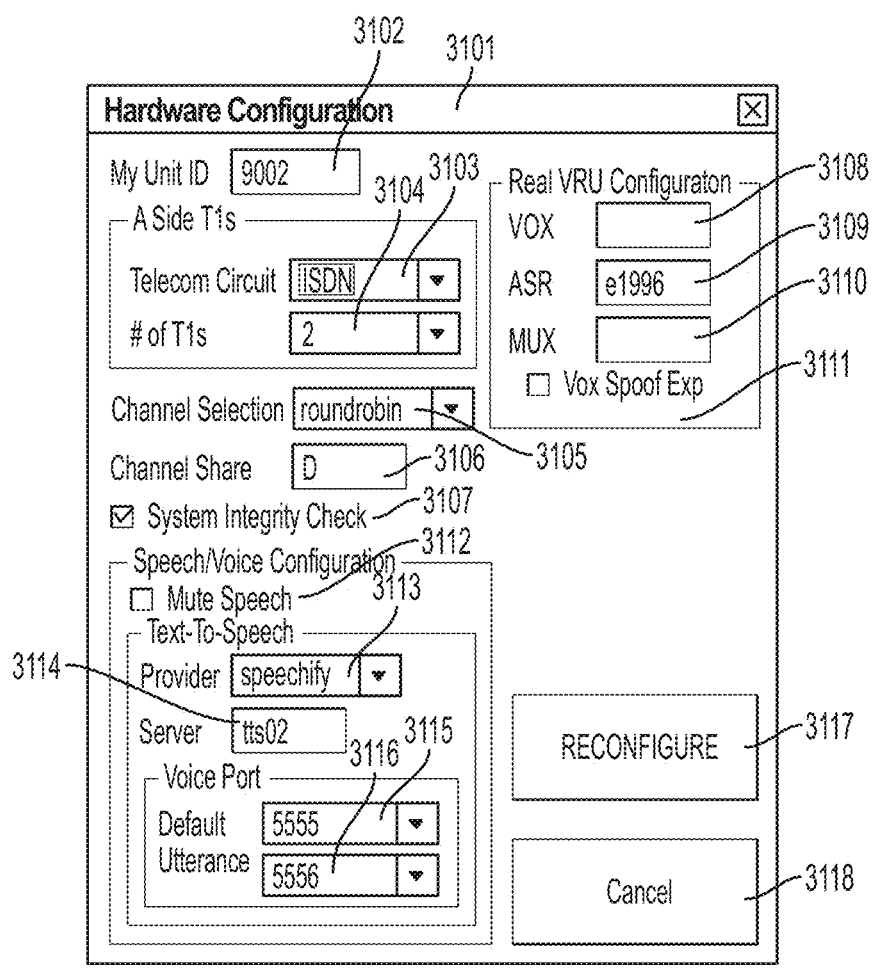
FIG. 31 the controls specific to the hardware configuration are numbered.

The following hardware units are the once we have either emulated or performing the actual operation.
TelecomIN
  Telecom Ring
  Courtesy Transfer
VOX
  Play
ASR
  Grammar operations
  Recognition
TelecomOUT
  Bridge Transfer Hardware Setting Controls The controls specific to the hardware configuration are numbered in the FIG. 31, and the explanation for each of the items is as follows:
1. Hardware Controls: Title bar indicating that the window is for Hardware setting controls 3101.
2. My Unit ID: The installed CVSS's identification number. All the current assigned number are in the 9xxx range 3102.
3. Telecom Circuit: Type of telecom circuit on the A-side. The possible values are either ISDN or T-1 3103.
4. # of T1s: Number of T1s on the A-side, example: Single span (1), Dual span (2), Quad span (4)A 3104.
5. Channel Selection: A method to choose the next available channel. Round robin and next free in the list are the two choices 3105.
6. Channel Share: Use all the channels or partial list. In addition a value 'D' indicates that it will be using only D-channel 3106.
7. System Integrity Check: When this flag is set, the CVSS components will often make sure that all its children are fully functionally for the entire system to continue to function. If any one of the components fails, the entire system halts. This will be helpful in a load test to avoid jamming of the browser when knowingly one of the components is not functionally all right 3107.
8. Real Vox VRU: Parameter to indicate whether a real VRU will be used for the VOX daemon functionality. If so, specify the corresponding VRUs manager name 3108.

9. Real ASR VRU: Parameter to indicate whether a real VRU will be used for the ASR daemon functionality. If so, specify the corresponding VRUs manager name 3109.
10. Real MUX VRU: Parameter to indicate whether a real VRU will be used for the multiplexer daemon functionality. If so, specify the corresponding VRUs manager name 3110.
11. Vox Spoof Exp: Normally this entire system is based on the VXML platform. In situations where it is needed to debug the VOX component in the real VRU for the native exp path, the play messages from the VXML browser to the VOX daemon will be spoofed as if it came from the EXP 3111.
12. Mute Speech: Disable the speech functionality. The user cannot follow the single call processing. Will be useful when the system is used in the production environment and we do not want to use any additional shared resource 3112.
13. TTS Provider: Currently the VOX daemon supports specify (realspeak) and Microsoft's SAPI 3113.
14. TTS Server: Configure to use the appropriate TTS server in the given site, based on where the system is used 3114.
15. Voice default port: For the TTS text, this port will be translated to the corresponding default voice to use 3115.
16. Utterance default port: This is similar to the option (15). But use a different utterance port than the default voice port, so that listening to the call flow becomes more natural 3116.
17. Reconfigure: If any setting is changed, this press button will invoke restart of the system. Again, to invoke this functionality, the components should be running under the watcher. The request to reconfigure is sent to the watcher and it will invoke the restart of the system 3117.
18. Cancel: Ignore the changes and exit 3118.

Hardware Configuration Parameters

The following are the list of parameters that can be configured externally.

FIG. 31

| Ref. | Parameter | Default | Details |
|---|---|---|---|
|  | Version | 1.1 | Current version of the hardware configuration |
| 2 | myUnit | 9002 |  |
| 4 | noOfT1 | 2 |  |
|  | dChannel | 1 |  |
| 5 | channelSelection | roundrobin |  |
| 6 | channelShare | D |  |
| 7 | systemCheck | false |  |
| 8 | realVoxVRU |  |  |
| 9 | realAsrVRU | e1996 |  |
| 10 | realMuxVRU |  |  |
| 11 | vox SpoofExp | false |  |
| 12 | mute Speech | false |  |
| 13 | ttsProvider | 2 |  |
| 14 | ttsServerHostname | linux730 |  |
| 15 | ttsPortDefault | 5555 |  |
| 16 | ttsPortUtterance | 5556 |  |

Figure 32:
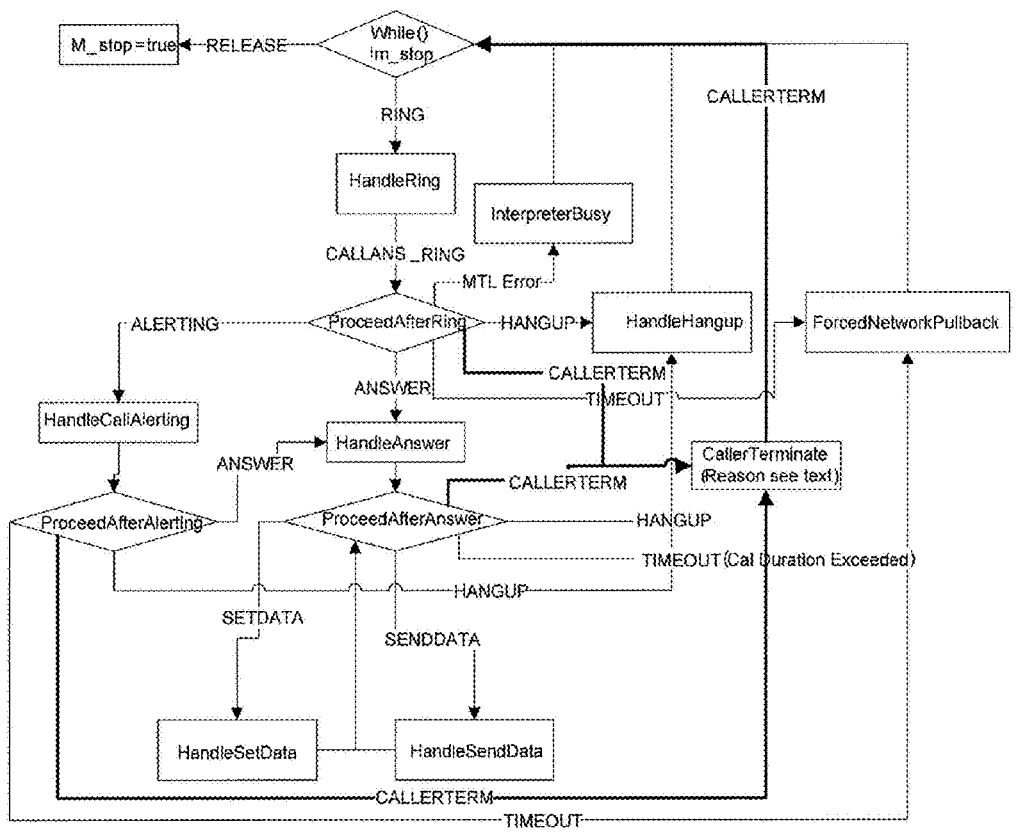
FIG. 32 is an overview of TelecomIN hardware emulation which is one of the main components of the CVSS.

Telecom-Circuitry Telecom Ring Simulation: Basically by building appropriate "11 Ring" MTL Message in CGVM and sending to TelecomIN, we effectively have simulated a telecom ring event. FIG. 32 is an overview of TelecomIN hardware emulation which is one of the main components of the CVSS.

Figure 33:
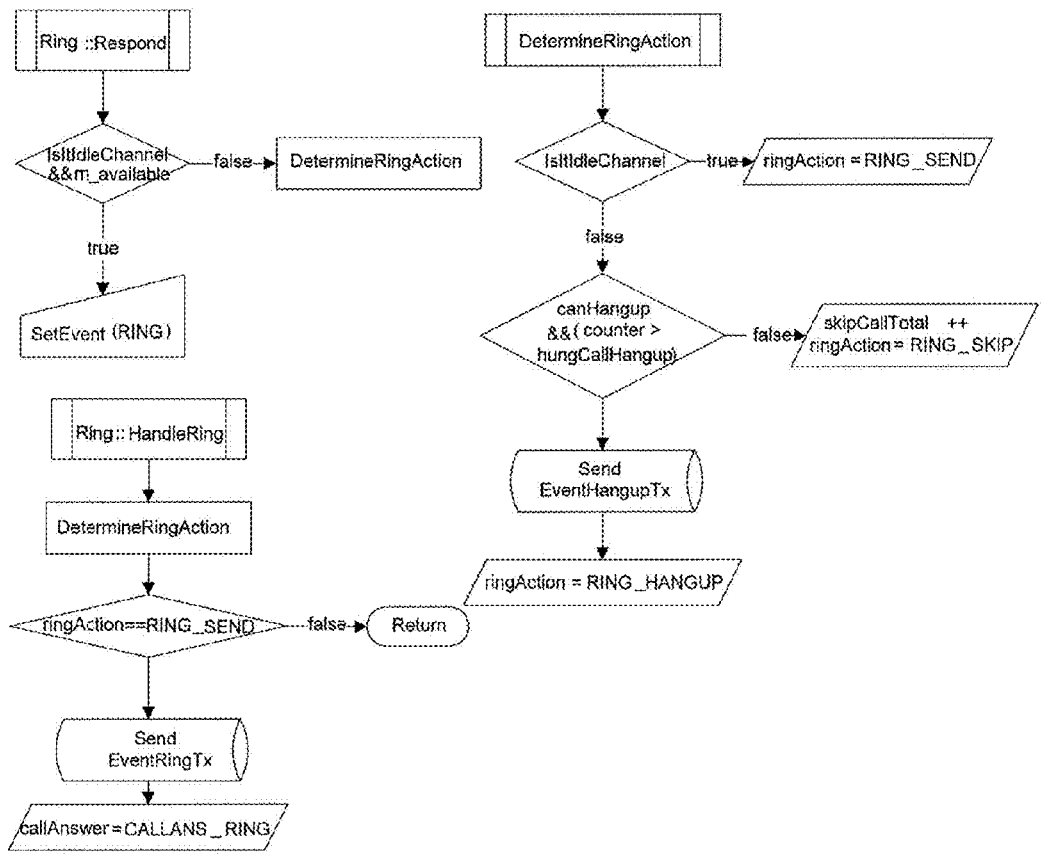
FIG. 33 shows the data flow of how the ring event is been handled.
Figure 34:
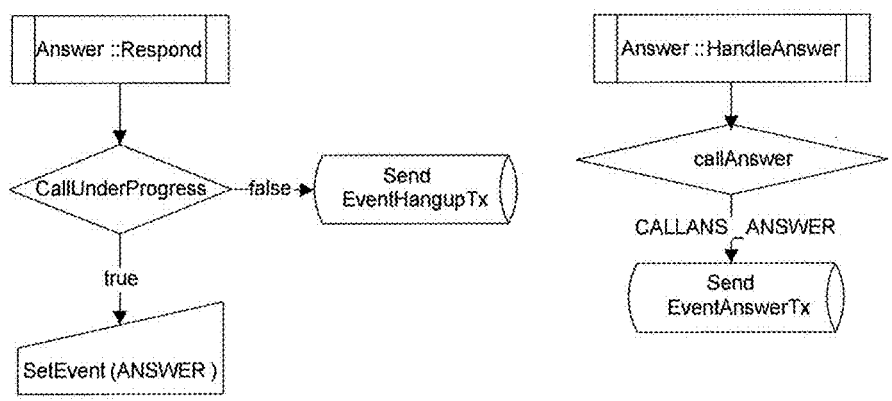
FIG. 34 shows the data flow of how the answer event is been handled.
Figure 35:
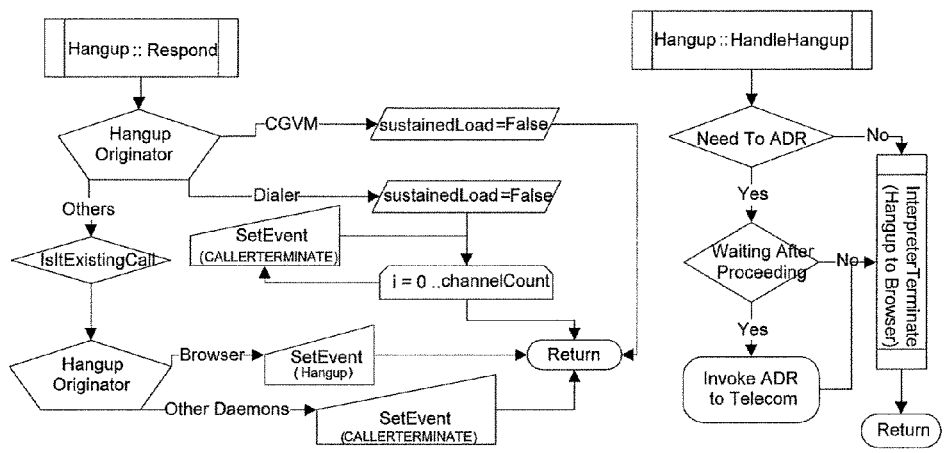
FIG. 35 shows the data flow of how the hangup event is been handled.
Figure 36:
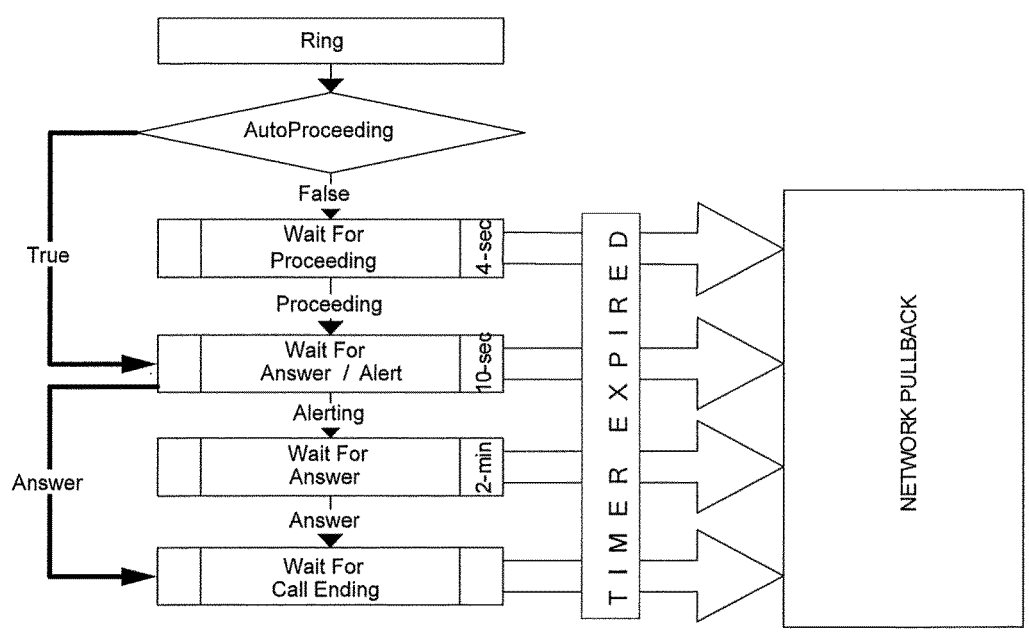
FIG. 36 illustrates different scenarios under which the telecom network will pull back the call.

TelecomIn Event Ring: FIG. 33 shows the data flow of how the ring event is been handled TelecomIn Event Answer: FIG. 34 shows the data flow of how the answer event is been handled TelecomIn Event Hangup: FIG. 35 shows the data flow of how the hangup event is been handled ForcedNetworkPullback: FIG. 36 illustrates different scenarios under which the telecom network will pull back the call. After the telecom network offers the ring message, it has to get response within a predefined amount of time. At various stages the actual time it waits differs. When the ring is offered, the network gives 4-seconds before the platform notifies proceeding (acknowledge the ring message and working on it). Normally, the platform is set to send auto proceeding at the time of ring arrival. This proceeding notification lets the network to provided additional 6-seconds grace period to answer or reject the call. If the platform does not respond within these timers, the network will pull back the call. At the same time, the platform also can reject the call with user busy, there by invoking ADR functionality, such that if the number is provisioned with this feature, the call gets routed to another alternate site. But, if the platform decides that, it requires additional time to decide whether to accept the call or not, then it can send an alert notification, to the network. Upon receiving the alert notification, the network gives another grace period of about 2-minutes. At this point the platform looses the ability to do ADR. Also, during these grace periods, only one way audio (half-duplex) is set from the platform to the caller. Again, at this point if the call does not get answered in the next 2 minutes, the call will be pulled back by the network.

NOTE: network pullback if the call does not end with in the pre allocated duration is only a feature in the simulator. In real platform the system has to terminate the call and throw the hangup to the network Caller Hangup: The following are the list of different circumstances under which an equivalence of caller hangup scenario will be raised:

If the CGVM attempts to generate a new ring event and the previous call was abandoned by the browser or taking long time to complete, and then if it is over the skip count rule, then a caller hangup will be forced Dialer invoking a caller hangup Any daemon invoking a caller hangup (through programmed input set)

Delayed answer response from the previous call (previous call was already pulled back by the network)

and also if it is a sustained load scenario, already next call might have started on this channel An answer request cannot be serviced, since the simulator cannot get answer back in 200 msec (is it too busy!!!)

Application input set is programmed to hangup the call for the <ANSWER> tag

Figure 37:
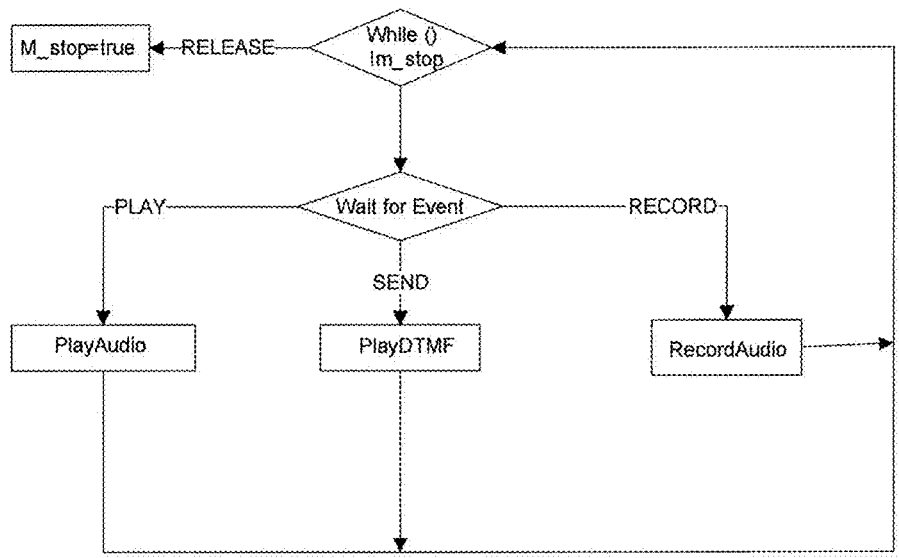
FIG. 37 The logic and decision tree behind the voice device emulation is shown.

Prompt Engine Emulation: The logic and decision tree behind the voice device emulation is shown in FIG. 37.

Figure 38:
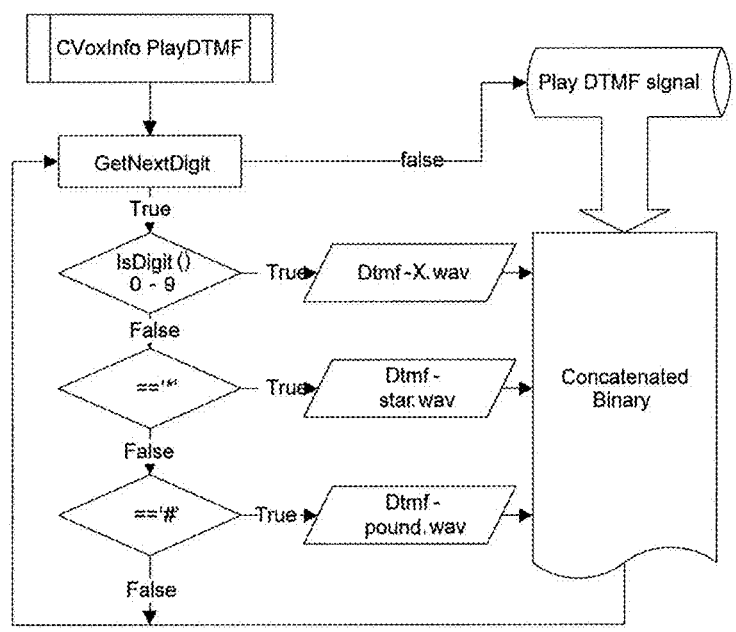
FIG. 38 the inside architecture of the DTMF generator is detailed.

DTMF signal Generator Each digit in the given string is parsed and for each digit, the respective audio binary is concatenated to generate DTMF play back of sequence of digits. The DTMF digits consist of digits 0-9, pound (#), and start (*). NOTE: Currently it is useful only in a single set call and only to listen to the DTMF signal. Other than that functionally it is of less significance. The inside architecture of the DTMF generator is detailed in FIG. 38.

Figure 39:
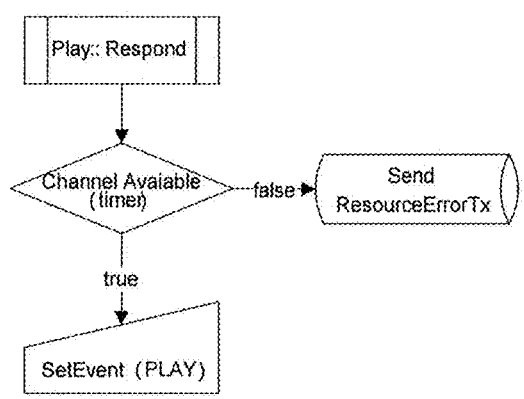
FIG. 39 shows the data flow of how the play event is been handled.

Vox Event Play: FIG. 39 shows the data flow of how the play event is been handled Speech Glue Layer: The speech glue layer is a middleware which provides the APIs to handle the speech functionality.

Figure 40:
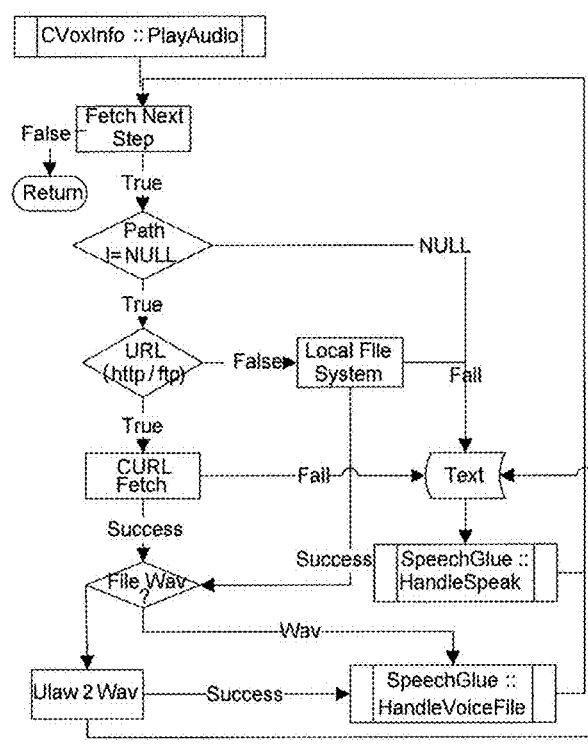
FIG. 40 the decision make logic of how and what binaries get queued for playing is illustrated.

Based on the environment (hardware & operating system), the Application Program Interface (API) could be inherited and expanded. Currently, since the CVSS runs only on the windows system, COM device interface is used. The prompt could be either from the recorded audio, or text data. In case of recorded audio, the file need to be fetched from an external server and converted to the way file format to play on the COM device. For the text data, it needs to be passed to an external TTS server to generate the audio binary and will be played on the COM device. Interface to the external TTS server could be standards based (MRCP) or native API. At this stage only the native APIs are used, and hence based on the TTS provider, we use either the Microsoft SAPI or Speechify's native API (appropriate class is inherited based on the selection). The decision make logic of how and what binaries get queued for playing is illustrated in FIG. 40.

Scansoft Speechify TTS

TABLE 1

Speechify Voice Persona Listing

| Persona | Gender | Nationality | Port | |
|---------|--------|-------------|------|------|
|         |        |             | 2.1  |      |
| Helen   | Female | GB          | 5563 | 5563 |
| Mara    | Female | US          | 5555 | 5555 |
| Tom     | Male   | US          | 5573 | 5573 |
|         |        |             |      | 5556 |
| Karen   | Female | AU          |      |      |
| Jill    | Female | US          |      | 5581 |
|         |        |             |      | 5555 |

Microsoft SAPI TTS Recognizer Server Emulation: ASR server is a key part of the recognition. Instead of sending the request to the ASR server we have simulated its functionalities in the ASR daemon itself.

Grammar Manipulation: The grammar manipulation features such as load, activate, deactivate, and free and handled in this level. This is simple and straight forward implementation. Basically when a load request is made, a new entry is updated to keep track of all the loaded grammars. Current activate and deactivate statuses are updated to the loaded list of grammars. When requested or on the call hangup the loaded grammars are freed. Currently for the simplification, the grammars are not validated. When the recognizer need to compute the result, and if the grammar is not specified or inline grammar is specified (where the actual inline name depends on the run time), appropriate active grammar will be chosen (some times this auto selection may not be consistent with the context, but at least let the call flow to continue). Primarily all return data are controlled by the application input set.

Figure 41:
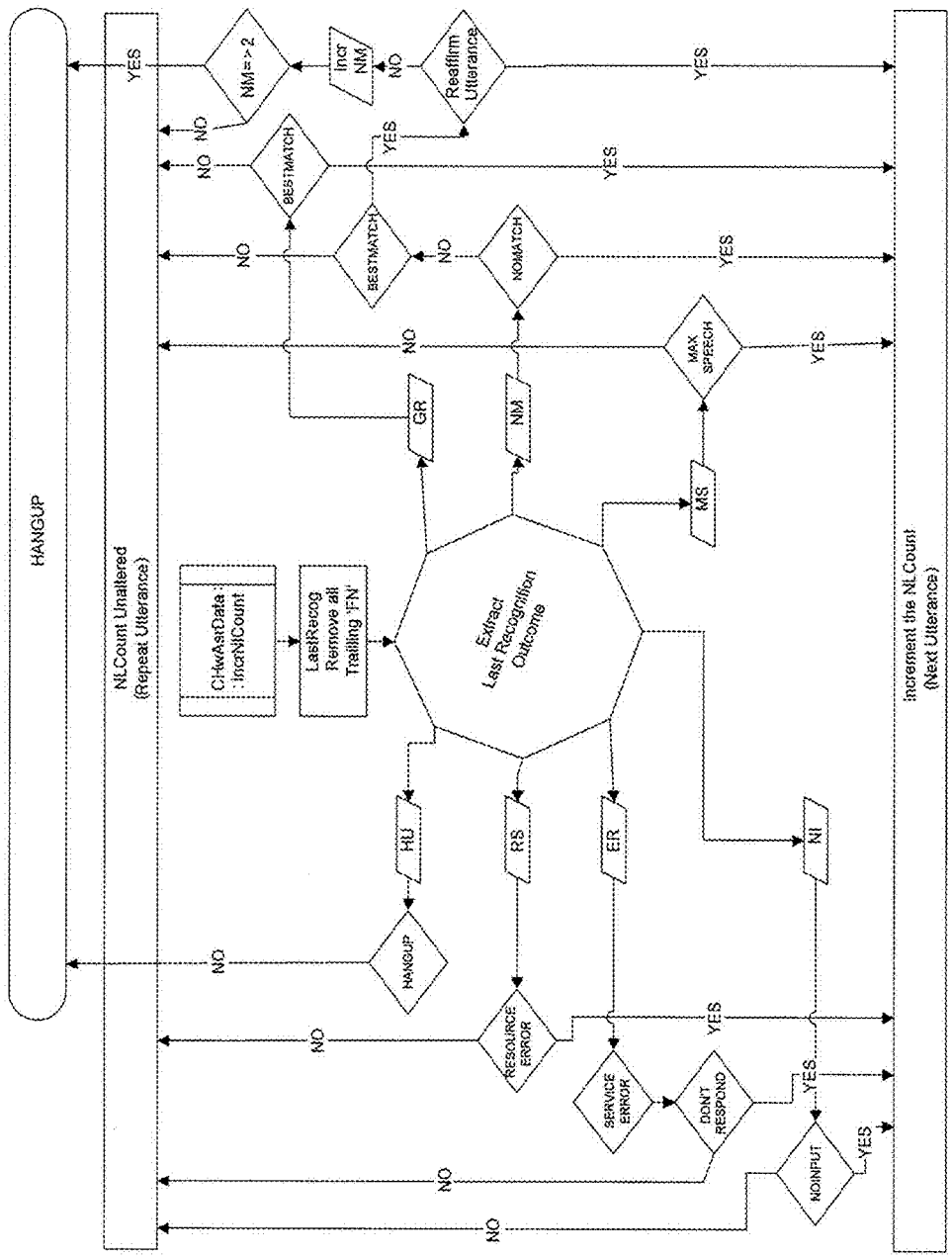
FIG. 41 event synchronization is illustrated.

Recognition and Result: The recognizer emulation engine gets all its parameters from the application input set. Based on the event synchronization as explained in FIG. 41, the engine makes the decision about which recognition result to be returned. Some of the salient features of the synchronization include:

For the fake noinput (input where timeout is less than 100 ms), the last known recognition is used instead, to synchronized with the call flow Accommodate the reaffirm utterance which prevents the discrepancy between the confidence scores and the call flow path If the string recognition returns nomatch twice then, the engine throws hangup which prevents application going into an infinite loop Vox Time Slot Re-routing: This is an essential feature while using real ASR. In MRCP based ASR engine, the voice is routed in IP packets using the IP service. Before the recognition, as part of the initial call setup, a time slot will be allocated in the Vox daemon and the ipservice sets up the route between this time slot and the IP session port. This way half duplex audio will be routed from the caller to the ASR engine. But, in this set up since there is no T1 involved, VOX daemon will be used to play the utterance, and the routing is adjusted such that the newly assigned timeslot will be listening from the utterance playing VOX device instead of T1 there by routing the audio from the VOX device to the ASR engine.

Figure 42:
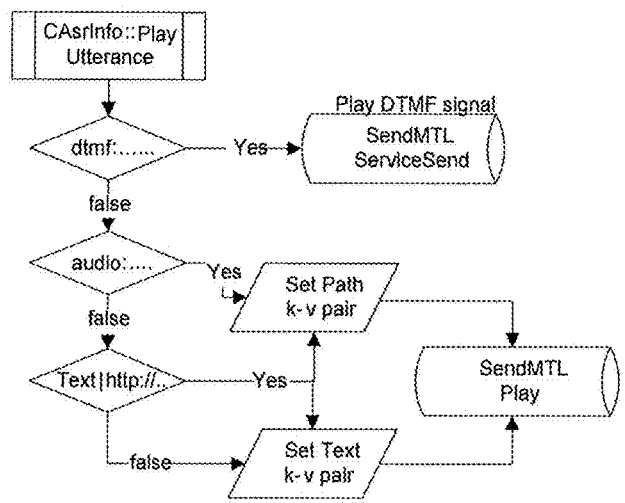
FIG. 42 utterance play is illustrated.

Utterance Play: As mentioned in FIG. 42, based on whether the utterance is DTMF or speech, appropriate MTL message is build and sent to the VRU where the real ASR server is being used. In addition, if it is a single call, the duplicate copy of the utterance is sent to the local simulated VOX daemon and played. This way, the user can follow the call flow path.

TelecomOUT Bridge Transfer Emulation By holding (not sending immediately) the B-side hangup, we have essentially simulated the bridge transfer. When we want to terminate the bridge, we could throw an A-side hangup from the dialer or B-side hangup from the popup (raised after receiving the '29 dial' MTL message) in the TelecomOUT daemon.

Unique Test Set Identification (UTSID): Typically the user would first select the appropriate application test set and subset. Then notify all the other daemons including the cgvm via the simulatorApp message to get prepared for the test run. Later the user selects the appropriate call generation settings and presses the 'run' button to start the test. The flow of this is explained in FIGS. 67 and 68.

UTSID Codec: The UTSID is encoded information. During data retrieval it will be decoded to display the appropriate details about the call. Normally the length of this key will vary depending on the content itself. The last three digits identify specific group.

TABLE 2

| UTSID Encoded Fields | | | |
|---|---|---|---|
| 4 | 3 | 2 | 1 |
| Encoded Data | Base Character Set Identifier | S/D | 1/M |

|  |  | 1 | 2 | a | b | c | D | e | f | A | B | C | D | E | F | G | H | I | P | Q | R | S | T | U | V | W | X |
|---|---|---|---|---|---|---|---|---|---|---|---|---|---|---|---|---|---|---|---|---|---|---|---|---|---|---|---|
| Number (0 ... 9) | All | ✓ |  | ✓ |  | ✓ |  | ✓ |  | ✓ |  | ✓ |  | ✓ |  | ✓ |  | ✓ |  | ✓ |  | ✓ |  | ✓ |  | ✓ |  |
|  | Exc 0 |  | ✓ | ✓ | ✓ |  | ✓ |  |  | ✓ |  | ✓ | ✓ |  | ✓ |  | ✓ |  | ✓ |  | ✓ | ✓ |  |  |  | ✓ |
| Lower Alphabet (a ... z) | All |  |  |  |  |  | ✓ | ✓ | ✓ |  |  | ✓ | ✓ |  | ✓ | ✓ |  |  |  |  |  | ✓ | ✓ | ✓ |
| Upper Alphabet (A ... Z) | All |  |  |  |  |  |  |  |  | ✓ | ✓ | ✓ | ✓ | ✓ | ✓ | ✓ | ✓ | ✓ |  | ✓ | ✓ | ✓ | ✓ | ✓ | ✓ | ✓ | ✓ |

System Integrity Check: the simulators are tightly coupled to each other for the complete functionality. To achieve this, each daemon maintains its health status that is propagated to its parent. The parent moves into functional or resource error state depending on the health of all of its children. The parent knows the status of its children by the following two ways:—

The children notifies its event change to its parent, when its status changes

The parent as a part of its scheduled task, polls the children for its health status The following are the well defined health status through which the state machine moves.

NOT AVAILABLE
    PONGHEALTH_UNAVAILABLE
AVAILABLE, BUT STILL GETTING READY (Acquiring param from remote/connecting to resource)
    PONGHEALTH_STARTING
    PONGHEALTH_INITPHASE
    PONGHEALTH_INITCOMPLETE
AVAILABLE, BUT NOT FUNCTIONAL
    PONGHEALTH_RESOURCEERROR
FUNCTIONAL, INDICATING LOAD STATUS. LOAD WILL BE CALCULATED THE APPLICATION
    PONGHEALTH_FUNCTIONAL
    PONGHEALTH_AVGLOAD
    PONGHEALTH_MAXLOAD With regard to the Database Logging Interface, any data such as test run, number of calls generated, the status of the call, detailed information on the MTL message transactions between the daemons and the browser are all logged in the Microsoft Access Database. To achieve this task are the following five relational database tables, see FIGS. 68A-E.

CgvmCalls
BrowserCalls
CallStatistics
EosEvent
Incidents

|  | dialer | cgvm | TelecomIn | VOX | ASR | TelecomOUT |
|---|---|---|---|---|---|---|
| CgvmCalls |  | ✓ |  |  |  |  |
| BrowserCalls |  |  | ✓ |  |  |  |
| EosEvent | ✓ | ✓ | ✓ | ✓ | ✓ | ✓ |
| CallStatistics |  | ✓ | ✓ | ✓ | ✓ | ✓ |
| Incidents | ✓ | ✓ | ✓ | ✓ | ✓ | ✓ |

When the call is generated from the CGVM, this entry is made. If the calls are generated at a regular period, then you would notice multiple rows in the table with the same UTSID, indicating that the same batch generated multiple calls. Not all these generated calls would end up in actual placing of the call. This is similar to the scenario when multiple callers arrive at a telephone calling booth, and there are definite number of units available, and if certain of them are already occupied, then the actual call placed will be equal to the available units that are not occupied. With regard to typical CgvmCalls DB Fields, see FIG. 68A.

Every time a batch of call is generated, a corresponding entry will be made in the database file. In a multi-batch test mode, since there will be more than one batch of calls generated, there will be multiple entries with the same UTSID. 'CallCount' field indicates how many calls are generated in the current batch, and 'CallTime' field indicates the exact time when the CGVM finished generating the current batch. (NOTE: As mentioned in the section on BrowserCalls below, all calls generated by CGVM does not have to be real active calls). Each time an entry is made the current appname and its inputset information are registered. This is necessary since in the 'dialauto' test mode, each batch of call will be invoked for new input set.

With regard to BrowserCalls, all the calls that were processed by the browser will be reported in this database. When the current active line calls CTelecomInInfo::LineHangup( ), this function in turn Calls CallEndLog( ) function which logs an entry into this database file. NOTE: Calls where browser channels busy, and network pullback before proceeding message, will not be logged. With regard to typical BrowserCalls DB Fields, see FIG. 68B. Each call will have its own unique UPCID. This information will be useful to locate a particular call. Since more than one call can be generated with one test set, UTSID field could have duplicate entries. UTSID+UPCID will give unique key. Further a flag will be marked registering which unit hung call. In theory, if we have allocated enough batch time between the batches (batch time>expected call duration), the browser should originate the hangup. This gives a quantitative analysis of long duration calls. The actual duration of the call is also registered.

EosEvent: All the eosevents associated with the call flow are recorded in this database. By keeping track of the eosevent, in case of any crash in the browser of other system, it will be helpful to reconstruct the call flow. This could add additional stress when performing a load test. This feature will be enabled on a need basis. With regard to typical EosEvent DB Fields see FIG. 68B. For one call there will be many MTL messages flowing between the daemons and the browser. Also, when multiple calls are generated within a test set, there will be multiple entries with repeated UTSID. UTSID field might be unnecessary, since by establishing relationship between UPCID and UTSID in the 'BrowserCalls' database, we could derive the UTSID number. Every message will log the event time when the message was originated along with the name of the service which originated the message. With respect to the corresponding daemon whether the message was received or sent will also be registered. Other information such as message ID, message type and message details are logged. As mentioned previously, this feature is enabled to debug a specific failure scenario.

With regard to the CallStatistics function, at any time a snap shot of the call statistics is reported from each one of the daemon. If the autoping flag is turned on in the dialer interface, depending on the ping frequency, data will be logged at the frequency rate. Normally it is a good idea to turn on this logging for a big load test. If any daemon were to die during the load test, the stimulator would have captured the data at frequent intervals, so that it would be helpful to analyze the crash. With regard to the typical CallStatistics DB Fields, See FIG. 68D. Each entry will information about its main unit number and its own identification (sub unit ID), along with reporting time, current call count, and number of MTL messages received and sent. Also, the current UTSID is reported, there by it will be useful to collect cumulative statistics for any give run (UTSID).

With regard to the incident management function, when any daemon dies/crash during the load test, it would come back up and re-synchronize to continue on to take new call. Every one of these incidents will be registered in this database. With regard to the typical incidents DB Fields, see FIG. 68E. Unit number, Subunit ID, and reporting time are reported in each entry. Whenever a component registers its crash incident, it will also report the lastly known UTSID. When there was a problem identified in a load test, this information will be helpful to correlate the problem with the daemon crash incident.

With regard to the Dialer and CGVM Configuration, the following Table 4 shows the way that one could custom build their dialer to use in the load testing. Both FIGS. 68A and 68E, as seen in FIGS. 68B and 68C together are part of SimulatorHw.xml configuration file. With regard to CGVM Configuration, the Table 5 shows the way to configure your own CGVM. The features available to the CGVM are customizable such that we can test out various hardware scenarios.

With regard to Simulated and Helper VRU Concept, the simulator can be a stand alone unit which has all the required components of the VRU, See Figures shown in FIGS. 21 through 28. But on many occasions it can be required to test an individual component of the VRU. The VRU components can be tested externally for its functionality, however, it has also become a vital part of the simulator to associate the real VRU daemons on the loop. To achieve this role, the simulator on many occasions can take the helper role instead of the complete simulator role.

With regard to the Helper Vox Daemon, the diagram shown illustrates how a real vox daemon is used in conjunction with the simulator. The simulator VOX daemon becomes the helper vox which almost never participates in the call processing. The curld and ttsd are subsystems to the vox daemon. By using the real vox these two daemons are directly engaged as well. In addition the real TTS server is used to convert the text to the audio binary. The ASR portion of the call is completed simulated since the main concentration is towards testing the vox daemon functionality.

With regard to the Helper ASR (MRCP) Daemon, the diagram shown illustrates how a real MACP-ASR daemon is used in conjunction with the simulator. Similar to the VOX daemon usage as indicated in the above section, ipservice becomes intricate part of the system. The ASR daemon in the simulator will act as a helper asr daemon for the utterance play. Similarly the vox daemon in the VRU becomes the helper vox daemon. Browser sends all the ASR requests (grammar operations, recognition) to the real ASR daemon, which in turn will utilize the real ASR server. The prompts are played in the simulator VOX daemon. This way the utterance play is separated from the prompt play. The main concentration of component that is being tested in this setup is both asr and ipservice daemons.

Figure 43:
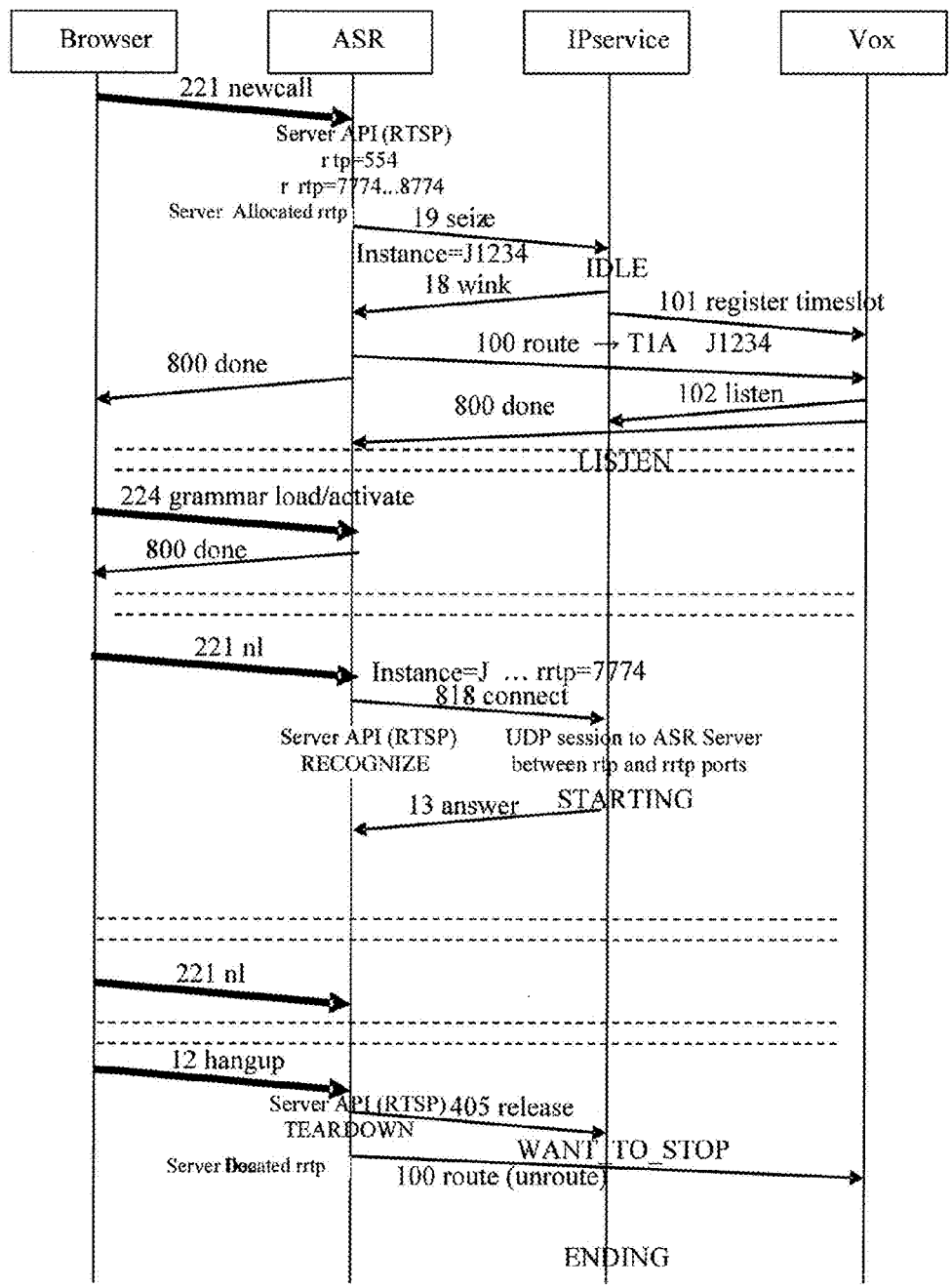
FIG. 43 explains the timing diagram involved in setting up the MRCP recognition session in a VRU.

FIG. 43 explains the timing diagram involved in setting up the MRCP recognition session in a VRU. In viewing this diagram, it is clear that the ASR, ipservice and VOX daemon, all of them are tightly coupled and the state machine in the ipservice is critical, since its interaction with the dialogic firmware is asynchronous. The ipservice daemon listens to the time slot specific to a call, and is responsible for converting the voice energy to IP packets and shipping the IP packets to the ASR server. The detailed insight to this protocol is very significant in making the simulator work in conjunction with the real VRU.

Hooks between Simulator and Interpreter—For the simulator to working seemingly with the interpreter and the real VRU, it is critical to provide the software hook between the simulator and the interpreter. Please note that there is absolutely no need to change the VRU software for the simulator to work. The interpreter is responsible for notifying the appropriate event to the simulator. Based on the functionality requirement, the hooks can be classified as follows:

Table 4: List of hooks between simulator and interpreter

| Functionality | Event | Required | Details |
| --- | --- | --- | --- |
| Any Destination | Any | O | If the real VRU's will be included, then the daemons need to know where the corresponding request needs to go. i.e., replytoXXXX |
| | Disable error reporting | O | If not implemented, when testing a production platform cannot control error messages flooding the NOC |
| | UTSID | O | Pass the UTSID to the application server to automate the result verification |
| | UPCID2 | O | Append the UTSID to the UPCID2 identifier to separate the CVSS generated calls from the real calls |
| TELECOM | Proceeding | M | Needed to identify which virtual session is processing the call |
| | Answer | M | Necessary to allow the call to continue, otherwise the network will pull back the call (otherwise equivalent to the caller hangup) |
| | Alerting | M | If the platform requires additional time before answering the call, it is necessary to notify this message. Otherwise the network will pull back the call (otherwise equivalent to the caller hangup) |
| | Hangup | M/O | Notification of the call termination. Failure to implement this will force a caller hangup at the end of the call duration (redundant if the call has already ended !!! thereby resulting in reduced generated calls) |
| ASR | newcall | M | ASR license notification Newcall ID setup |
| | NI | M | Initiate a recognition request |
| | recogResult | O | If ASR is in a real VRU environment, notifying the last recognition outcome (in the current new NL request) will enhance the call flow synchronization. GR, NM, NI, MS, FN, RS, ER, HU |
| | Fake Noinput | O | Fake noinput logic (noinput when timeout <= 100 ms). |
| | Grammar | M | If the matched grammar in the NL's return |

| Functionality | Event | Required | Details |
| --- | --- | --- | --- |
| | Validation | | result does not match any one of the grammar in the current active list (possible because of TG # prefixing in the path, and the xml script is generic), match the first grammar in the list. Otherwise the call will terminate |
| | promptdone | M | Notify the end of prompt done to return the nlsmlresult (completely simulated environment), or initiate utterance play (ASR in a real VRU environment) |
| VOX | Ignore routing error | M | Need to ignore the routing error to enable the CVSS to work with a real VRU with out a physical T1 |
| | Play (spoofexp) | O | To spoof the play message as if the originator is from exp instead of VXML |
| IPSERVICE | dump | O | In case of completely simulated environment, no real asrserver to report |

Where

| | | |
| --- | --- | --- |
| M | → | Mandatory |
| O | → | Optional (Failure to implement this hook will result in absence of the corresponding feature) |
| replyToXXXX | → | replyToVox, replyToAsr which will be different than generic 'replyto' field if the daemons from the correspond real VRU's are used |

Figure 44:
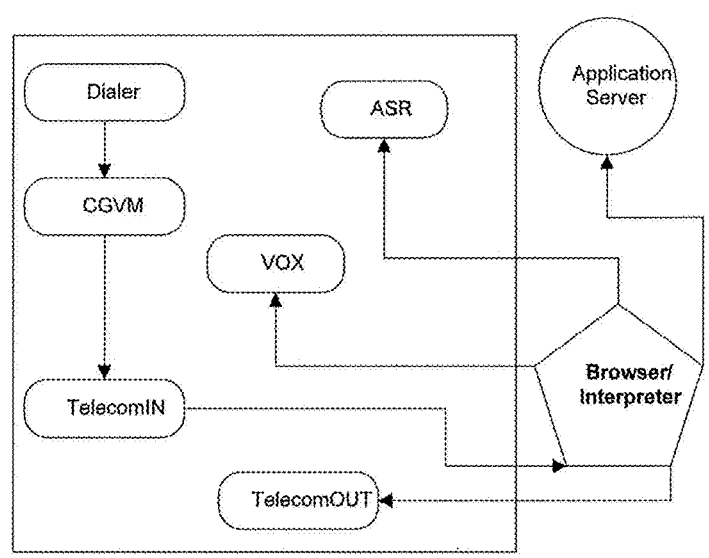
FIG. 44 complete simulated VRU is illustrated.
Figure 45:
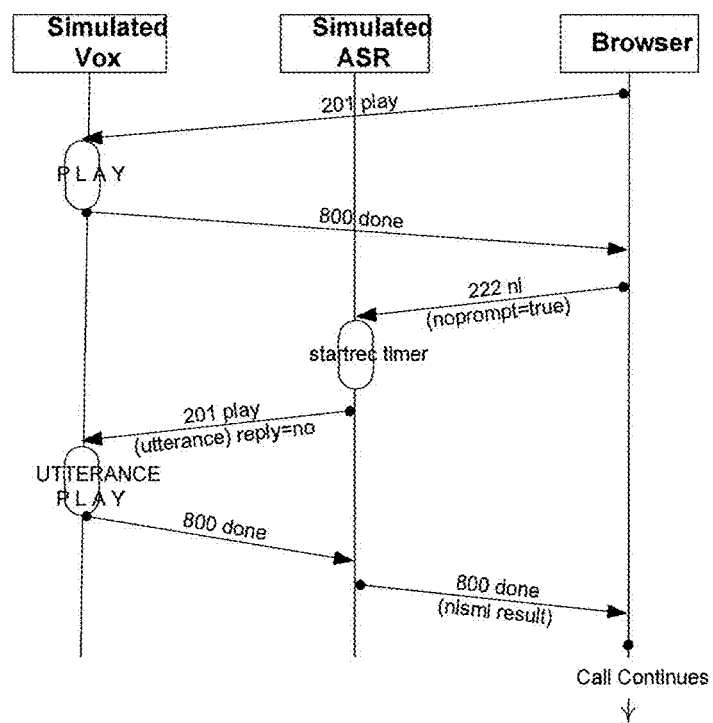
FIGS. 45-50 the timing diagram for the barginable and non-barginable recognition prompts where the caller barges in or not, under single or multiple users mode is explained.
Figure 46:
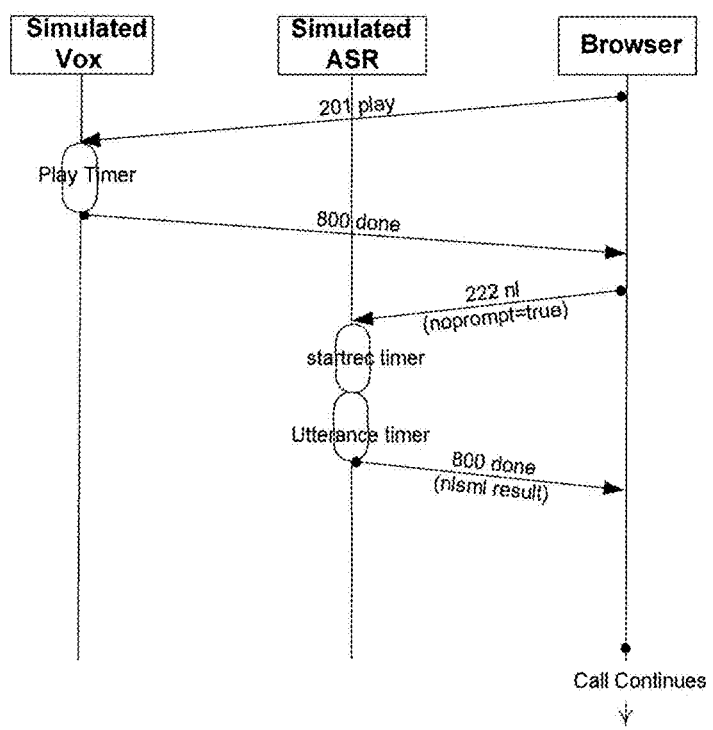
Figure 47:
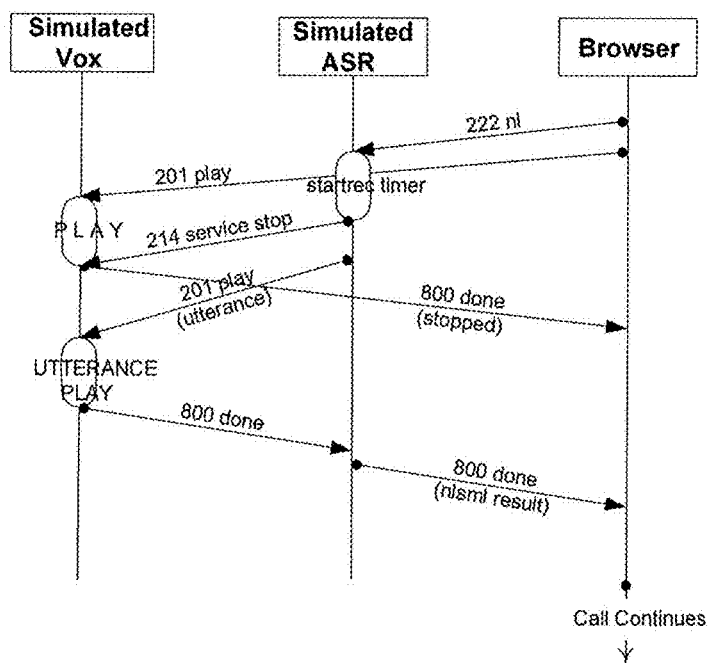
Figure 48:
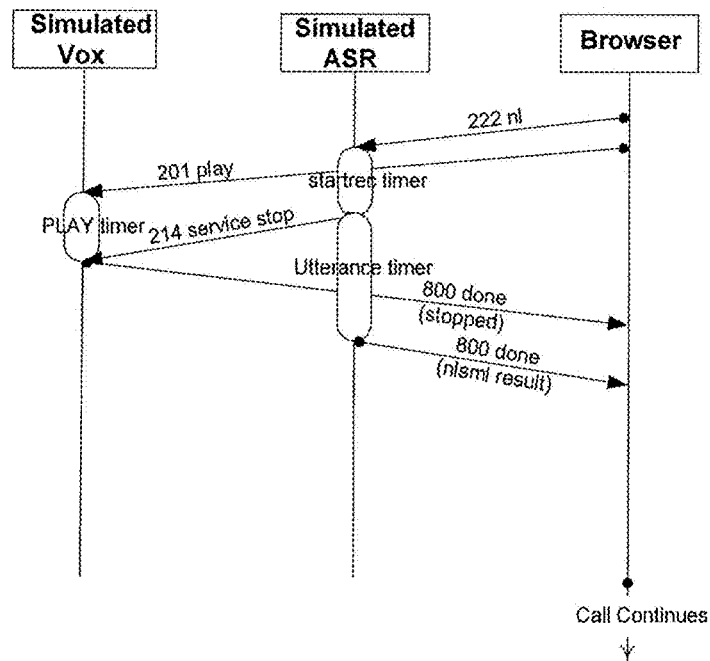
Figure 49:
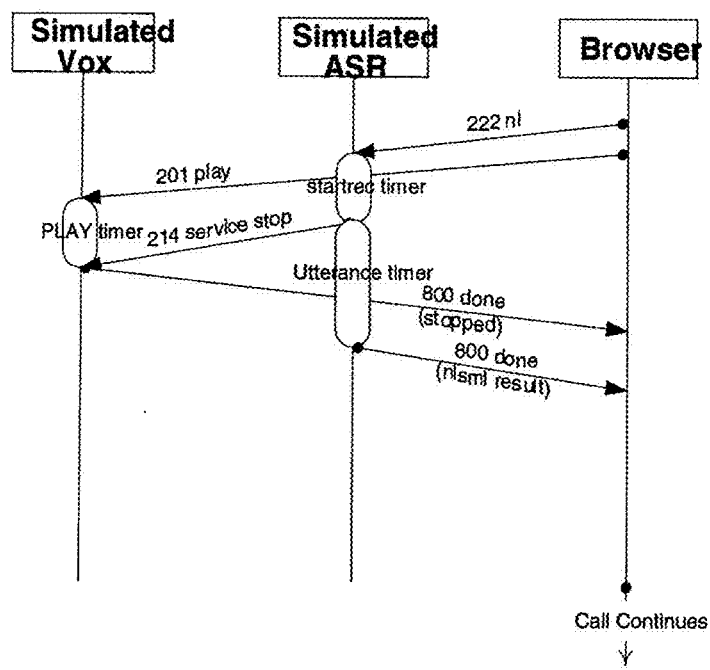
Figure 50:
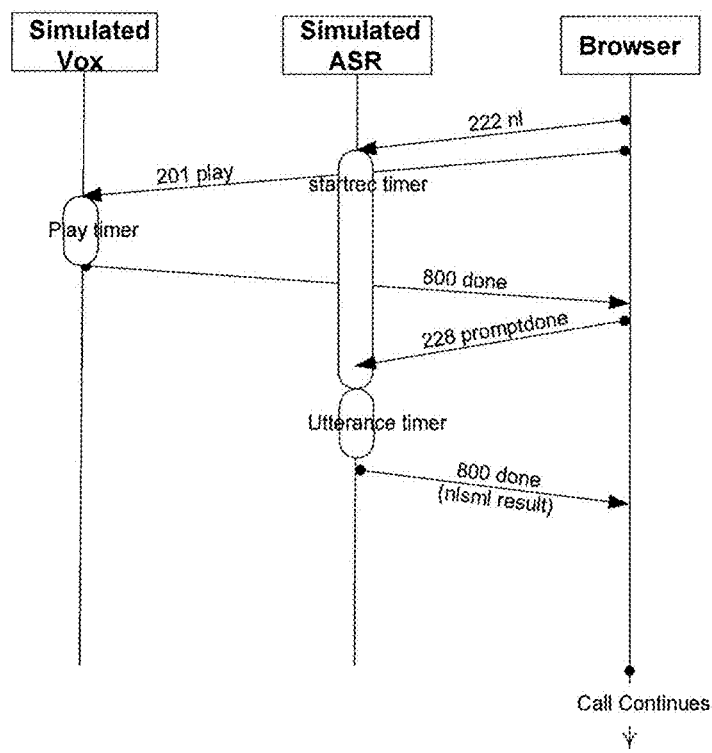

Complete Simulated VRU: Refer to the block diagram in FIG. 44 for this kind of setup. The main reason behind using this environment is to do load test on the browser and application server. In addition the other advantages were explained before and all over this document.

The timing diagram for the barginable and non-barginable recognition prompts where the caller barges in or not, under single or multiple users mode is explained in FIG. 45 to FIG. 50.

Figure 51:
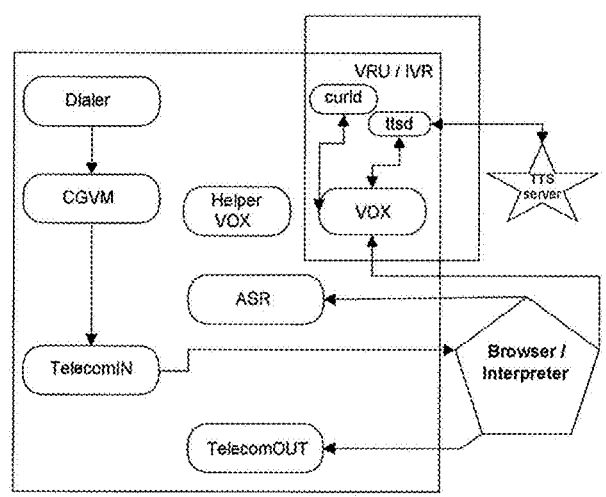
FIG. 51 illustrates how a real VOX daemon is used in conjunction with the simulator.

Helper Vox Daemon The block diagram in FIG. 51 will illustrate how a real VOX daemon is used in conjunction with the simulator. The simulator VOX daemon becomes the helper VOX which almost never participates in the call processing. The curld and ttsd are subsystems to the VOX daemon. By using the real VOX we are directly engaging these two daemons as well. In addition the real TTS server is used to convert the text to the audio binary. The ASR portion of the call is completed simulated since the main concentration is towards testing the VOX daemon functionality.

Figure 52:
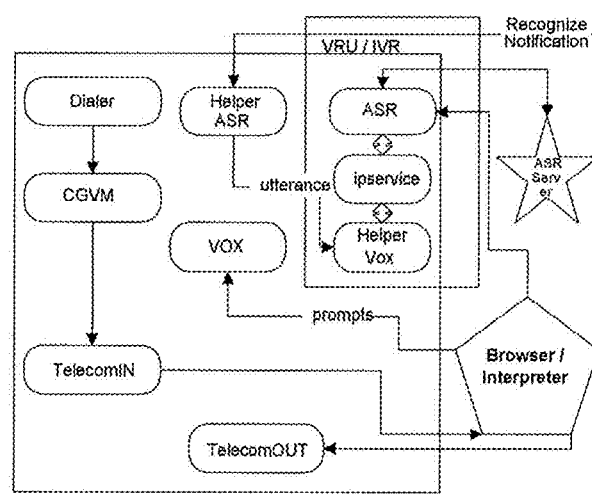
FIG. 52 illustrates how a real mrcp-ASR daemon is used in conjunction with the simulator.
Figure 53:
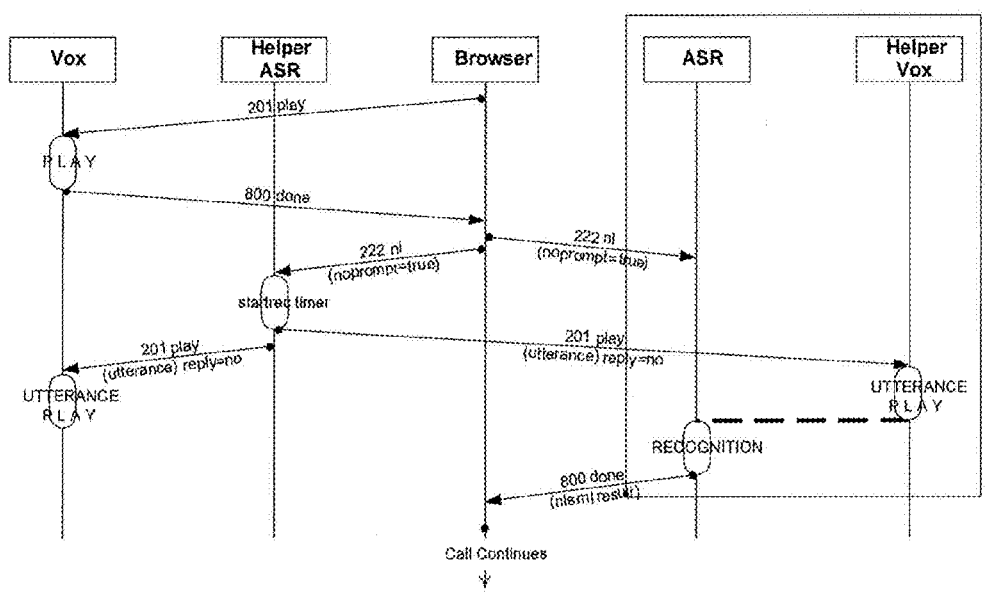
FIG. 53-58 the timing diagram for the barginable and non-barginable recognition prompts where the caller barges in or not, under single or multiple users mode is explained.
Figure 54:
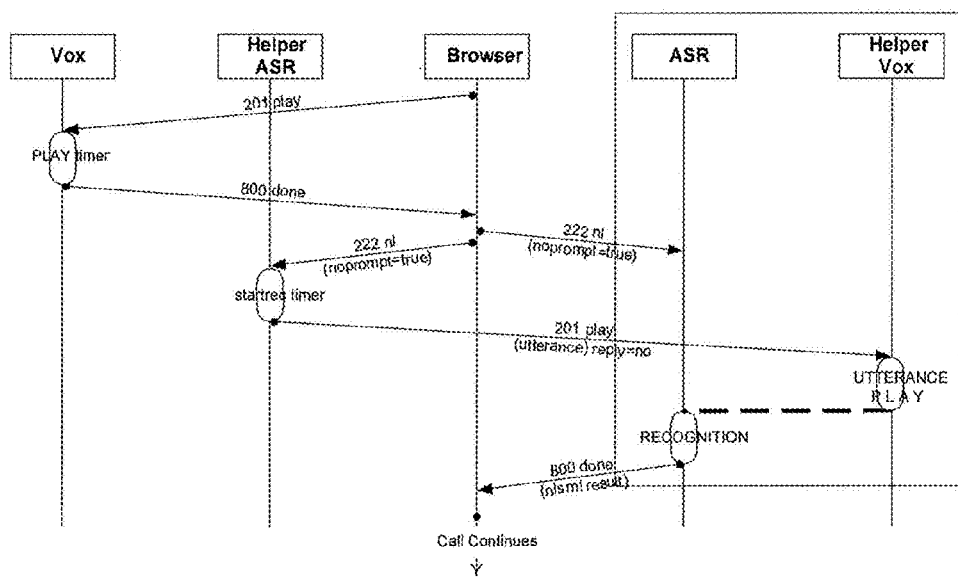
Figure 55:
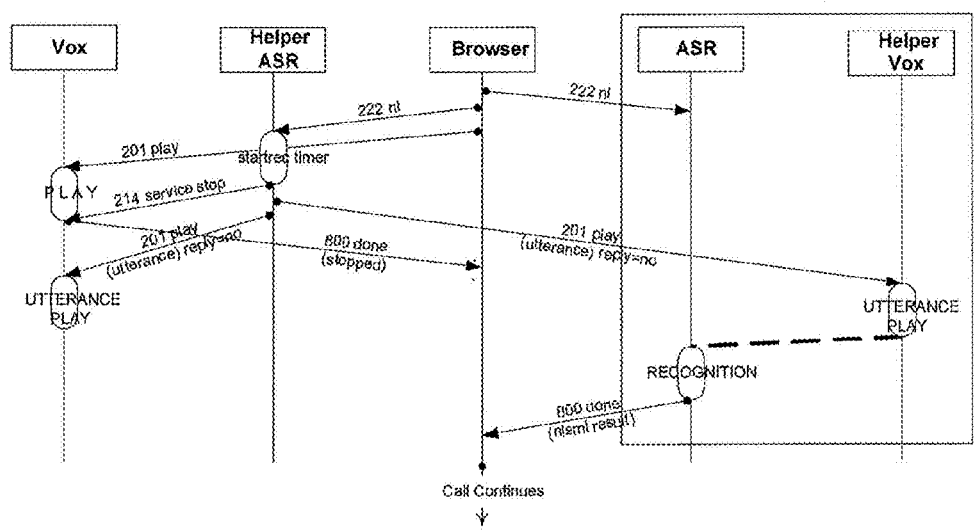
Figure 56:
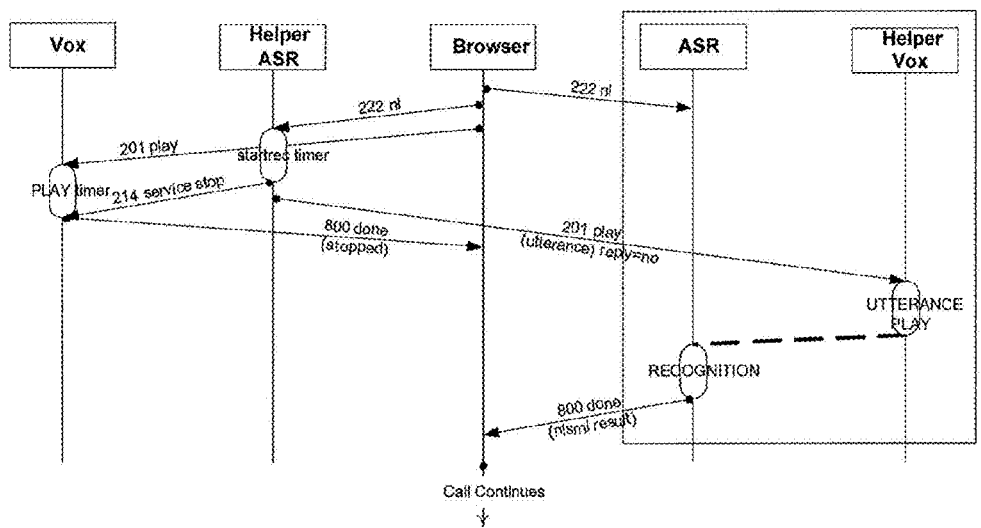
Figure 57:
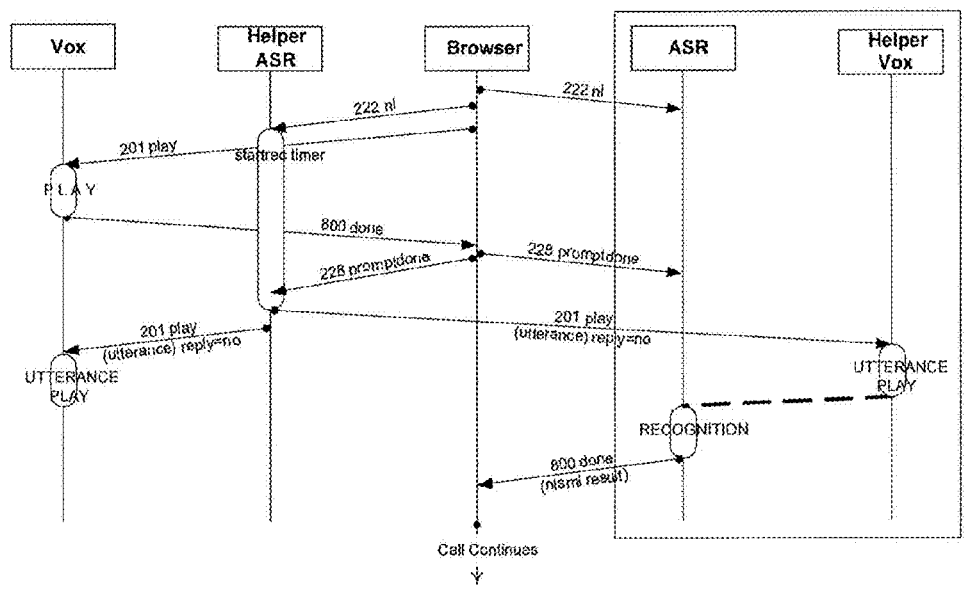
Figure 58:
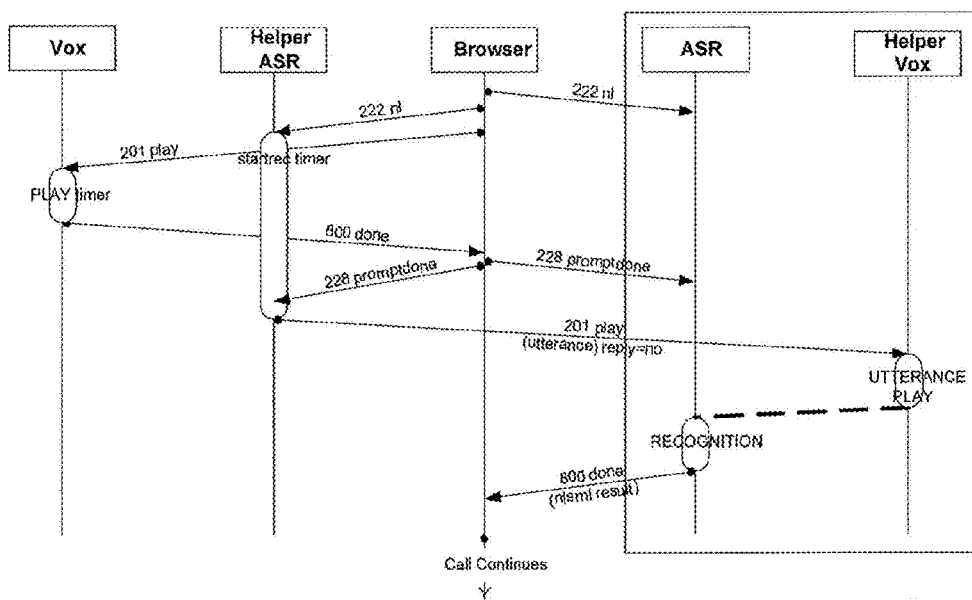

Helper ASR (MRCP) Daemon: The block diagram in FIG. 52 will illustrate how a real mrcp-ASR daemon is used in conjunction with the simulator. Similar to the VOX daemon usage as indication in the above section, ipservice becomes intricate part of the system. The ASR daemon in the simulator will act as a helper ASR daemon for the utterance play. Similarly the VOX daemon in the VRU becomes the helper VOX daemon. Browser sends all the ASR requests (grammar operations, recognition) to the real ASR daemon, which in turn will utilize the real ASR server. The prompts are played in the simulator VOX daemon. This way the utterance play is separated from the prompt play. The main concentration of component that is being tested in this setup is both ASR and ipservice daemons.

The timing diagram for the barginable and non-barginable recognition prompts where the caller barges in or not, under single or multiple users mode is explained in FIG. 53 to FIG. 58.

Figure 59:
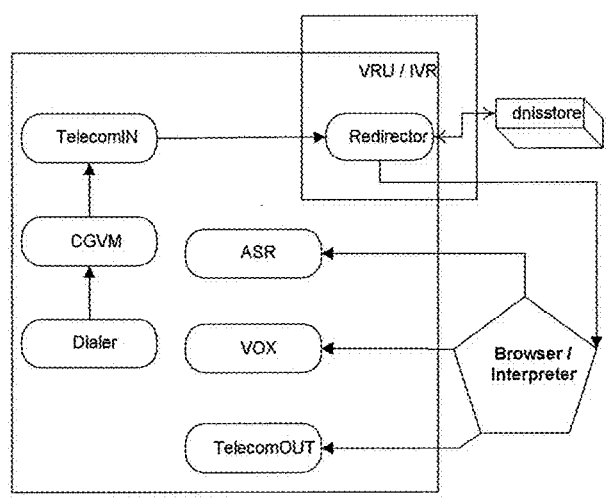
FIG. 59 the redirector in a complete simulator is illustrated.

With regard to the Helper Redirector, this is a simple redirection issue. Normally the ring message will be delivered to the redirector where the decision is made to choose the appropriate interpreter based on the dnisstore entry. The CGVM already plays the roll of the redirector in a complete simulator. Refer to the block diagram in FIG. 59 for this kind of setup.

Figure 60:
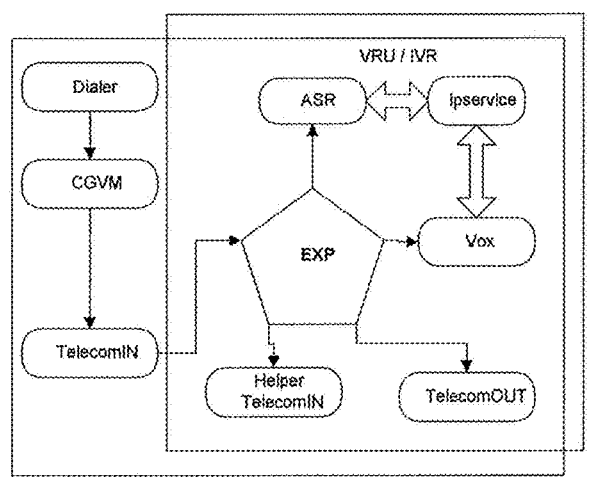
FIG. 60 the collision of the dialogic device utilization is illustrated.

For the time being we lack of integration of the exp interpreter to the simulator. However the simulator still has the ability to redirect the ring message to the exp interpreter. In this case the simulator does not get the notification of call proceeding, answer and hangup. Hence the user needs to know in advance the duration of the call and adjust the dialer accordingly. Please note that because of this short coming, it is possible that the simulator will send more than one call on the same bearer channel, were each one of these calls will be serviced by different exp virtual channels. This will result in collision of the dialogic device utilization. Refer to the block diagram in FIG. 60 for this kind of setup.

The simulator has the ability to redirect the ring message to the exp interpreter. In this case the simulator does not get the notification of call proceeding, answer and hangup. Hence the user needs to know in advance the duration of the call and adjust the dialer accordingly. It is possible that the simulator will send more than one call on the same bearer channel, were each one of these calls will be serviced by different exp virtual channels. This will result in collision of the dialogic device utilization.

The following are areas where the simulator can be used in system and application development:
  Aptera Application development
  OSB 3.0 VXML-Browser development
  Load test on the Browser server. The result of which can
    lead to the following changes
    identified the requirement for the OS upgrade
    identified that we could run the server with more
      instances of the browser by increasing the memory
    identified the bottle-neck due to flushing the logs
    Fine tuning of the browser configuration parameters
  Load test the audium application server.
    identify the maximum capacity per server
  EOS System development
    Used the simulator in conjunction with the actual vox-
      daemon in the VRU to identify the file handle leak Load test the vox daemon and libcurl library which is used to fetch the files from the web server Use the simulator in conjunction with the actual asr-daemon to prove the dtmf recognition accuracy to CME (made around 300 thousand calls. Each call had 4 dtmf recognitions. Hence we have performed 1.2 million recognitions)

Redirector development. Since redirector is the main part of the ring delivery to the browser, it was load tested to around half-a-million hits in conjunction with the real http fetch requests to the dnisstore On multiple occasions it was used in conjunction with exp to test the VRU basic functionality MTL Library Made the library multi-threaded Under heavy load condition the wicManager was crashing due to deleting inappropriate value in an array. Identified and fixed this critical bug.

Under heavy load condition, once in a while we were dropping the MTL connection and thereby loosing few MTL packets. Identified and fixed this critical bug.

Cleaned up the windows based MTL library bugs

Browser server development.

All the new features added to the browser can be first tested using the simulator before moving to the real platform. Example: Out-Of-Band, voxd dtmf collection.

The simulator can be used to fix reliably the EOS system and provided a testing platform.

VOX daemon.

The simulator can be used in conjunction with the real vox daemon to fix various bugs related to timing, resource leaks and device busies.

Noinput issue

Able to reproduce the noinput issue in the lab.

Browser vxml 2.0 product certification

The vxml forum test suite consists of around 550 test cases. Simulator can help to fully automate the testing there by being able to perform multiple iteration (run) of the entire test suite.

Automated vxml test suite development

Time driven Platform Synchronization: Any call generation tool, either commercial or in house developed, the call flow synchronization is done mainly time driven. Based on this architecture following are the basically available two categories of tools.

1. Out Dial (in-house developed)
2. Hammer[1]

[1] Hammer is the testing tool developed by Empirix corporation

Figure 61:
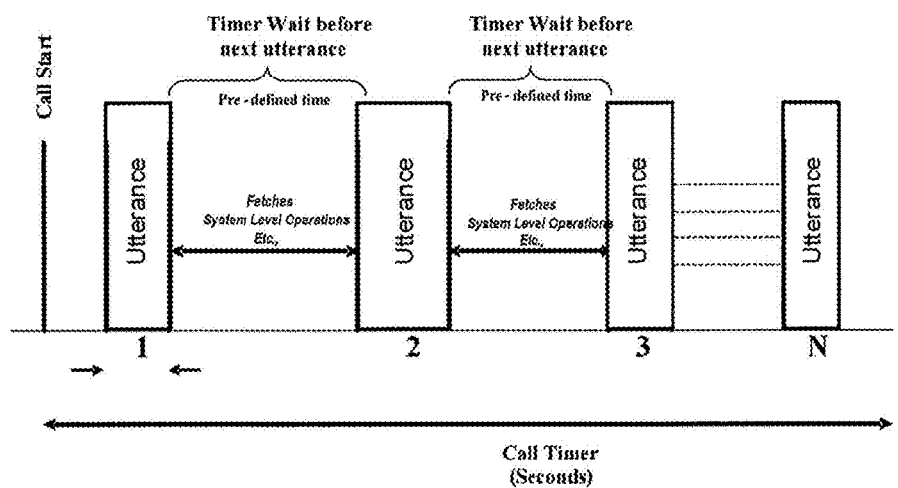
FIG. 61 illustrates the out-dial's design of generating inputs in a pre defined intervals.

Out Dial: The 'out dial' is an application developed internally for outbound call generation. The system is capable of generating DTMF and playing any voice slot. FIG. 61 illustrates the out-dial's design of generating inputs in a pre defined intervals. That means after an utterance is played, out-dial waits for 'x' amount of time and automatically plays the next utterance. Because of its simplicity, it is easy to design and run a test set. In an ideal situation, if there is no latency in the platform, then this may not be a bad system. But, in reality, there are many variables in the platform which determines the duration of the call. Normally, when the load increases, the response time from various modules in the platform tend to increase. If this behavior continues, then the out-dial's response generation will go out of synchronization. i.e., the application will be playing certain prompt, and the out-dial application will be responding with totally a different response or no response at all. Hence, the application will take an in-deterministic path. This will result in an avalanche effect, and subsequently from that point onwards the data generated from the load test will become useless. Because of this in-deterministic nature, it is hard to evaluate the result. Also, there is a possibility of generating false alarm.

Figure 62:
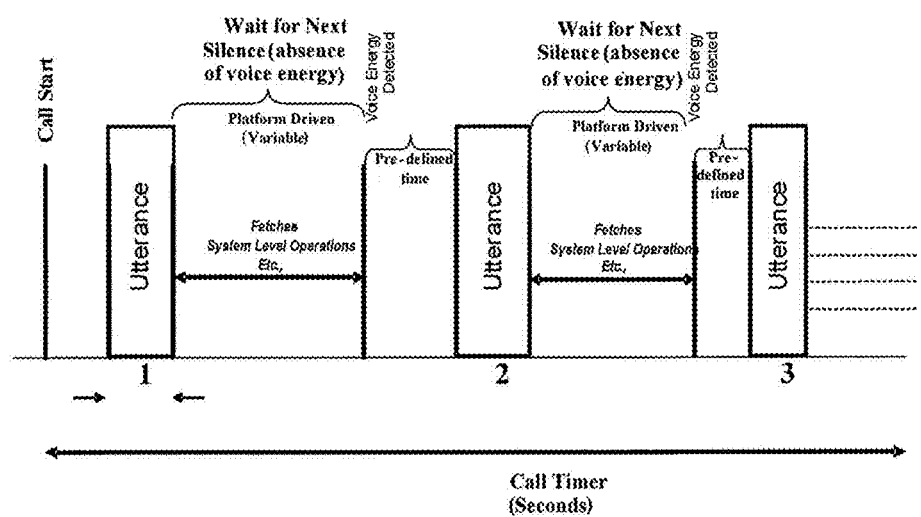
FIG. 62 illustrates the way the hammer functions. It relies on the detection or absence of the voice energy.

Hammer: Hammer is a commercial solution for load generation. Since it is controllable, and the results are mostly predictable, it is better than out-dial in many aspects. However it also cost money for maintenance and upgrades. In addition, just like its counter part out-dial, this system also generates real telephone call, and hence the load tests cost money. FIG. 62 illustrates the way the hammer functions. It relies on the detection or absence of the voice energy. Voice energy means playing of prompt, and absence of it could mean that the system is waiting for the response or pause between the prompts. In many aspects, this may be a better solution, but this also lacks certain critical points that it can go out of synchronization. The possible reasons why it could go out of synchronization are:

In a multiple step prompt, if there is latency in the system such that there is unexpectedly longer pause between the steps in the prompt, this scenario will be detected as the end of the prompt and the utterance is played at the wrong time, resulting in out-of-sync. (longer pause may be because of delayed web server response, and/or system latency)

If the fetch request to an application server takes longer time for the response, the system will asynchronously start a back ground filler play. This could be falsely identified as the real prompt and the hammer will again play the utterance at the wrong time resulting in out-of-sync.

The above mentioned scenarios may not be a common occurrence, but as the load increases, we would see situations similar to the above two, which could lead to application following an in-deterministic path. As indicated before in the out-dial section, this might result in false alarm too.

Figure 63:
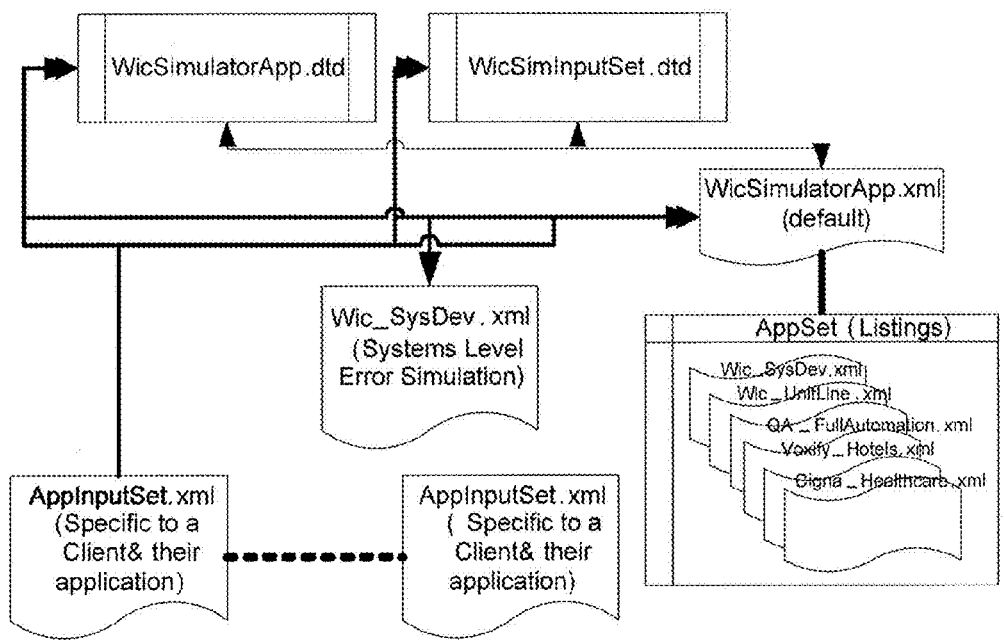
FIG. 63 the application input sets conformance to the WicSimulatorApp.dtd and WicSimInputSet.dtd and the layout is detailed.

Event Driven Platform Synchronization On the contrary to the time driven systems explained in the previous section, mainly the CVS system is event driven. Since the components are simulation of the original daemons, the events emanating form the browser directly comes to this system. In this setup, the whole call process is highly synchronized and hence highly predictable. In addition, since the browser knows the presence of this helper services, it sends additional information that could be used to further synchronize and trace the original predicted path very closely. The application input sets conformance to the WicSimulatorApp.dtd and WicSimInputSet.dtd and the layout is detailed in FIG. 63.

WicSimulatorApp.dtd

TABLE 5

WicSimulatorApp.dtd

```
<!-- WicSimulatorApp.dtd -->
<!ELEMENT WicSimulatorApp (SIMAPP+, APPSET*)>
<!ELEMENT SIMAPP (SIMINPUTSET+, DIALAUTO*,
GROUPAUTO*)>
<!ATTLIST SIMAPP name CDATA #REQUIRED>
<!ATTLIST SIMAPP client CDATA #REQUIRED>
<!ATTLIST SIMAPP interpreter CDATA #REQUIRED>
<!ATTLIST SIMAPP vxmlclient CDATA #IMPLIED>
<!ATTLIST SIMAPP asrvendor CDATA #IMPLIED>
<!ATTLIST SIMAPP app CDATA #REQUIRED>
<!ELEMENT APPSET EMPTY>
<!ATTLIST APPSET name CDATA #REQUIRED>
<!ELEMENT DIALAUTO (DIALTEST+)>
<!ATTLIST DIALAUTO name CDATA #REQUIRED>
```

TABLE 5-continued

WicSimulatorApp.dtd

```
<!ATTLIST DIALAUTO repeat CDATA #IMPLIED>
<!ATTLIST DIALTEST name CDATA #REQUIRED>
<!ATTLIST DIALTEST prewait CDATA #REQUIRED>
<!ATTLIST DIALTEST calltime CDATA #REQUIRED>
<!ATTLIST DIALTEST postwait CDATA #REQUIRED>
<!ATTLIST DIALTEST repeat CDATA #IMPLIED>
<!ELEMENT GROUPAUTO (DIALAUTOREF+)>
<!ATTLIST GROUPAUTO name CDATA #REQUIRED>
<!ATTLIST GROUPAUTO repeat CDATA #IMPLIED>
<!ATTLIST DIALAUTOREF name CDATA #REQUIRED>
```

WicSimInputSet.dtd

TABLE 6

WicSimInputSet.dtd

```
<!-- WicSimInputSet.dtd -->
<!ELEMENT SIMINPUTSET (TELECOMIN*, VOX*, ASR*, TELECOMOUT*)>
<!ATTLIST SIMINPUTSET calldata CDATA #IMPLIED>
<!ATTLIST SIMINPUTSET name CDATA #REQUIRED>
<!--
category=normal | syntaxerr | systemerr | paramerr | rangeerr | inputerr | inputerr |
earlyterm -->
<!ATTLIST SIMINPUTSET category CDATA "normal">
<!ATTLIST SIMINPUTSET callTime CDATA "-1">
<!ATTLIST SIMINPUTSET tailrepeat CDATA #IMPLIED>
<!ATTLIST SIMINPUTSET trace CDATA #IMPLIED>
<!ELEMENT RESPONDDONE (#PCDATA) *>
<!ATTLIST RESPONDDONE delay CDATA "-1">
<!ATTLIST RESPONDDONE tailrepeat CDATA #IMPLIED>
<!ATTLIST RESPONDDONE mtlidred CDATA #IMPLIED>
<!ELEMENT NORESPOND EMPTY>
<!ATTLIST NORESPOND tailrepeat CDATA #IMPLIED>
<!ATTLIST NORESPOND mtlidred CDATA #IMPLIED>
<!ELEMENT HANGUP EMPTY>
<!ATTLIST HANGUP delay CDATA "-1">
<!ATTLIST HANGUP mtlidred CDATA #IMPLIED>
<!ELEMENT SERVICEERROR (#PCDATA)*>
<!ATTLIST SERVICEERROR delay CDATA "-1">
<!ATTLIST SERVICEERROR tailrepeat CDATA #IMPLIED>
<!ATTLIST SERVICEERROR mtlidred CDATA *IMPLIED>
<!ELEMENT RESOURCEERROR (#PCDATA)*>
<!ATTLIST RESOURCEERROR delay CDATA "-l">
<!ATTLIST RESOURCEERROR tailrepeat CDATA #IMPLIED>
<!ATTLIST RESOURCEERROR mtlidred CDATA #IMPLIED>
<!ELEMENT NOINPUT EMPTY>
<!ELEMENT NOMATCH EMPTY>
<!ATTLIST NOMATCH utterance CDATA "My No Match String">
<!ELEMENT TOOMUCHSPEECH EMPTY>
<!ATTLIST TOOMUCHSPEECH utterance CDATA "Who said I speak too much. No.
Never. I speak to the point. That means I do not elaborate, expand,
explain, or go blah blah blah.">
<!ELEMENT PARAMERROR EMPTY>
<!ELEMENT SEIZEERROR EMPTY>
<!ELEMENT ROUTEERROR EMPTY>
<!ELEMENT DIALERROR EMPTY>
<!ELEMENT BRIDGEWAIT EMPTY>
<!ELEMENT BUSY EMPTY>
<!ELEMENT REJECT EMPTY>
<!ELEMENT NOANSWER EMPTY>
<!ELEMENT NETWORK EMPTY>
<!ELEMENT NEAREND EMPTY>
<!ELEMENT FAREND EMPTY>
<!ELEMENT TELECOMIN (ANSWER*)>
<!ELEMENT ANSWER (RESPONDDONE | NORESPOND | HANGUP)>
<!ELEMENT XFERCONNECTOOB (OOBERROR | NORESPOND | HANGUP)>
<!ELEMENT OOBERROR (BUSY | REJECT)>
<!ELEMENT VOX (PLAY+, RECORD*, PLAYDTMF*, GETDIGITS*)>
<!ATTLIST VOX promptstorealias CDATA #IMPLIED>
<!ATTLIST VOX tailrepeat CDATA #IMPLIED>
<!ELEMENT PLAY EMPTY>
<!ATTLIST PLAY real:play CDATA #IMPLIED>
<!ATTLIST PLAY sleep CDATA #IMPLIED>
<!ATTLIST PLAY repeat CDATA #IMPLIED>
<!ATTLIST PLAY mtlidred CDATA #IMPLIED>
<!ELEMENT RECORD
(RESPONDDONE | RESOURCEERROR | SERVICEERROR | RECORDWAIT | NORESPOND | HANGUP)>
<!ELEMENT RECORDWAIT EMPTY>
<!ELEMENT PLAYDTMF
(RESPONDDONE | RESOURCEERROR | SERVICEERROR | NORESPOND | HANGUP)>
<!ELEMEN? GETDIGITS (RESPONDDONE | SERVICEERROR | NORESPOND | HANGUP)>
```

TABLE 6-continued

WicSimInputSet.dtd

```
<!ATTLIST GETDIGITS digits CDATA #IMPLIED>
<!ELEMENT ASR (NEWCALL*, SETPARAM*, LOADGR*, ACTGR*, DEACTGR*, FREEGR*, NL+)>
<!ATTLIST ASR asrserver CDATA #IMPLIED>
<!ATTLIST ASR tailrepeat CDATA #IMPLIED>
<!ELEMENT NEWCALL
(RESPONDDONE | RESOURCEERROR | SERVICEERROR | NORESPOND | HANGUP)>
<!ELEMENT SETPARAM
(RESPONDDONE | RESOURCEERROR | SERVICEERROR | PARAMERROR | NORESPOND | HANGUP)>
<!ELEMENT LOADGR
(RESPONDDONE | RESOURCEERROR | SERVICEERROR | NORESPOND | HANGUP)>
<!ELEMENT ACTGR
(RESPONDDONE | RESOURCEERROR | SERVICEERROR | NORESPOND | HANGUP)>
<!ELEMENT DEACTGR
(RESPONDDONE | RESOURCEERROR | SERVICEERROR | NORESPOND | HANGUP)>
<!ELEMENT FREEGR
(RESPONDDONE | RESOURCEERROR | SERVICEERROR | NORESPOND | HANGUP)>
<!ELEMENT NL
(NOINPUT | NOMATCH | SERVICEERROR | RESOURCEERROR | ASRRESULT1+ | ASRRESULT2+ |
NLUS
ERWAIT | NORESPOND | HANGUP)>
<!ATTLIST NL bargedin CDATA #IMPLIED>
<!ATTLIST NL startrec CDATA #IMPLIED>
<!ATTLIST NL timespoke CDATA #IMPLIED>
<!ATTLIST NL repeat CDATA #IMPLIED>
<!ATTLIST NL mtlidred CDATA #IMPLIED>
<!ELEMENT ASRRESULT1 (#PCDATA | SLOTVALCONF)*>
<!ATTLIST ASRRESULT1 utterance CDATA #IMPLIED>
<!ATTLIST ASRRESULT1 textmode CDATA #IMPLIED>
<!ATTLIST ASRRESULT1 asrnlsmlresult CDATA #IMPLIED>
<!ATTLIST ASRRESULT1 confidence CDATA #IMPLIED>
<!ATTLIST ASRRESULT1 grammarname CDATA #IMPLIED>
<!ATTLIST ASRRESULT1 grammarconfidence CDATA #IMPLIED>
<!ELEMENT ASRRESULT2 EMPTY>
<!ATTLIST ASRRESULT2 utterance CDATA #IMPLIED>
<!ATTLIST ASRRESULT2 nlsmlanswer CDATA #REQUIRED>
<!ELEMENT SLOTVALCONF EMPTY>
<!ATTLIST SLOTVALCONF name CDATA #REQUIRED>
<!ATTLIST SLOTVALCONF confidence CDATA #REQUIRED>
<!ATTLIST SLOTVALCONF value CDATA #REQUIRED>
<!ELEMENT NLUSERWAIT EMPTY>
<!ATTLIST NLUSERWAIT choice CDATA #IMPLIED>
<!ELEMENT TELECOMOUT (BRIDGESUMMA*,BRIDGEDIRECTPBX*)>
<!ELEMENT BRIDGESUMMA
(SEIZEERROR | ROUTEERROR | DIALERROR | SUMMAERROR | BRIDGERESULT | BRIDGEWAIT |
NORE
SPOND | HANGUP)>
<!ATTLIST BRIDGESUMMA dialtime CDATA #IMPLIED>
<!ATTLIST BRIDGESUMMA postdialtime CDATA #IMPLIED>
<!ELEMENT SUMMAERROR (BUSY | NOANSWER | NETWORK)>
<!ELEMENT BRIDGERESULT (HANGUP | NEAREND | FAREND | NETWORK)>
<!ATTLIST BRIDGERESULT talktime CDATA #IMPLIED>
<!ELEMENT BRIDGEDIRECTPBX
(ROUTEERROR | DIALERROR | BRIDGERESULT | BRIDGEWAIT | NORESPOND | HANGUP)>
```

WicSimulatorApp.xml

TABLE 7

WicSimulatorApp.xml

```
<?xml version="1.0" ?>
<!DOCTYPE WicSimulatorApp [
<!ENTITY % WicSimulatorApp SYSTEM
"file:///c:/wic/Application/WicSimulatorApp.dtd">
%WicSimulatorApp;
<!ENTITY % SIMINPUTSET SYSTEM
"file:///c:/wic/Application/WicSimInputSet.dtd">
%SIMINPUTSET;
]>
<!--
WicSimulatorApp.xml
Main simulator application set values used for simulation
"default " <SIMAPP> defined in this file is the ultimate default
parameters
-->
<WicSimulatorApp>
<SIMAPP name="default " client="WIC " interpreter="VXML-sw2 "
app="default">
<!--
  Since this the default set make sure all the attributes have
some default value
  In the DTD definition most of the attributes have #IMPLIED as
the default value
  I used the inheritance concept (this SIMPUTSET is equivalent
of the base class) to get the ultimate attribute value
-->
<SIMINPUTSET name="default " category="inputerr "
tailrepeat="last " trace="off">
   <VOX promptstorealias="" tailrepeat="last">
     <PLAY realplay="false " sleep="5000"
repeat="0"/>
   </VOX>
   <ASR tailrepeat="last">
     <NL bargedin="false " startrec="2000 "
timespoke="1000 " repeat="0">
```

TABLE 7-continued

WicSimulatorApp.xml

```
            <NOINPUT />
          </NL>
        </ASR>
        <TELECOMOUT>
          <BRIDGESUMMA dialtime="3"
postdialtime="500">
            <BRIDGERESULT talktime="5">
              <FAREND />
            </BRIDGERESULT>
          </BRIDGESUMMA>
        </TELECOMOUT>
      </SIMINPUTSET>
      <!-- Load Test gets the "default" parameters -->
      <SIMINPUTSET name="Load Test: Play-None. Asr-noinput"
category="inputerr" />
      <SIMINPUTSET name="Basic: Play-All. Asr-Wait"
category="interactive" tailrepeat="last" trace="on">
        <VOX>
          <PLAY realplay="true"/>
        </VOX>
        <ASR>
          <NL bargedin="false">
            <NLUSERWAIT />
          </NL>
        </ASR>
      </SIMINPUTSET>
    </SIMAPP>
<!--
The <APPSET> listing here is what the simulator cares about
each name represent the corresponding filename where the <SIMAPP>
for that application is defined
-->
    <APPSET name="CME_test" />
    <APPSET name="wic_SysDev" />
    <APPSET name="wic_StaticVxml" />
    <APPSET name="wic_UnitLine" />
    <APPSET name="wic_TransferTest" />
    <APPSET name="wic_PromptTest" />
    <APPSET name="wic_RecordTest" />
    <APPSET name="wic_SimpleOSR" />
    <APPSET name="wic_ThreeFormsAllSameGrammars" />
    <APPSET name="wic_Backend" />
    <APPSET name="wic_TgPoller" />
    <APPSET name="QA_FullAutomation" />
    <APPSET name="QA_Chapter1" />
    <APPSET name="QA_Chapter2" />
    <APPSET name="QA_Chapter3" />
    <APPSET name="QA_Chapter4" />
    <APPSET name="QA_Chapter5" />
    <APPSET name="QA_Chapter6" />
    <APPSET name="Apptera_Finance" />
    <APPSET name="Apptera_Test1" />
    <APPSET name="Apptera_Test2" />
    <APPSET name="Anexsys_Epay" />
    <APPSET name="Voxify_Test1" />
    <APPSET name="Stts_Test1" />
    <APPSET name="Cigna_Healthcare" />
    <APPSET name="Cigna_Healthcare_Lab" />
    <APPSET name="Cigna_Healthcare_QA" />
  </WicSimulatorApp>
```

Figure 64:
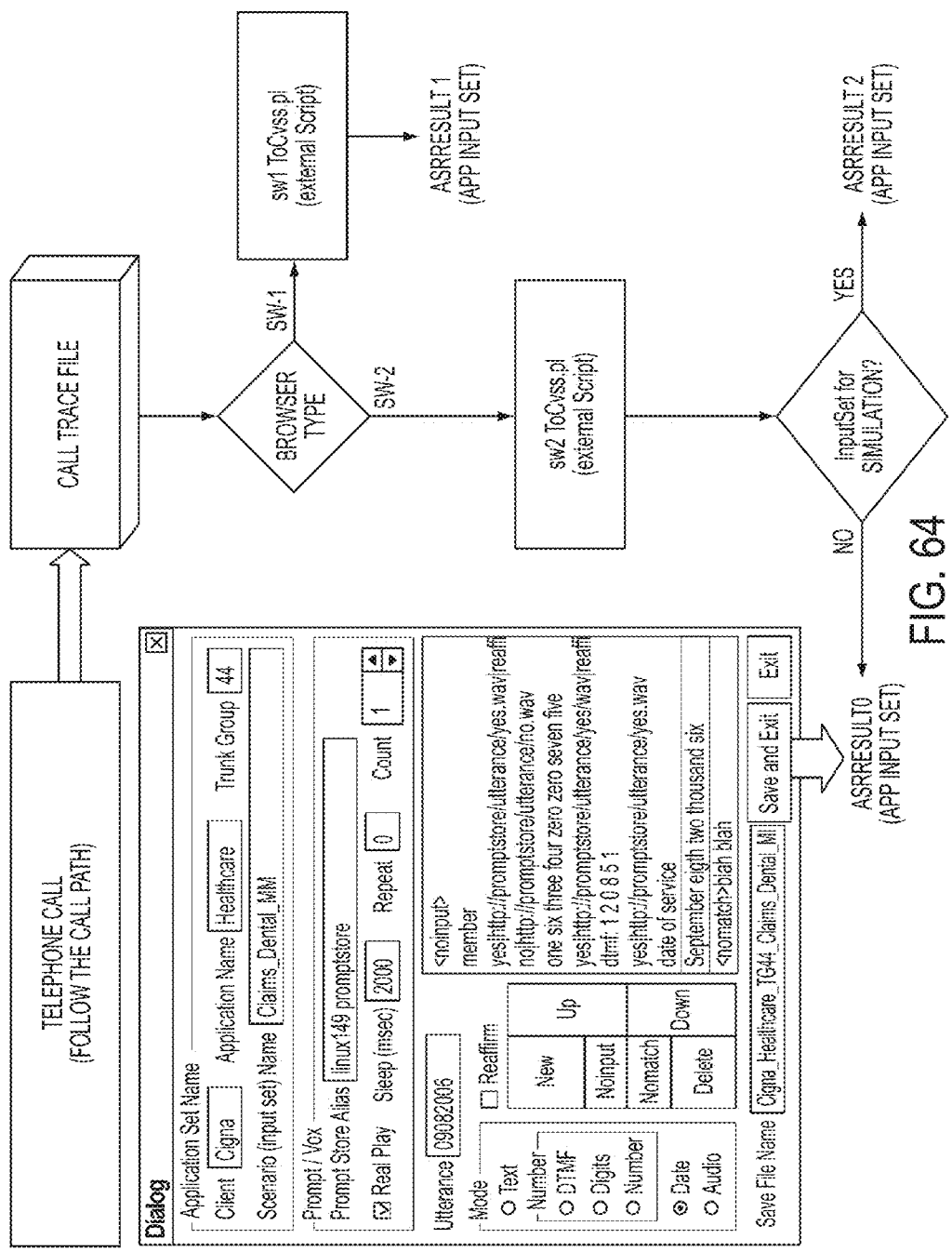
FIG. 64 shows different ways to create the input set.

Call Flow Input Set Design: The input set specific to a particular application and call flow is created by the systems engineer. With appropriate training an application developer also may add new input sets. Please note that since the CVSS purely relies on this input sets for its operation, it is critical to generate the appropriate xml file without any syntax error. The FIG. 64 shows different ways to create the input set.

Figure 65:
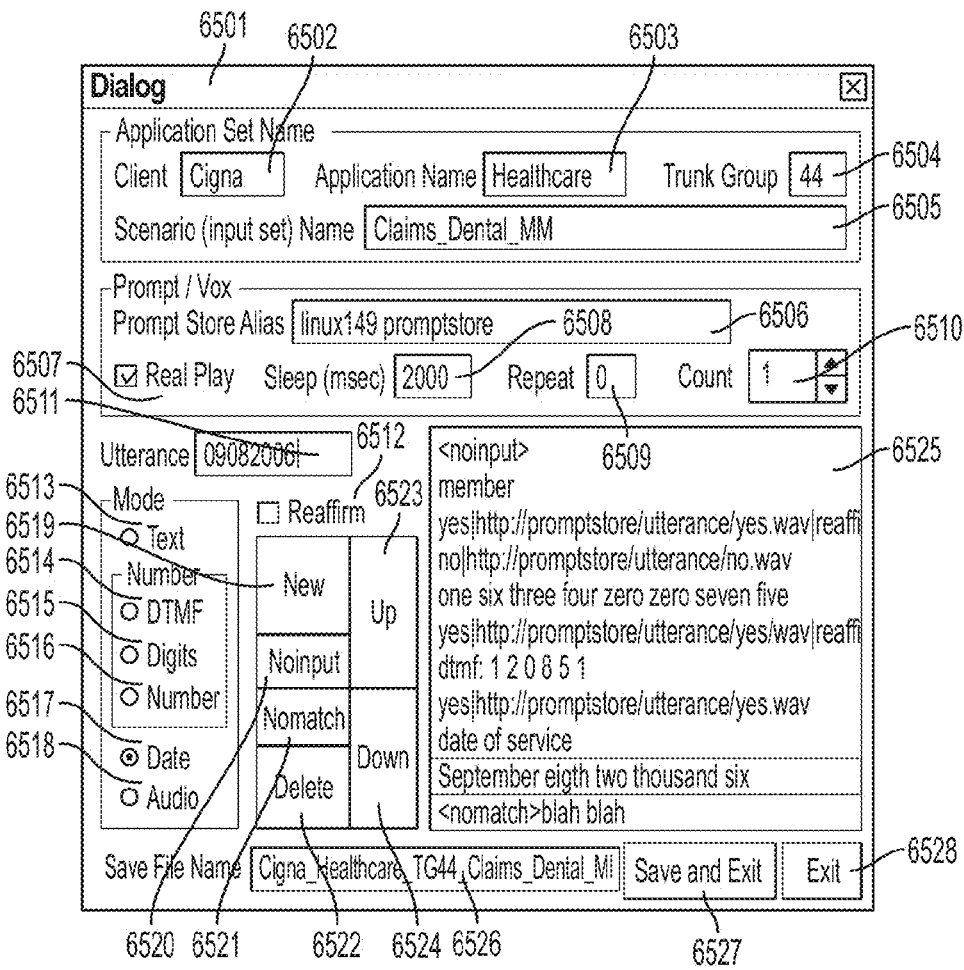
FIG. 65 is a snap shot of the editor to generate call flow input set.

Call Flow Input Set Editor: FIG. 65 is a snap shot of the editor to generate call flow input set. The controls are numbered in the figure and the explanation for each one of the items is as follows 1. Title Bar: This is just a title bar showing that this is a Call Flow Input Set Editor 6501.
2. Client: The name of the client to this application belongs to 6502.
3. Application Name: The name of the application 6503.
4. Trunk Group: Location or site where this application set was gathered or will be executed 6504.
5. Scenario: Test case scenario, giving a brief description of the call flow, that we are testing within the application 6505.
6. Prompt Store Alias: Since the CVSS can be run from any site, and the trunk group number and the location site are spoofed to make the CVSS part of that TG under test, it is appropriate to use the right web server. If this is not set, we may not be able to play the prompt. On the contrary if this is incorrectly set, we will be pulling the prompt from a different site. If the real play is disabled or the speech is muted, then this parameter setting is of less significance 6506.
7. RealPlay: Ability to enable or disable the real play of a prompt. It is possible to specifically tune the $N^{th}$ prompt (if needed) 6507.
8. Sleep Time: If the prompt is not played then this parameter value will be used to determine how long the prompt engine sleeps to simulate the play time. (NOTE: If the extraction Perl script is done rightly, then this timings we be extracted to the closest milli second approximation, there by the simulated call will be the exact replica of the original call from where the input set is extracted 6508.
9. Repeat: In a multi set Prompt input set parameter listing, the number of times each step will be repeated (if needed) 6509.
10. Prompt Count: Number of individual steps in the prompt input set. As mentioned earlier the reason to have multiple lines of entry is to have the ability to fine tune any individual step 6510.
11. Utterance: Current utterance 6511.
12. Reaffirm: Flag to identify whether the current utterance is a reaffirming the previous utterance (example: the system prompts to say your date of birth. You play the date utterance. The system comes back to re confirm the given input) 6512.
13. Utterance Text Mode: The current utterance is a raw text (no modification will be performed on it). (NOTE: the default strings such as yes, no, etc., will also include default audio path) 6513.
14. Utterance DTMF: The utterance is a DTMF. The string will be modified as indicated in FIG. 65 6514.
15. Utterance Digits in Speech: The digits in the utterance will be spoken out as individual digits. The string will be modified as indicated in FIG. 65 6515.
16. Utterance Number in Speech: The number in the utterance will be spoken out as a number (without 'and' conjunction). The string will be modified as indicated in FIG. 65 6516.
17. Utterance Date: The date in the utterance will be spoken out. If the numbers do not confirm to the date format, then it will be interpreted as normal raw text. The string will be modified as indicated in FIG. 65 6517.
18. Utterance Audio: The utterance is an audio file. 'http://prompstore/utterance' is the default web server location for the utterances. The string will be modified as indicated in FIG. 65 6518.
19. New Entry: The entry in the utterance field (11) will be translated according the selection (13-18), and will be added to the utterance list 6519.
20. Noinput Data: Press button to add a '<noinput>' entry to the utterance list (25) 6520.

21. Nomatch Data: Press button to add a '<nomatch>' entry to the utterance list (25). The utterance (13) field's content will be the utterance played to generate this nomatch in a real ASR based setup 6521.
22. Delete Entry: Press button to delete an entry from the utterance list (25) 6522.
23. Move a Data Up in the List: Move the currently selected data up in the utterance list (25) 6523.
24. Move a Data Down in the List: Move the currently selected data down in the utterance list (25) 6524.
25. Utterance Listing: A list of utterances determining the call flow 6525.
26. Save to File Name: This is an automated field. The content is determined by the application set name fields (2-5). Further, the content of it can be changed to any filename 6526.
27. Save and Exit: Press button to generate an application input set file based on the contents entered in this dialog. The field 26 above identifies the destination filename 6527.
28. Exit (No Save): Ignore the dialog interaction and exit 6528.

Utterance Data and its Type

Figure 66:
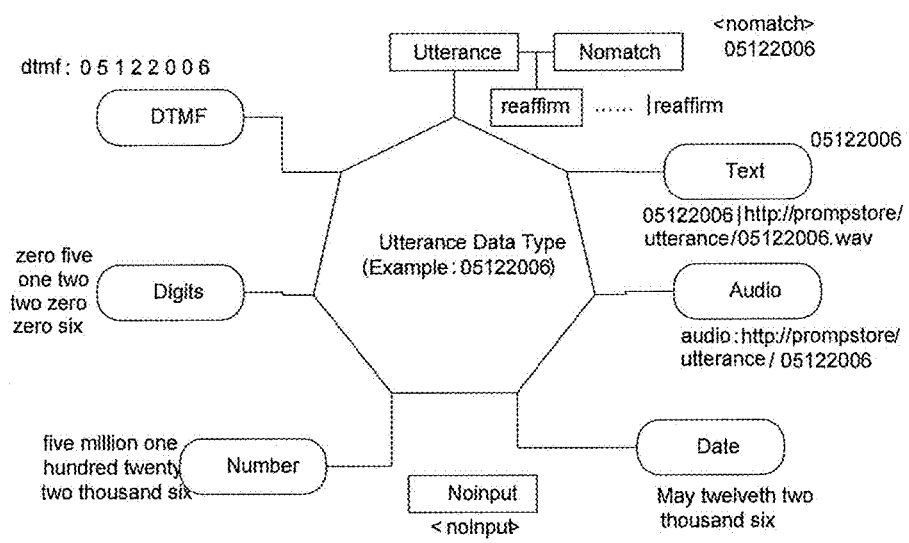
FIG. 66 is an example of an utterance data and its type.

FIG. 66 is an example of Utterance Data and Its Type

FIG. 67 is an example of a single application set flow chart and FIG. 68 through FIG. 68E is an example of a hammer subset flow chart.

TABLE 8

| WicSimulatorApp.xml |
|---|
| <?xml version="1.0" ?> |
| <!DOCTYPE WicSimulatorApp SYSTEM |
| "file:///c:/wic/Application/WicSimInputSet.dtd"> |
| <!-- Automatically Generated by sw2TraceToSimAppXml.pl - Do Not Edit --> |
| <SIMINPUTSET name="151904.1170447544.8115004" tailrepeat="last" trace="on"> |
|   <VOX promptstorealias="linux149 promptstore"> |
|     <PLAY realplay="true" sleep="2000" repeat="0" mtlidref="1" /> |
|   </VOX> |
|   <ASR> |
|     <NL> |
|       <ASRRESULT0 utterance="dtmf:1 2 3 4 5" /> |
|     </NL> |
|     <NL> |
|       <ASRRESULT0 utterance="February seventh two thousand seven" /> |
|     </NL> |
|     <NL> |
|       <ASRRESULT0 utterance="one three five" /> |
|     </NL> |
|     <NL> |
|       <ASRRESULT0 utterance="twelve thousand seventy five" /> |
|     </NL> |
|     <NL bargedin="false" startrec="2000" timespoke="100" mtlidref="1"> |
|       <NOINPUT/> |
|     </NL> |
|     <NL> |
|       <ASRRESULT0 utterance="Tom" /> |
|     </NL> |
|     <NL> |
|       <ASRRESULT0 utterance="dtmf:2" /> |
|     </NL> |
|     <NL bargedin="false" startrec="2000" timespoke="100" mtlidref="1"> |
|       <NOMATCH/> |
|     </NL> |
|     <NL> |
|       <ASRRESULT0 utterance="dtmf:1" /> |
|     </NL> |
|   </ASR> |
| </SIMINPUTSET> |

Figure 69:
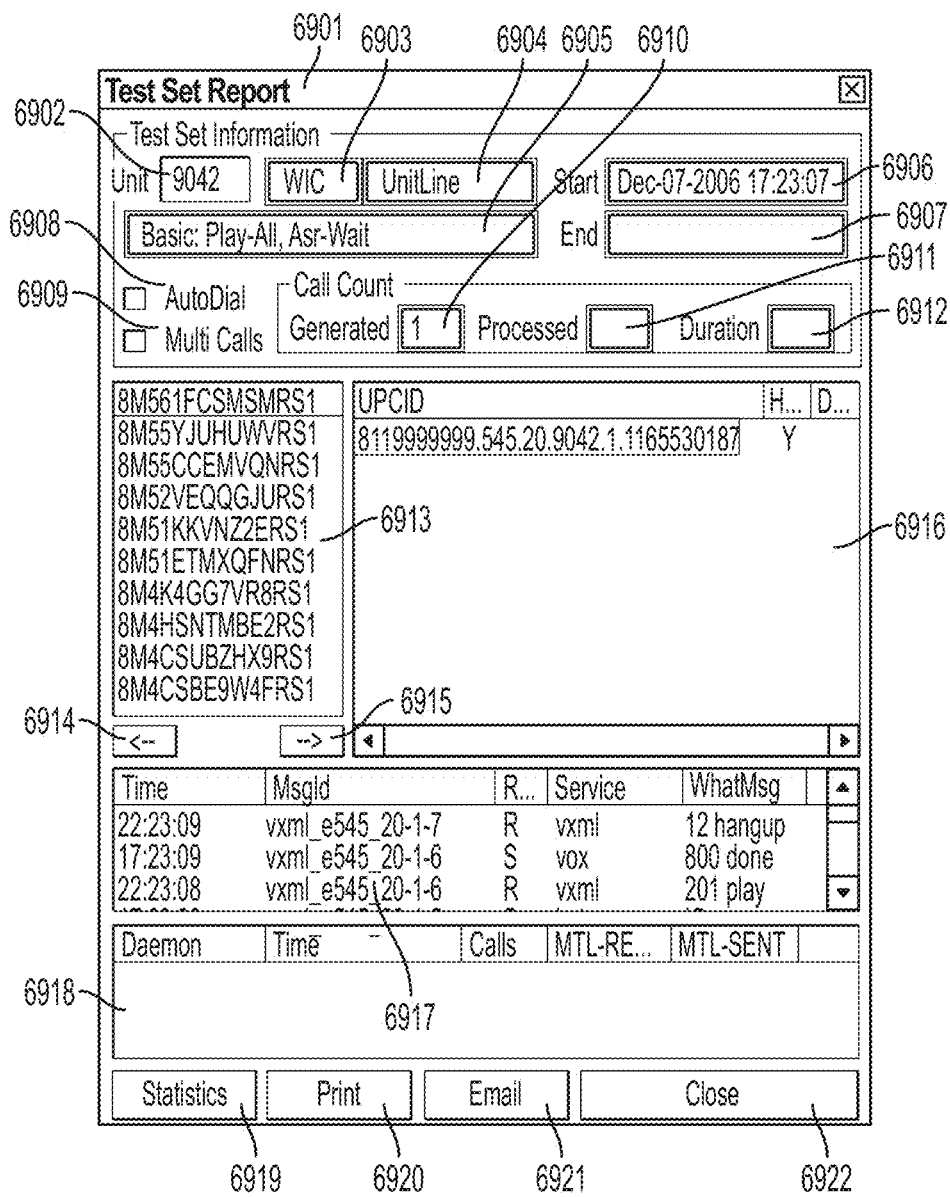
FIG. 69 the controls specific to the test set report are numbered.

Test Set Report A specific report can be collected based on the UTSID test set grouping. The controls specific to the test set report are numbered in the FIG. 69 and the explanations for each one of the items is as follows:

1. Test Set Report Controls: Title bar indicating that the window is for test set report 6901.
2. CVSS Unit ID: Number that indicates which CVSS has generated this call 6902.
3. Client Name: The client to whom this application set refers to 6903.
4. Client Application Name: The name of the application that was run 6904.
5. Input Set: The sub input set to the application mentioned in field (4) 6905.
6. Call Start: Call start time 6906.
7. Call End: Call end time 6907.
8. AutoDial: Is the current test set generated calls under autodial condition 6908.
9. Multi Calls: Is the current test set generated single or multiple calls 6909.
10. Generated Call Count: Number of calls attempted 6910.
11. Processed Call Count: Number of calls actually processed 6911.
12. Duration: Total Duration of the test set 6912.
13. UTSID Listing: A list of know UTSIDs in the chronologically backward order 6913.
14. Previous Set: Display the previous set (older) of UTSIDs in the listing window (13) 6914.
15. Next Set: Display the next set (most recent) of UTSIDs in the listing window (13) 6915.
16. Call Listing: List of calls processed under this test set. Displays the UPCID, whether the browser hangup the call, and duration 6916.
17. MTL Messages Listing: List of MTL message transactions to process the call (NOTE: the dialer should have enabled this feature before starting the test set) 6917.
18. Daemon Statistics: Statistics of each daemon about how many calls, and MTL control messages that it handled 6918.
19. Statistical Summary: Press button to display the summary of the test set in a text format 6919.
20. Print: Print the statistical summary for the current test set (currently partially implemented feature) 6920.
21. A: E-mail the statistical summary for the current test set 6921.
22. Close: Exit the dialog 6922.

Figure 70:
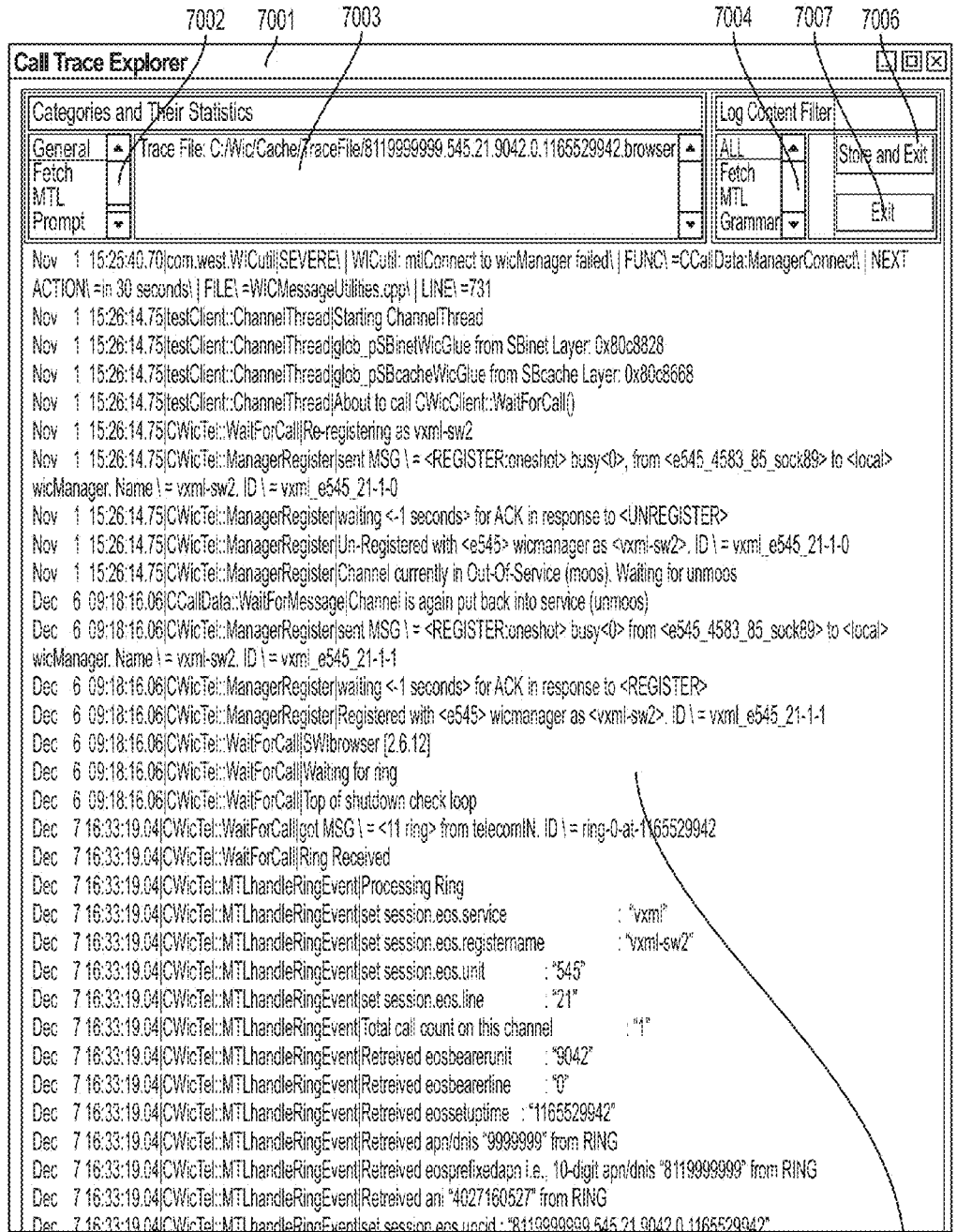
FIG. 70 the controls specific to the call trace file explorer are numbered.

Call Trace File Explorer: Individual call's trace information can be viewed using an in-built explorer (viewer). Multiple level of filtering can be set to isolate the data that is specific interest. In addition, a good summary of call status is evaluated and displayed. The controls specific to the call trace file explorer are numbered in the FIG. 70 and the explanations for each one of the items is as follows:

1. Call Trace File Controls: Title bar indicating that the window is for call trace file explorer 7001.
2. Call Statistics Categories: Categories by which the statistics is grouped. The possible values are: General, Fetch, MTL, Prompt, and ASR 7002.
3. Calls Statistics: The statistics for the category chosen in the option (2) control 7003.
4. Log Content Filter: Pre defined filters to apply on the browser trace file. If any specific filter (i.e., other than ALL) is chosen, then only the information pertaining to that filter will be displayed 7004.

5. Trace File Content Viewer: This viewer widow will display the content of the tract file as per the selected filter(s) in 4 7005.
6. Store and Exit: Since this file is fetched directly from the browser server, by pressing this option, the file can be stored to the local system 7006.
7. Exit: Exit from this explorer window 7007.

Browser Server Username Password Validate: As mentioned above when we fetch the file from the browser server via ftp, depending on how the server is setup, the user has to specify their own username and password or generic distribution username and password (example: wi:wi). In addition, since the call setup time is adjusted to the regional setting in the simulator server, it may be necessary to readjust the call time and the corresponding day of the week value in the file path.

Figure 71:
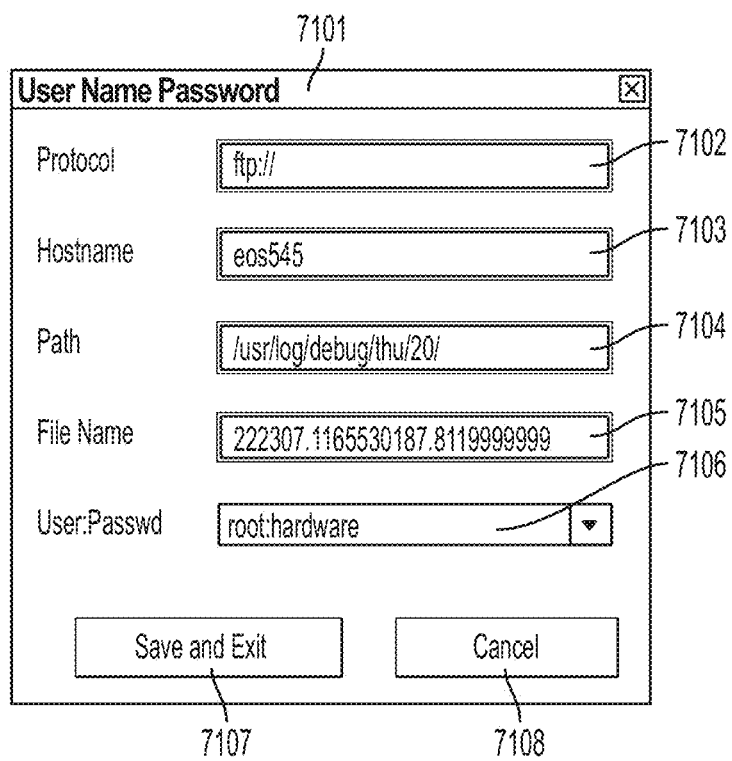
FIG. 71 the controls specific to the username and password validation are numbered.

The controls specific to the username and password validation are numbered in FIG. 71 and the explanations for each one of the items is as follows:
1. Username Password Validation Controls: Title bar indicating that the window is for username and password validation 7101.
2. Protocol: Protocol specified in the URL 7102.
3. Hostname: Hostname from the URL 7103.
4. Path: Path of the file in the remote browser server 7104.
5. FileName: Exact file name as per DDMMSS.eossetuptime.prefixdnis format 7105.
6. Username and Password: The username and password used to fetch the file from the browser server 7106.
7. Save and Exit: Save any changes made to the filename (5) and/or username and password (6) 7107.
8. Cancel: Ignore any changes, and exit from this window 7108.

Figure 72:
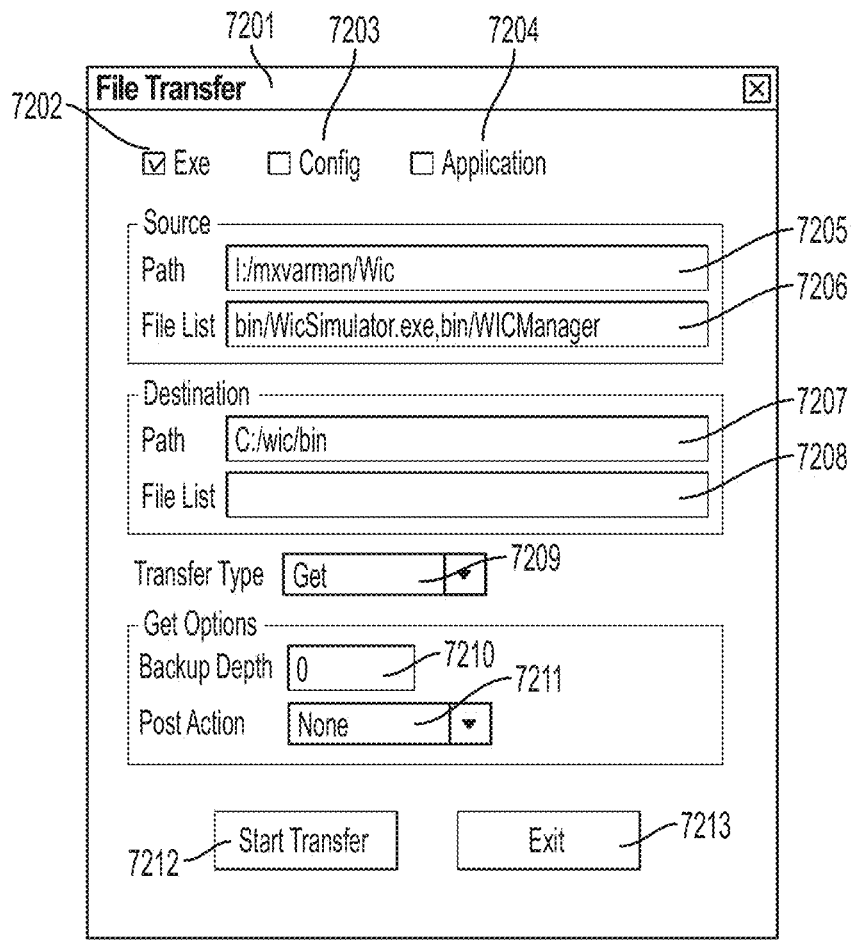
FIG. 72 the controls specific to the remote software upgrade are numbered.

A Remote Software Upgrade: The controls specific to the remote software upgrade are numbered in FIG. 72 and the explanations for each one of the items is as follows:
1. Remote Software Upgrade Controls: Title bar indicating that the window is for call remote software upgrade 7201.
2. Exe Files: A flag to list all the known executable files. Then edit the list for the only the required files 7202.
3. Config Files: A flag to list all the known configuration files. Then edit the list for the only the required files 7203.
4. Application: A flag to list all the known application xml files. Then edit the list for the only the required files 7204.
5. Source Path: The path where the source files are stored. Since the request will be made to the remote CVSS, this source might point to either networked shared drive or corporate ftp site path 7205.
6. File Listing: The comma separated list of files that need to be fetched 7206.
7. Destination Path: This destination path is typically the local file system in the remote CVSS 7207.
8. Destination File Listing: If the fetched file need to be stored in a different file, then use this comma separated list to identify the destination file name. If nothing is defined for any item in the list, then the destination filename will be same as the source filename 7208.
9. Get or Put Option: Based on if it is a get or put (post) option, the controls 5-8 will determine whether the source and destination is from remote and local correspondingly 7209.
10. Backup Depth: If this value is greater than '0' then the current file with the same filename will be backed up in the same location. The depth determines how many level of old copies are kept 7210.
11. Post Action: After the fetch operation is completed, the information on this field will determine the post action performed on the destination unit. The possible options are: none, stop, start, restart, pause, and resume 7211.
12. Start Transfer: Press button to initiate the actual fetch action 7212.
13. Exit: Exit from this dialog 7213.

Call Calculator: The main purpose of this calculator is to estimate the load and stress level during a load test. The type of load has a direct impact on how the platform is expected to perform. It is essential to know the exact nature of the load to conclude on the actual performance of the platform. Also, when there is a specific intension of reproducing a certain error condition, it is vital to stay close to the calculated load. In addition if we are evaluating the platform for a client's particular requirement, it is essential that we meet or exceed the realistic expectation.

The dialer requires the following four parameters to generate the load
Number of calls per batch
Intercall period
Batch period
Previous active call handling procedure
hangup or
skip These parameters are closely inter-coupled that a slight variation of any one of them could result in a drastic load variation. Given these five parameters, when we calculate the permutation, it will result in large data points. At this point, it will be very difficult to estimate the expected behavior with these set parameters. Hence it becomes very critical that we have an automated computation tool such as this 'call calculator' to know what result to expect.

Figure 73:
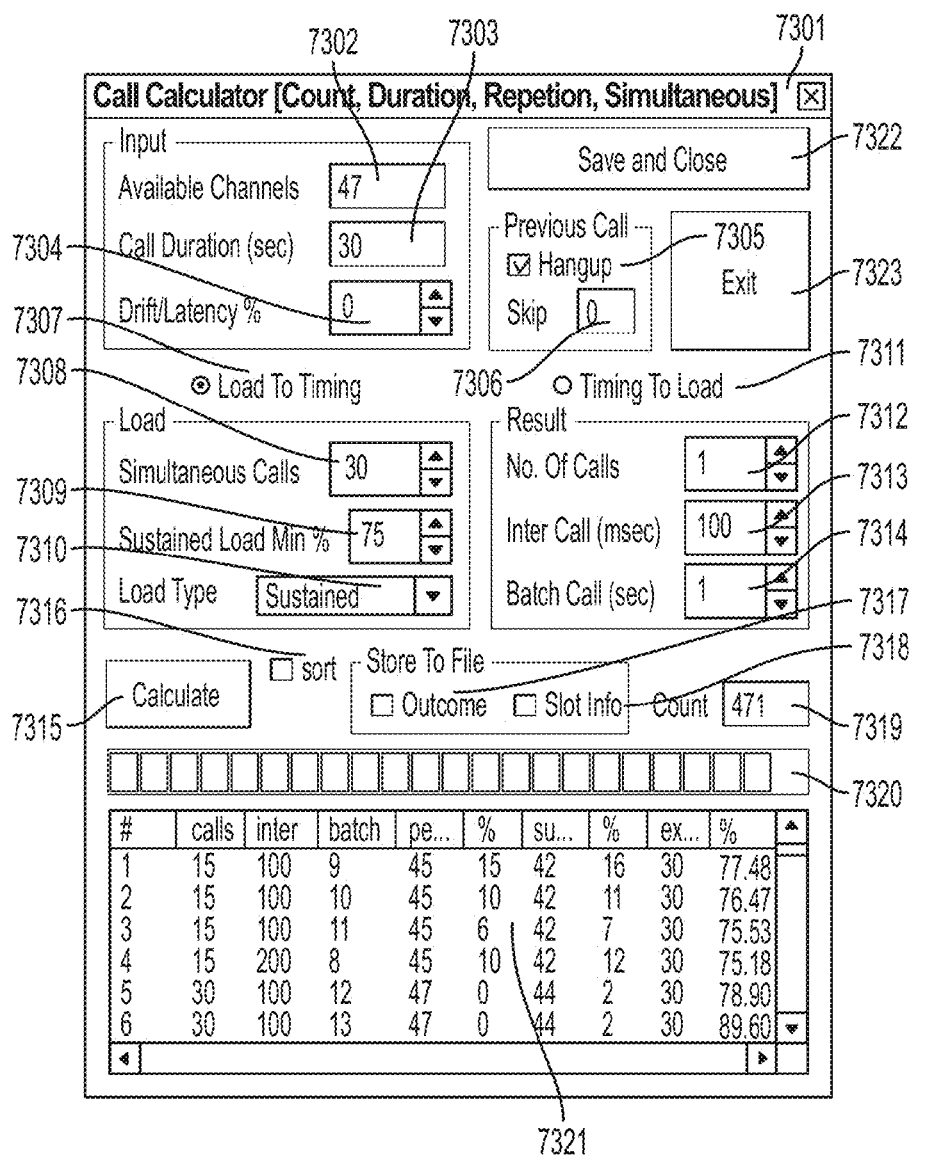

The controls specific to the call calculation are numbered in FIG. 73 and the explanations for each one of the items is as follows:
1. Call Calculator Controls: Title bar indicating that the window is for call calculator controls 7301.
2. Available Channels: Available maximum simultaneous channels 7302.
3. Call Duration (sec): Duration of the call 7303.
4. Drift/Latency: In a loaded scenario, the duration of the call will drift. The added latency will result in longer call. This is very much subjective. The drift is directory proportional to the simultaneous calls processed 7304.
5. Previous Call Hangup: The decision whether to hang the previous call or not, when the previous call in that channel is still busy and the generator is ready to generate the next call in the given channel 7305.
6. Pervious call skip: This parameter is used in conjunction with the previous call hangup (5) parameter. If this number is set to a number above '0', then even if the time is ready to generate next call, skip this many number of times before hangup. (Please note, that if the 'previous call hangup' flag is not set, then this setting is meaningless) 7306.
7. Load to Timing Choice: Selection that decides that the calculation is to determine data points for the given load details 7307.
8. Load Simultaneous Calls: Expected simultaneous calls 7308.
9. Sustained Load Min %: Minimum percentage of the time the expected simultaneous calls (8), will be sustained 7309.

10. Load Type: Type of load whether it is even, peak, burst, choppy, and sustained 7310.
11. Timing to Load Choice: Selection that decides that the calculation is to determine data point for the given specific call generation timing data 7311.
12. Number of calls per batch: Number of calls that will be placed in one batch 7312.
13. Inter Call Duration (msec): The time period (in milliseconds), between the calls with in the batch 7313.
14. Batch Call Duration (sec): Duration between repeat batches 7314.
15. Calculate: button press to invoke the calculator number crunching operation 7315.
16. Outcome Sort: Sort the outcome result 7316.
17. Outcome—Save To File: Save the final outcome to a file. This option is useful for research purposes 7317.
18. Slot Information—Save To File: Save the intermediate slot information that is used in calculation to a file. This option is useful for research purposes 7318.
19. Outcome Count: After the calculation, this field displays the number of data points that are included in the outcome list 7319.
20. Outcome Progress Monitor: A progress indicator, to monitor the outcome number crunching 7320.
21. Outcome Display: The complete list of outcome result 7321.
22. Save and Close: Save the single point call generation data (12, 13, 14) and exit 7322.
23. Exit: Exit without saving 7323.

Load Design Aspect: Generally when one designs a test plan, the natural questions to ask are as follows:

TABLE 9

Load related questions and reasons to design a testing plan

| Question | Reason |
| --- | --- |
| What is the expected sustained simultaneous calls | making sure the platform can with stand that sustained load |
| What % of time the load is expected to sustain | Determining the channel capacity and availability |
| Type of load | Depending on the nature of event or application, the load frequency pattern. i.e., cyclic, peak, burst, choppy, sustained<br>Ex: If it is a one time television event and collecting votes:- sustained peak load |

Figure 74:
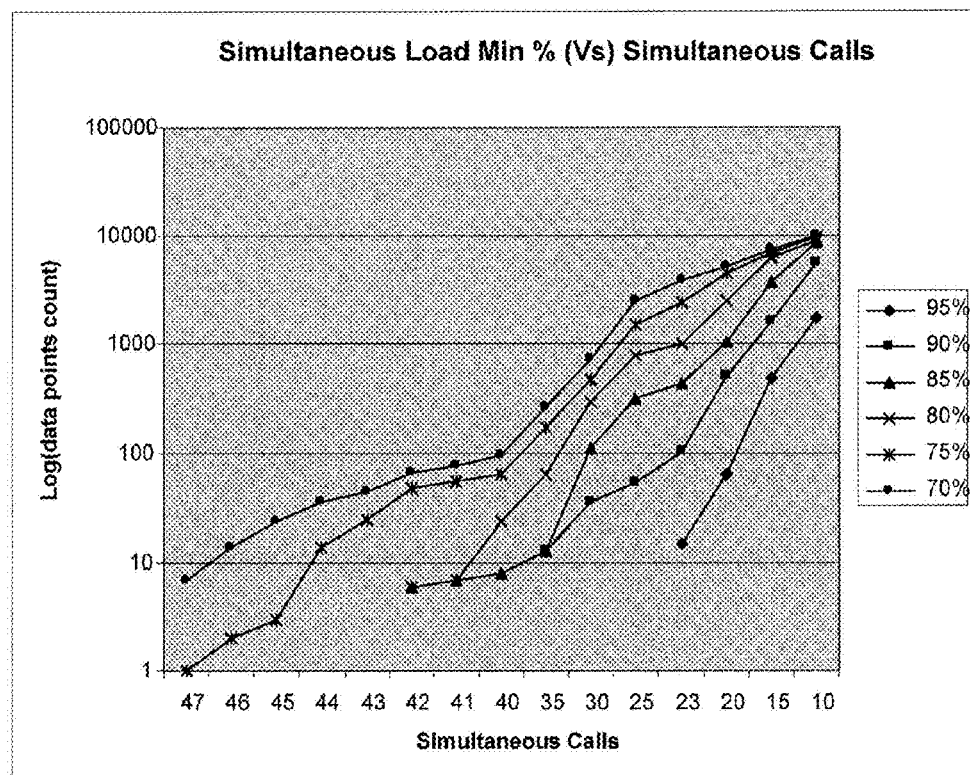
FIG. 74 other loads type are illustrated.

Based on the questions as listed in Table 9, posed while designing a testing plan for the platform, and depending on the platform capacity, various possibilities of dialer settings are possible. Fully sustained load type is the only straight forward setting which does not result in large permutation possibilities. For other load types, please note in the FIG. 74 below, as the expected average % of time to sustain the load decreases, there are more possible input data points that can be selected to generate the load. This complicates the scenario of deciding what the right settings are. At this point the expected type of load can narrow down the selection. Again, it is very much subjective decision.

Load Pattern: Depending on the generated ring pattern the load can be categorized to the following types Cyclic: Evenly distributed sustained load. Example: Banking, Insurance query system.
Peak: Interested in generating the max peak. Your aim here is to generate at least 'x' # of calls, guaranteed for 'y' % of the time. Ex: Guaranteed to have 30 calls for >=80% of the time. Example: Calling card bridge transferred calls
Burst: dump the calls in a burst (wait long enough to complete as much calls as possible. Example: events similar to television pledge, where different VIPs appear at various times, interacting with caller
Choppy: dump the calls in a burst and hangup the calls immediately (or after short call duration). Example: statistics collection for television events or sporting events. The events may be either seasonal such as soccer, boxing, etc., or one time event such as dancing, debate, etc.,
Sustained: initially call ramps up to the required level and sustain at that level till the end of the test. Example: Promotional merchandise sale at the end of the sporting event.

When a test environment is built for a certain type of application, or certain scenario, it is critical to understand the pattern of load. Mostly the resource availability and measuring the usage level is the main focus of this.

Figure 75:
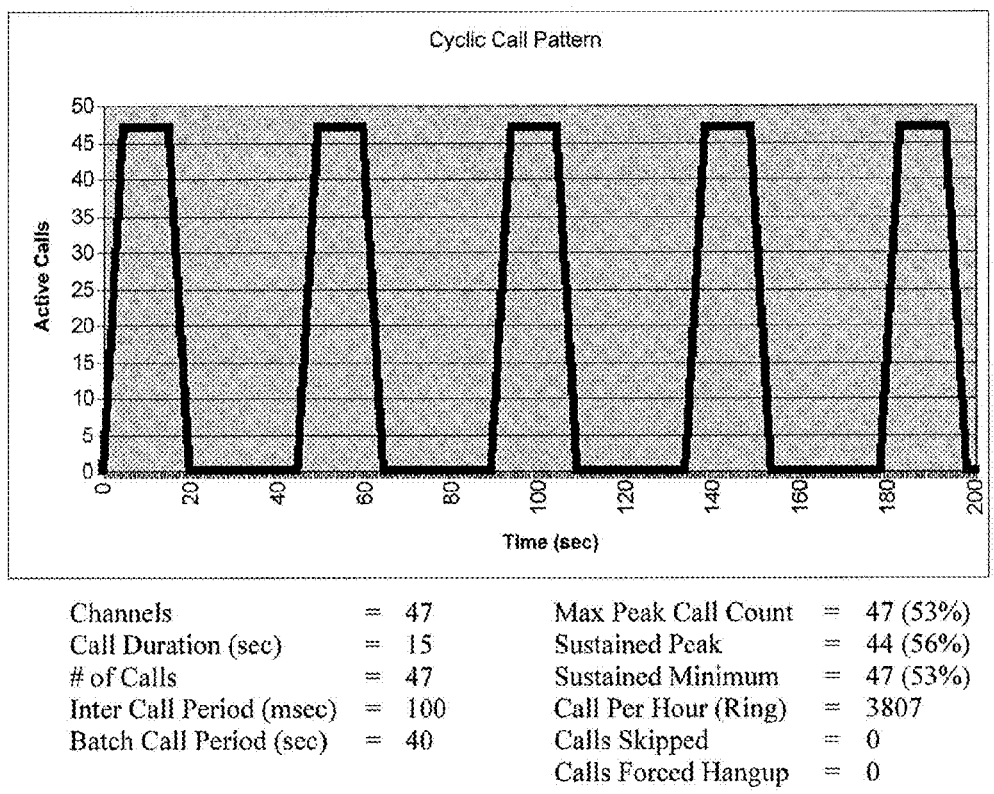
FIG. 75 cyclic load pattern is illustrated.

Cyclic Load Pattern: This is the common type of load in any normal VRU and is shown in FIG. 75 below. When the hunting sequence of the telecom circuit selects a particular VRU, the consecutive calls arriving to the trunk group will be delivered to that particular VRU before it moves to the next VRU in the sequence. The current assigned calls will essentially occupy the entire T1, and slowly as per the callers' response, all the calls will eventually end. At this point the VRU will wait for the next set of calls. The cycle repeats and the trunk group keeps going in this pattern.

Figure 76:
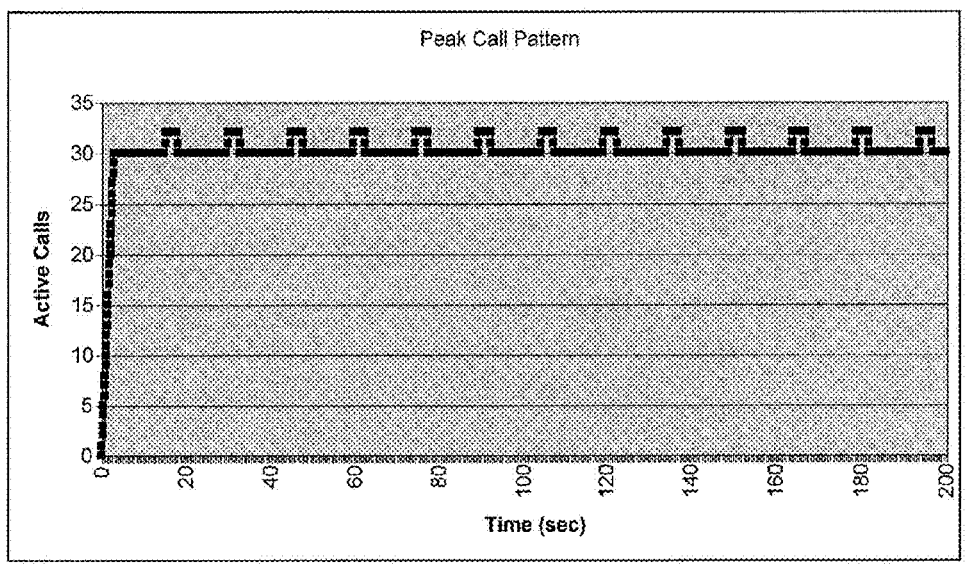
FIG. 76 peak call pattern is illustrated.

Peak Load Pattern: This is a constantly busy platform. On an average, there will be always certain minimum peak load in the platform. Arbitrarily there will be a load of little more than this expected level. This will be the case of well load balanced platform. In the graph shown in FIG. 76, a sustained minimum peak load of 30 calls is expected for at the least 85% of the time. On other occasions there might be a load in little excess to this minimum level.

Figure 77:
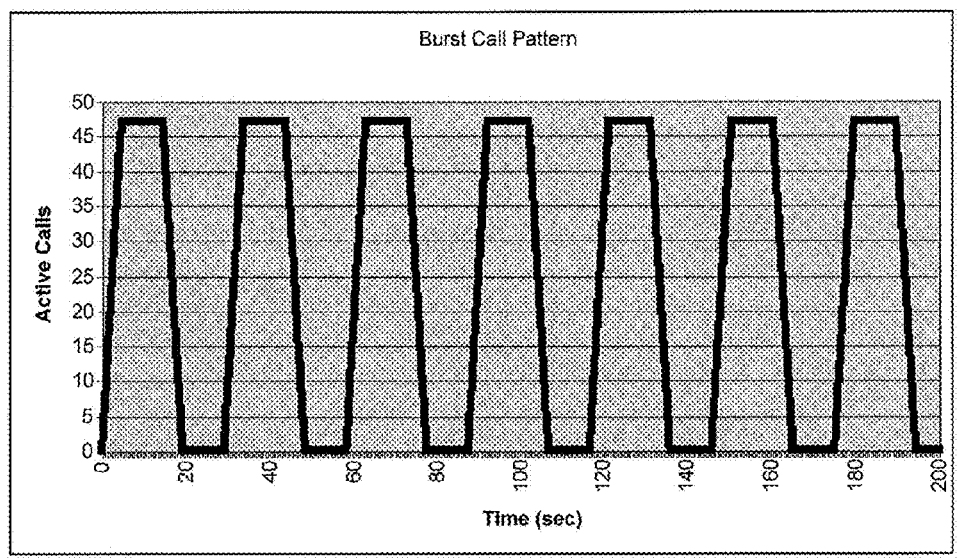
FIG. 77 shows the burst call pattern.

Burst Load Pattern: Typically the load will come in bust. Slowly all the calls will be processed. When all the current calls finish processing, immediately the next load will be offered. Basically, in comparison to the regular cyclic load, this type of platform will experience too frequent burst loads. The peak resource availability is very critical to this type of load. FIG. 77 shows the burst call pattern. In contrast to the choppy pattern, this type of load generates lot less calls, but all of them in batches of burst of calls as shown in FIG. 77.

Figure 78:
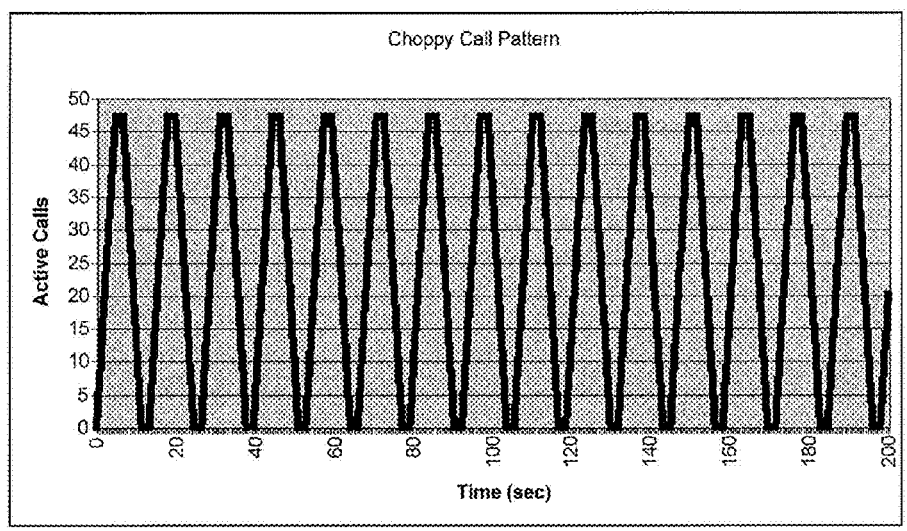
FIG. 78 choppy call pattern is illustrated.

Choppy Load Pattern: This type of load is similar to the burst load. The main difference will be that the calls are so short that the load will reach the peak capacity, but will not stay at that level for log. We will be processing more number of calls in this type of environment. From the FIG. 78, it is clear that to create this type of load, the call duration is set to a higher value compared to the batch repeat period. This type of load is unique in nature due to the heavy volume of load that is being processed.

Figure 79:
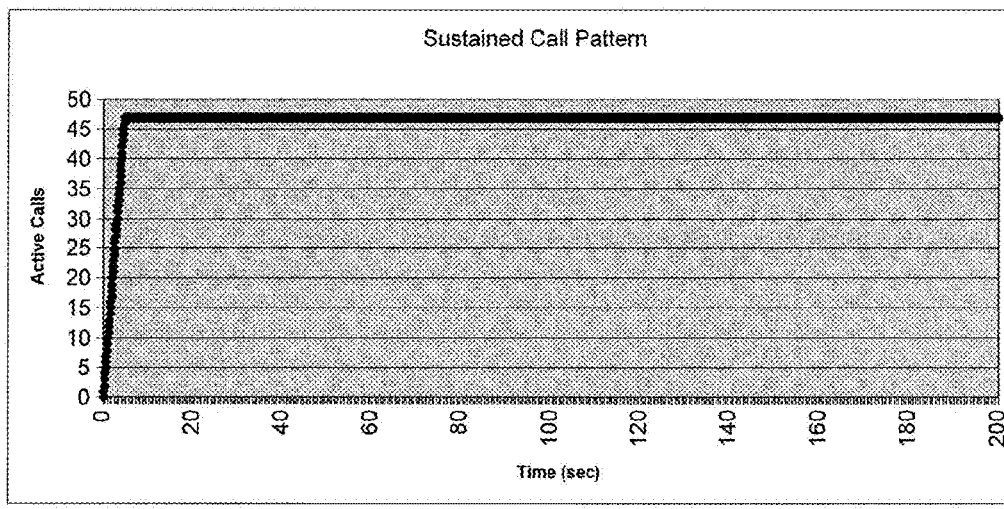
FIG. 79 sustained call pattern is illustrated.

Sustained Load Pattern: The lead trunk group is expected have this pattern of load. The moment a caller drops from this trunk group immediately the next call is offered by the telecom. This way the lead trunk group for certain application will take the majority of the load and only the load in excess to this capacity; will be offered to other overflow trunk groups. In addition, the lab or Quality Assurance (QA) testing we will be generating this kind of load to test out through put of certain type of server. In a sustained load scenario, always the resource contention will be very high, which will be a good test case for endurance of the platform. At the given sustained load, this pattern generated the most number of calls possible by the platform and is shown in FIG. 79.

Input Parameters Vs Load Pattern: The following table will show the relationship between the load patterns to the input parameters

TABLE 10

Relationship between the load patterns to the input parameters

|  | Cyclic | Peak | Burst | Choppy |
|---|---|---|---|---|
| Available channels |  |  |  |  |
| Call duration |  |  |  |  |
| Drift/latency % |  |  |  |  |
| Simultaneous calls |  |  |  |  |
| Sustained load min % |  |  |  |  |
| Previous call handling |  |  |  |  |
| one cycle | cut off call |  |  |  |
|  | Cut off batch |  |  |  |
|  | Time cut off |  |  |  |
|  | Time full |  |  |  |
| % | Max peak |  |  |  |
|  | Sustained peak |  |  |  |
|  | Sustained min |  |  |  |
|  | Ring |  |  |  |
|  | Skip |  |  |  |
|  | Hangup |  |  |  |

Calculator Architecture: The calculator architecture is mainly based on the previous two sections which explains the load design aspect, and load patterns. To start with the calculator will be given a set of input parameters. The calculator evaluates the data points for them and narrow the selection based on the given criteria. The calculator is built on the integral calculus model. See FIGS. 80-84.

Figure 80:
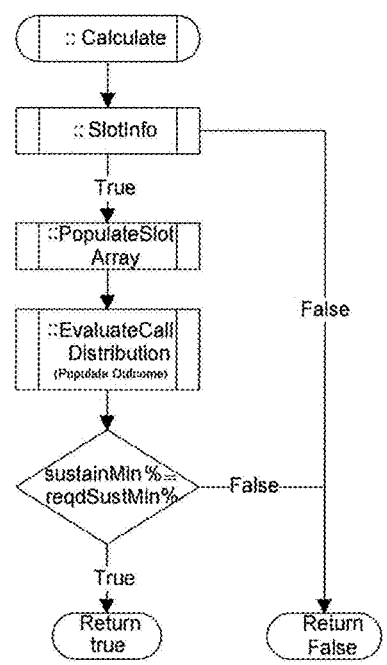
FIG. 80 is a flow chart that depicts an outcome if a sustained minimum percentage is equivalent to a requested sustained minimum percentage.
Figure 81:
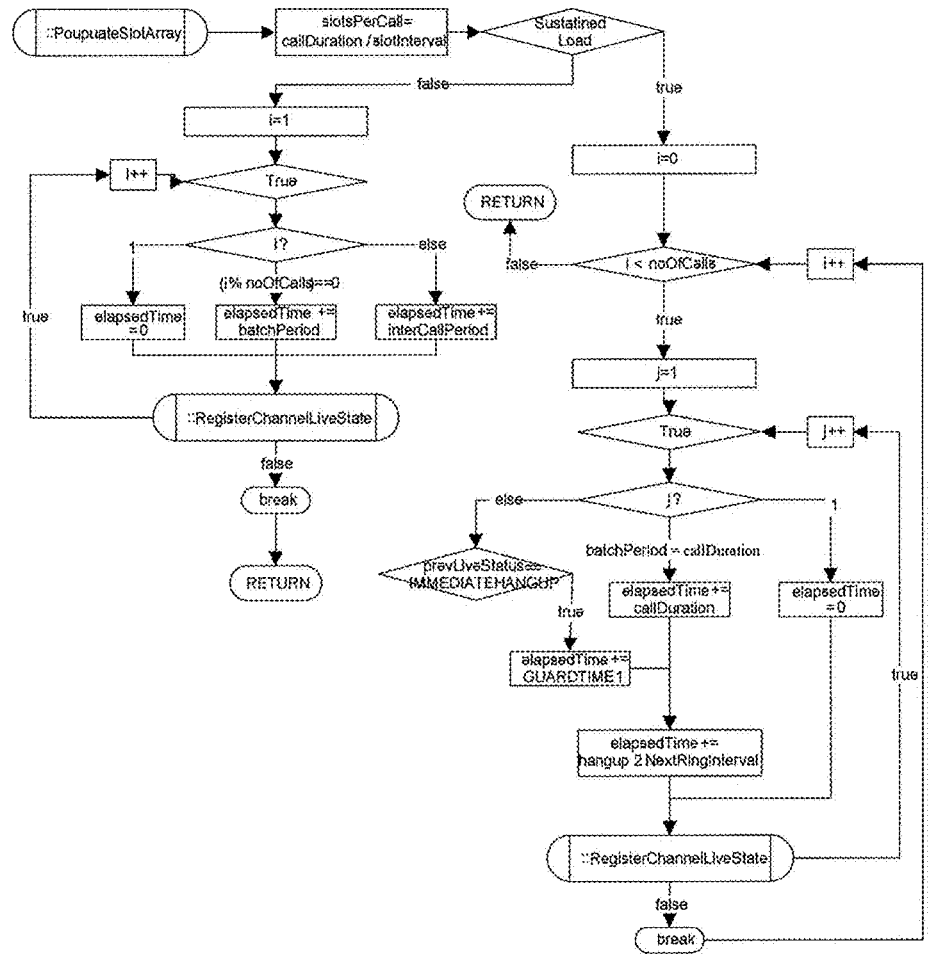
FIG. 81 is a flow chart that depicts an outcome of a register channel live state event.
Figure 82:
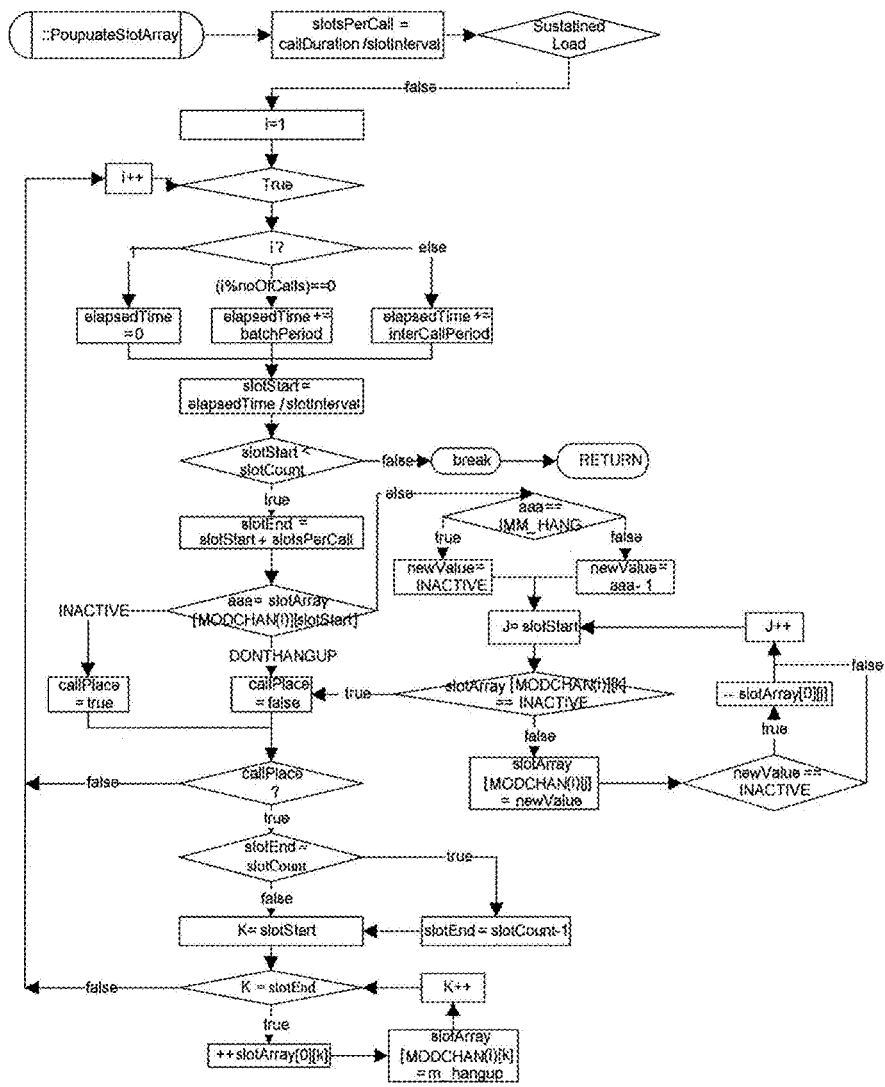
FIG. 82 is a flow chart that depicts an outcome of an active or an inactive call.
Figure 83:
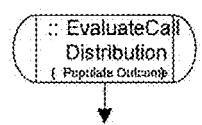
FIG. 83 is a flow chart that depicts an evaluate call distribution event.
Figure 84:
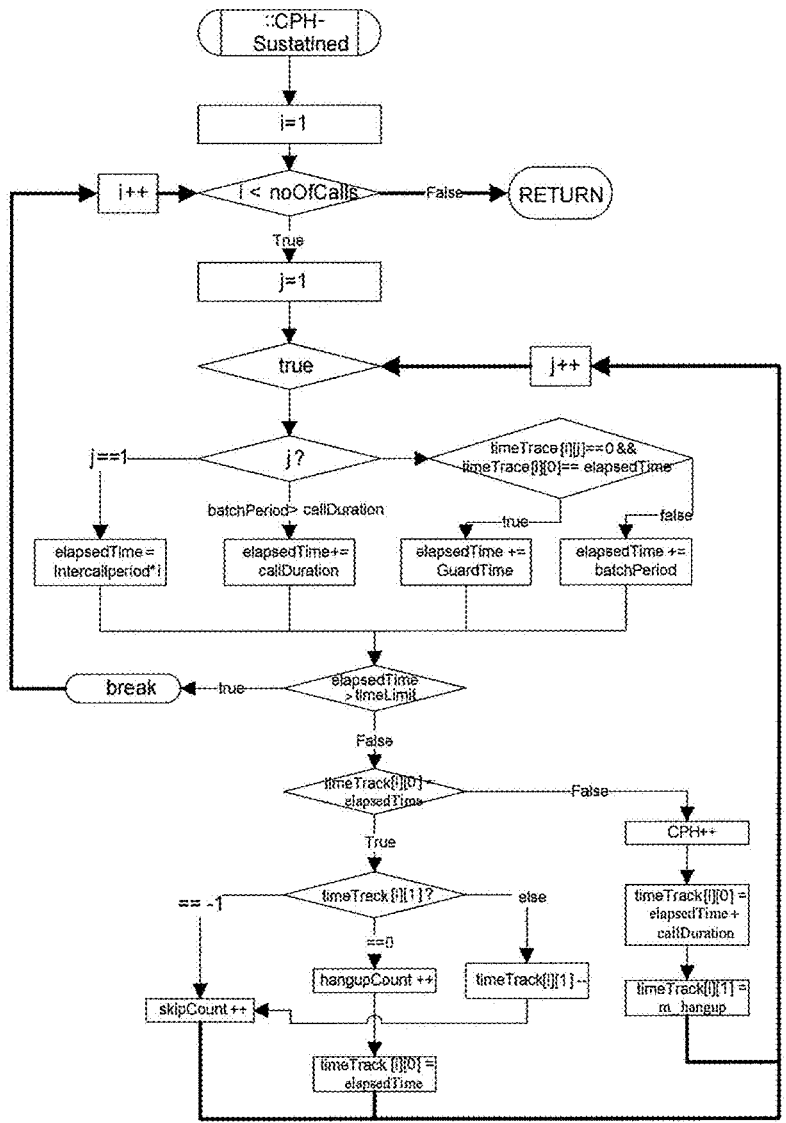
FIG. 84 is a flow chart that depicts calls a per hour event.

FIG. 80: PopulateSlotArray
FIG. 81: RegisterChannelLiveState
FIG. 82: Outcome of an Active or Inactive Call
FIG. 83: EvaluateCallDistribution
FIG. 84: Calls Per Hour (CPH)

Production Platform Monitoring: The simulator can be set up to do the entire trunk group monitoring. It has been already addressed in the section on VRU, that in an ISDN telecom network, one channel is dedicated to the data control signals. The rest of the channels handle the call telecom functionalities. However, each T1 in the telephony hardware will have a dedicated DSP device for each of the 24 channels. Because the telecom circuit does not offer ring event in the D-channel, effectively the DSP VOX/telecom devices in that channel is not utilized. Fortunately, the simulator does not require the telecom device and requires only the VOX device to fulfill the utterance play for the ASR functionality. Hence, the simulator can take advantage of this un-used channel and use it to monitor the VRU.

Figure 85:
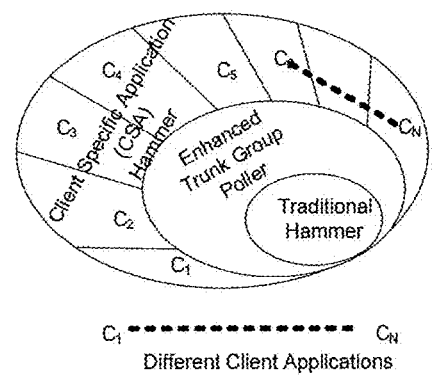
FIG. 85 is a diagram that depicts various client specific applications.

Hammer System Comparison: Already there are two hammer devices which poll the platform to monitor, and effectively detect any system level problem. However, these hammer devices makes physical phone call into the platform. This in effect can monitor the health of the telecom circuit and channel availability. The simulator plays a complementary role to these hammers, and thus can be an integral part of the platform monitoring system. Hence, on a whole these three hammer systems together can be an effective comprehensive hammer system to monitor the entire platform in the entire organization as shown in FIG. 85.

Further, the traditional hammers concentrate on the platform health from the system level. This does not measure the quality of the call processing in an application that has complex business logic flow. Because of the necessity to maintain a high quality of user experience, the clients were always in need of an automated system to qualitatively measure and monitor the specific application. For the lack of such a system it is always been a custom to make manual calls into the platform. Again this is highly subjective, and by no means can be used as a monitoring system.

Figure 86:
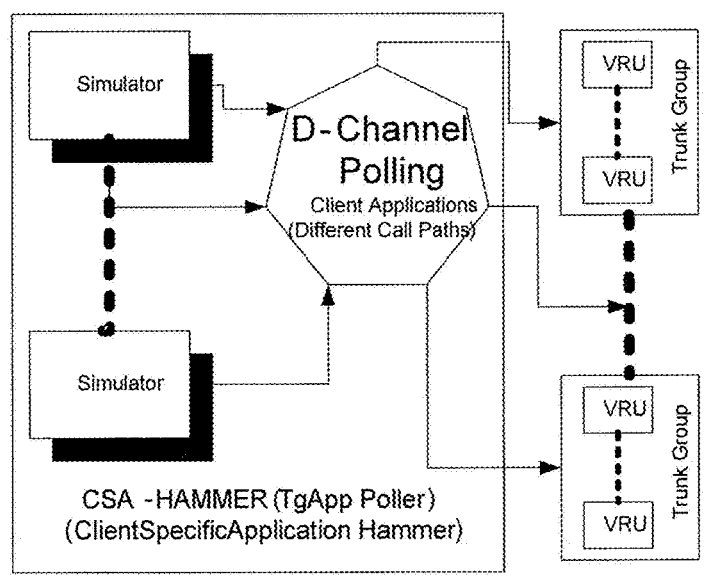
FIG. 86 D-Channel polling is illustrated.

D-Channel Polling: The simulator perfectly fills this deficiency by periodically placing calls into the platform and emulating the real call scenarios. As shown in the FIG. 86, the simulator can make D-channel polling sequentially to all the VRUs in the trunk group and qualitatively measure the call. Further, the simulator with its D-channel polling logic is referred to as the Client Specific Application Hammer (CSA-Hammer or TgApp Poller). The CSA-Hammer can follow the programmed hunting sequence to monitor the VRUs in the multiple trunk groups. However please note that even though the simulator can generate multiple calls simultaneously, here it is restricted by the D-channel, and hence can only send one call at one time. This is not a severe short coming for this monitoring system, since we could combine more than one simulator in the site to emulate different business logic within an application.

CSA-Hammer: Platform Monitoring: The above paragraph along with FIG. 86, explains the CSA-Hammer polling mechanism. The block diagram in FIG. 87, explains the entire system arrangement required to effectively monitor the production platform. Each call that is generated from the simulators has an associated UTSID as explained before.

Figure 88:
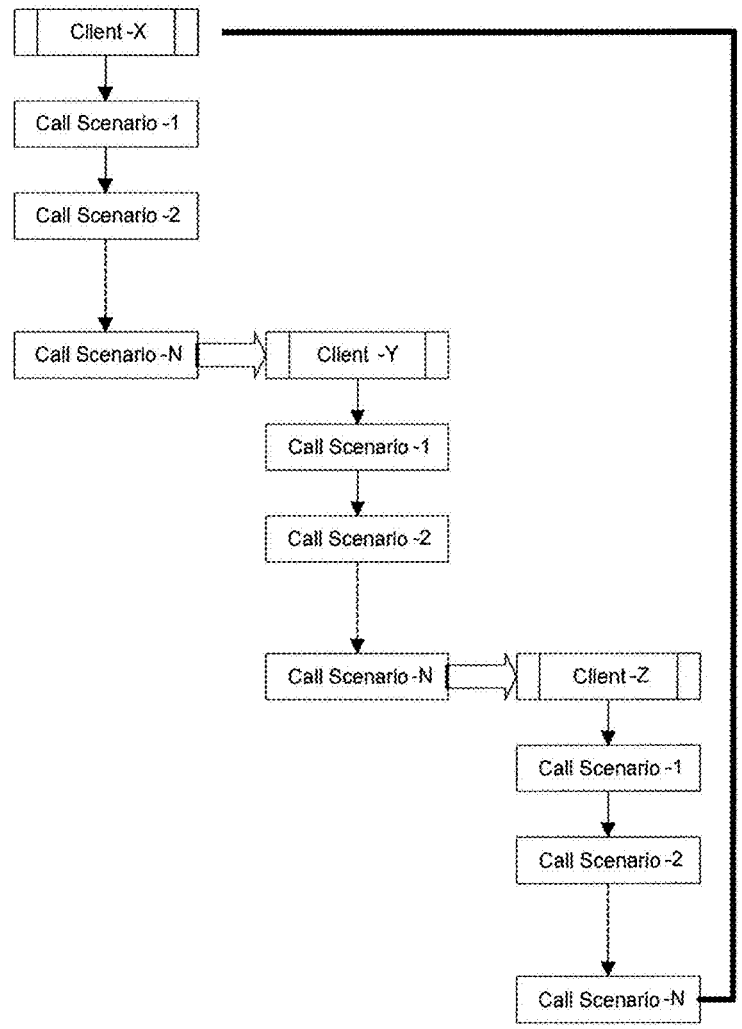
FIG. 88 client application call flow variation testing is illustrated.

Client Application Call Flow Variation Testing: The flow chart in FIG. 88 shows the typical testing scenario for multiple client applications running on the platform. The main idea behind this setup is to repeatedly test the client specific application for different call scenarios. To really test all of the call paths, it is necessary to compute combination of all user input options. This calculation will result in an unrealistic number of call scenarios. Hence it is vital to test at the least the critical call scenario paths.

CSA Hammer Call Volume Calculation: The call duration and call scenario are pre-defined in a given test environment. Given these parameters, it is easy to calculate the volume that will be generated within the platform. Each batch has the capability to generate multiple calls. However in the CSA-Hammer since only the d-channel will be used, there will be only one call per batch.

TABLE 11

Calculate how many clients tested per CSA-Hammer

| Average duration of a call scenario | [x] | = | 2 min |
|---|---|---|---|
| # of seconds in a day | [y] | = | 86400 sec |
| # of calls per batch | [z] | = | 1 (d-channel only) |
| # of calls generated (# of test scenarios tested) |  | = | $\frac{Y}{X}Z$ |
|  |  | = | $\frac{86400}{2*60}*1 = 720$ |
| Avg. # of call scenarios per client | [c] | = | 30 |

TABLE 11-continued

Calculate how many clients tested per CSA-Hammer

\# clients tested per CSA-Hammer $= \dfrac{Y}{\dfrac{X}{C} * Z}$ $\approx 25$

As per the calculation indicated in Table 11, about 25 clients and average of 720 case scenarios will be tested per CSA-Hammer. By combining multiple hammers we could generate a volume that is sufficient to sample all the client applications.

Free Resource Availability: If we assume that a typical mid-to-large sized company has 100,000 simultaneous ports, mostly these resources will be shared among multiple clients with different capacity provisioning. As per the calculation shown in Table 12, there will be approximately around 2130 ports of free d-channel resource available which is approximately 2% of the total company wide resource. Currently due to the lack of any such system similar to the CSA-Hammer, these 2% of the resources are wasted. But if these resources are carefully designed into the CSA-Hammer, then we could do almost real time monitoring of the entire production platform with out incurring any additional cost.

TABLE 12

Calculate Free D-channel resource availability for 100,000 ports

| | | | |
|---|---|---|---|
| simultaneous port availability (assume) | [x] | = | 100,000 |
| \# of spans in a typical IVR | [y] | = | 2 |
| Total \# of IVRs | | = | $\dfrac{X}{(y*24)-1}$ |
| | | = | $\dfrac{100,000}{(2*24)-1} = 2130$ |
| \# of d-channel (free resource) per IVR | [z] | = | 1 (d-channel only) |
| Total \# of free d-channel resources | | = | 2130 |

ON COMBINING THE CALCULATION FROM TABLE 11

| | | |
|---|---|---|
| Total \# of test calls that can be generated using the free resources | = | 2130 * 720 = 1,533,600 |
| Assume \# of clients | $\approx$ | 2000 |
| \# of calls available per client | $\approx$ | 1,533,600 ÷ 2,000 $\approx$ 767 |
| Number of times each one of the 30 critical call scenarios per application will be tested (resulting in real time monitoring) | $\approx$ | $\dfrac{1533600}{2000*30} \approx 25$ |

On combining the calculation for Table 11 and Table 12, each client will be tested approximately 767 times. This frequency of monitoring will guarantee a close watch on the entire system to all the client's satisfaction.

Additional Resource Requirement: As indicated above, in combination with the calculation shown in Table 11 and Table 12, CSA-Hammer is guaranteed to perform real monitoring of the production platform for multiple clients. This aggressive monitoring will not incur additional cost, but however additional system resources are needed. If we assume even distribution of the monitoring load, then we will be utilizing additional 2% of server resources such as ASR, TTS, Cache, Web, and Application Servers. The good news is that typically when license and resource requirements are calculated for appropriate provisioning, this d-channel resource wastage is ignored (hidden). Hence it is safe to assume that already the platform has resources available for CSA-Hammer monitoring. The flip side of the argument is that if we do not conduct CSA-Hammer, then these server resources will also be wasted. In summary, the CSA-Hammer not only performs real time monitoring, but also maximizes the resource utilization.

Figure 87:
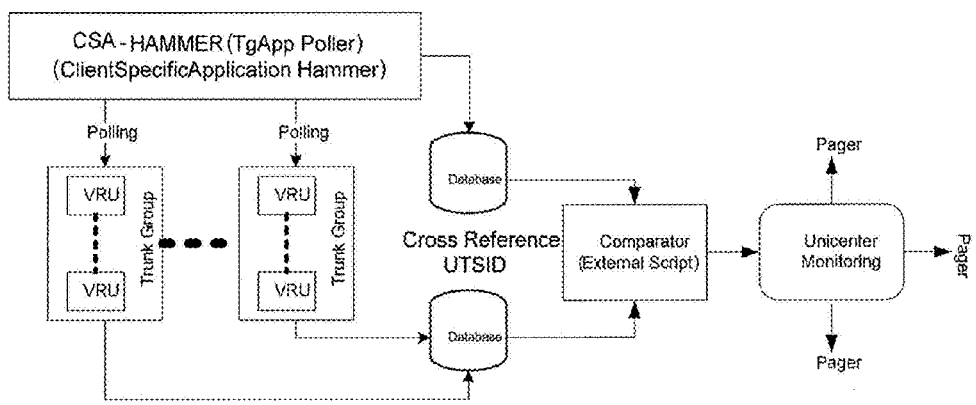
FIG. 87 CSA-Hammer: platform monitoring is illustrated.

Test Call Outcome Comparator: As shown in FIG. 87, the entire CSA-Hammer process needs to be automated. The outcome comparator is the main component of the automation process. In any call the main steps or tasks performed depends on the call flow. The comparator's task is to make sure the call followed the expected call flow. In addition the comparator needs to validate how close the call flow was followed. The major tasks of the comparator are as follows:—

Validate the call flow path
Additional task or deviation taken to follow the path
Process duration is with in the norms
End result In order to perform the comparison the comparator will use the value of various statistical parameters that are collected after the call processing. These actual values will be compared to the programmed or expected values. Essentially the weighted deviation between the actual and the expected values is the measure of the platform performance. The parameter list includes:—

System level failures in the call
    Fetch failures
    MTL message failures
    Resource failures
    Grammar Load Failures
    Prompt failures
Call duration
Say/Start/Process delay
Number of fetches either from the server or cache
    Fetch inet time
Number of MTL messages
Number of actual recognitions
Number of reclogevents
Grammar operations (Load/Activate/Deactivate/Free/SetParam)
Prompts played
    Filler attempts Unicenter Monitoring: As per the discussion in the previous sections, we have a convincing argument that CSA-Hammer will perform real time monitoring by generating the addition load. The comparator script/tool will have the ability to detect the abnormal deviation and failed monitor calls. As shown in FIG. 87, all these feature assembled together will generate adequate alerts/notifications to the Unicenter. The traps will be set for the critical alerts and will be notified to the appropriate technical personnel, to identify and fix any system and/or application level failures.

CSA-Hammer Process Inclusion: The CSA-Hammer will be purely a complementary system to monitor the platform. All the existing legacy monitoring will continue as such. Because of the complementary nature of this monitoring tool, the entire process could be set up as a secluded system from the rest. By means of this seclusion, it is flexible to monitor the clients, based on their volume and complexity.

Figure 89:
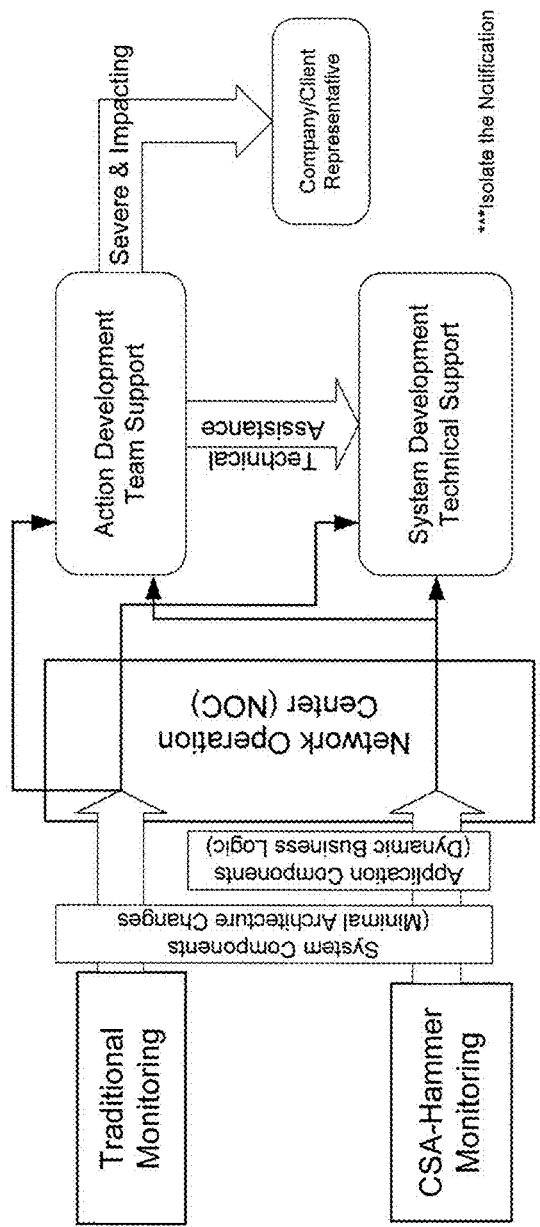
FIG. 89 depicts a system diagram according to one embodiment.

As indicated in FIG. 89, based on the specific application monitoring intend, notified personnel will be isolated from the traditional on-call personnel. This way, minor noise from the CSA-Hammer will not interfere with the traditional monitoring process and procedures.

Figure 90:
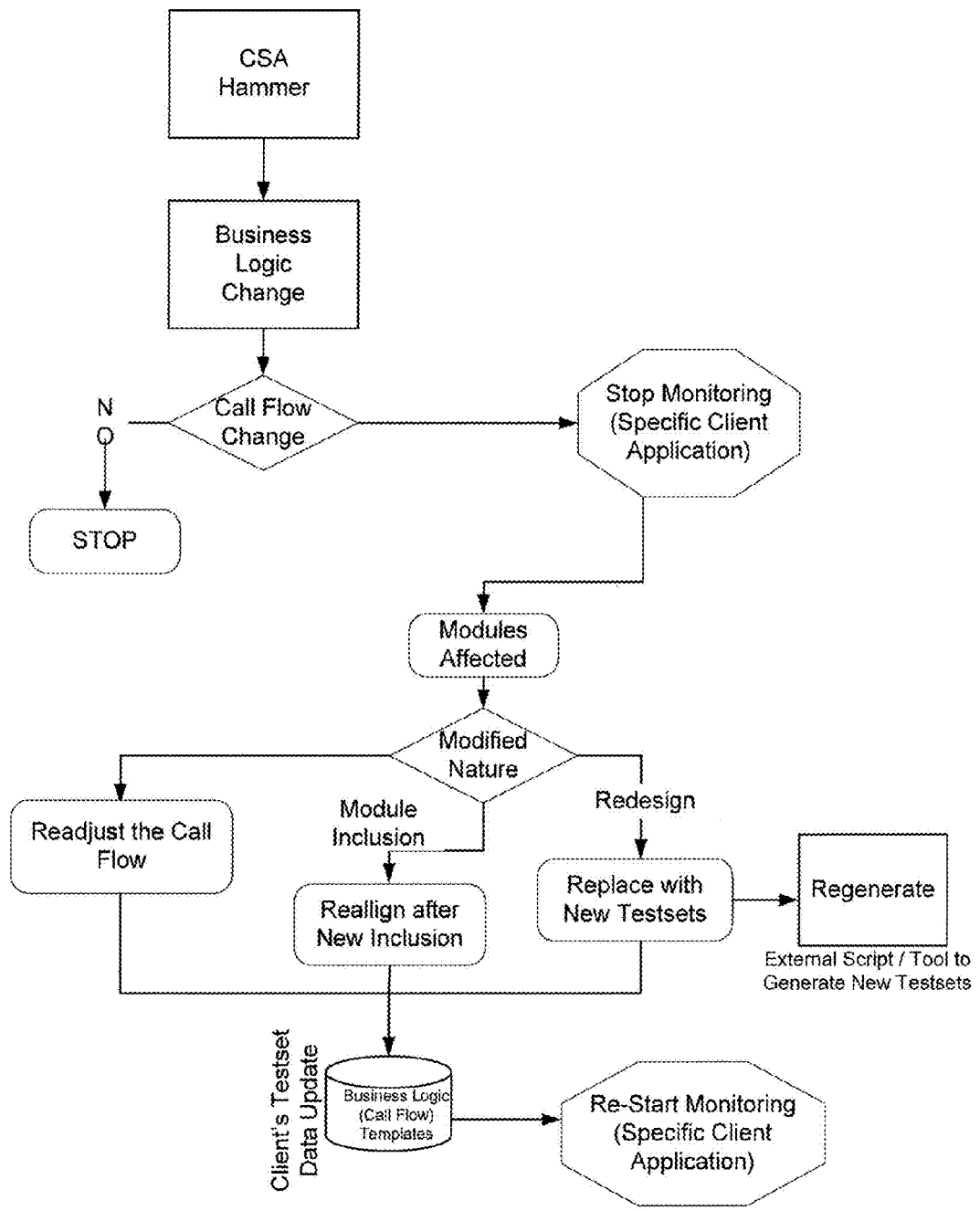
FIG. 90 explains the synchronization process required for the CSA-Hammer business logic templates.

Call Scenario Template Synchronization: In a normal environment the system component and architecture do not change frequently. It is rather static, unless for the scenarios where the new technologies are introduced. Because of this stable nature, the monitoring system and procedures stays unaltered for most of the time. But the application and business logic constantly changes. This poses a real challenge to the CSA-Hammer settings to keep it synchronized with the application changes. FIG. 90 explains the synchronization process required for the CSA-Hammer business logic templates. The process might seem tedious, but after couple of iterations, it is possible to automate. The only complex scenario would be the when the whole application is redesigned then we may have to make test calls and capture the new scenario or generate using input set editor (refer FIG. 65), as explain in FIG. 64.

As a general rule of thump, when a software upgrade is deployed, as a part of QA testing procedure, the test sets need to be reevaluated for the possible deviation to the new version of the application. Also, depending the nature of the change in the test set template, the CSA-Hammer will be restarted for that specific client's application.

CSA-Hammer: Overhead Cost
Additional capital expenditure for the CVSS (simulators)
Comparator script development cost
Increased QA or Application personnel to generate new test sets
Test set template synchronization (recurring)
Additional monitoring personnel CSA-Hammer: Pros and Cons: Pros of CSA-Hammer Monitoring System Through out this chapter we have addressed the various advantages of including the CSA-Hammer process in the production platform monitoring. The list of items are
  Real time monitoring of the production platform
  Each client's application is continuously monitored
  Each application's most critical call path is verified
  No additional cost associated to the monitoring
  Increase Client's confidence in us that their applications are monitored 24×7
  Proactive on possible system failures Cons of CSA-Hammer Monitoring System: Truly there is not adverse effect in including the CSA-Hammer process in the platform monitoring system. However we could point to some of the cumbersome procedures to be of disadvantages.
  Due to the possibility of making multiple application upgrade, synchronizing the test set could be tedious
  Additional load on the platform
  Additional usage of the external resources
  Possible noise in the monitoring system due to incorrect comparison
  Tolerance setting for each of the parameters used in the comparator could mislead (falsely identify that the platform is performing right, or false negative case)

The various VRU simulation examples shown above illustrate a novel method and apparatus for simulating a VRU in a development and test environment. A user of the present invention may choose any of the above VRU simulation embodiments, or an equivalent thereof, depending upon the desired application. In this regard, it is recognized that various forms of the subject VRU simulation invention could be utilized without departing from the spirit and scope of the present invention.

As is evident from the foregoing description, certain aspects of the present invention are not limited by the particular details of the examples illustrated herein, and it is therefore contemplated that other modifications and applications, or equivalents thereof, will occur to those skilled in the art. It is accordingly intended that the claims shall cover all such modifications and applications that do not depart from the sprit and scope of the present invention.

Other aspects, objects and advantages of the present invention can be obtained from a study of the drawings, the disclosure and the appended claims.

What is claimed is:

1. A method for estimating call load using a load simulation of a voice recognition unit, the method comprising:
  determining, by a processor communicably coupled to the voice recognition unit:
  a number of maximum simultaneous channels for the load simulation;
  a duration of a call of expected simultaneous calls for the load simulation;
  at least one of a drift and latency for the call;
  an active call handling procedure for the load simulation;
  a load to timing choice for the load simulation;
  a number of the expected simultaneous calls;
  a minimum percentage of time that the expected simultaneous calls will be sustained;
  a type of the call load;
  a timing to load choice for the load simulation;
  a number of the expected simultaneous calls to be placed in a batch of the expected simultaneous calls;
  an inter-call duration between the expected simultaneous calls in the batch; and
  a batch call duration.

2. The method for estimating call load according to claim 1, wherein the type of the call load is at least one of cyclic, peak, burst, choppy, and sustained.

3. The method for estimating call load according to claim 1, further comprising using the determinations as a set of input parameters of an algorithm to calculate, by the processor, the estimated call load.

4. The method for estimating call load according to claim 3, wherein the algorithm is based on an integral calculus model.

5. The method for estimating call load according to claim 1, wherein the drift is directly proportional to the number of the expected simultaneous calls to be placed.

6. The method for estimating call load according to claim 1, wherein the active call handling procedure is one of a previous call hang-up and a previous call skip, and wherein the previous call hang-up is a decision whether to hang a previous call or not, when the previous call in a selected channel is still busy and a next call in the selected channel is ready to be generated.

7. The method for estimating call load according to claim 6, wherein the previous call skip is a decision whether to skip a parameter of times to generate the next call before a hang-up.

8. The method for estimating call load according to claim 1, wherein the load to timing choice is a decision whether to determine data points for given load details.

9. The method for estimating call load according to claim 1, wherein the timing to load is a decision whether to determine data points for call generation timing data.

10. A call calculator comprising at least one processor operable to execute instructions to calculate an estimated call load based on a set of parameters, the parameters comprising:
  a number of maximum simultaneous channels for a load simulation;
  a duration of a call of expected simultaneous calls for the load simulation;
  at least one of a drift and latency for the call;
  an active call handling procedure for the load simulation;
  a load to timing choice for the load simulation;

a number of the expected simultaneous calls;
a minimum percentage of time that the expected simultaneous calls will be sustained;
a type of the call load;
a timing to load choice for the load simulation;
a number of the expected simultaneous calls to be placed in a batch of the expected simultaneous calls;
an inter-call duration between the expected simultaneous calls in the batch; and
a batch call duration.

11. The call calculator for estimating call load according to claim 10, wherein the instructions include an algorithm based on an integral calculus model.

12. The call calculator for estimating call load according to claim 11, further comprising at least one of a memory operable to save the estimated call load and an outcome progress monitor operable to display a progress of execution of the instructions.

13. A machine readable storage device having stored thereon a set of program instructions executable by the machine, the instructions when executed estimating call load, the instructions including an algorithm with input parameters of:
   a number of maximum simultaneous channels for the load simulation;
   a duration of a call of expected simultaneous calls for the load simulation;
   at least one of a drift and latency for the call;
   an active call handling procedure for the load simulation;
   a load to timing choice for the load simulation;
   a number of the expected simultaneous calls;
   a minimum percentage of time that the expected simultaneous calls will be sustained;
   a type of the call load;
   a timing to load choice for the load simulation;
   a number of the expected simultaneous calls to be placed in a batch of the expected simultaneous calls;
   an inter-call duration between the expected simultaneous calls in the batch; and
   a batch call duration.

14. The machine readable storage device according to claim 13, wherein the type of the call load is at least one of cyclic, peak, burst, choppy, and sustained.

15. The machine readable storage device according to claim 13, wherein the algorithm is based on an integral calculus model.

16. The machine readable storage device according to claim 13, wherein the drift is directly proportional to the number of the expected simultaneous calls to be placed.

17. The machine readable storage device according to claim 13, wherein the active call handling procedure is one of a previous call hang-up and a previous call skip, and wherein the previous call hang-up is a decision whether to hang a previous call or not, when the previous call in a selected channel is still busy and a next call in the selected channel is ready to be generated.

18. The machine readable storage device according to claim 17, wherein the previous call skip is a decision whether to skip a parameter of times to generate the next call before a hang-up.

19. The machine readable storage device according to claim 13, wherein the load to timing choice is a decision whether to determine data points for given load details.

20. The machine readable storage device according to claim 13, wherein the timing to load is a decision whether to determine data points for call generation timing data.

* * * * *